US008647947B2

(12) United States Patent
Masuoka et al.

(10) Patent No.: US 8,647,947 B2
(45) Date of Patent: *Feb. 11, 2014

(54) SEMICONDUCTOR DEVICE INCLUDING A MOS TRANSISTOR AND PRODUCTION METHOD THEREFOR

(71) Applicant: Unisantis Electronics Singapore Pte. Ltd., Peninsula Plaza (SG)

(72) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/917,040

(22) Filed: Jun. 13, 2013

(65) Prior Publication Data
US 2013/0273703 A1 Oct. 17, 2013

Related U.S. Application Data

(62) Division of application No. 12/768,290, filed on Apr. 27, 2010, now Pat. No. 8,497,548.

(60) Provisional application No. 61/217,896, filed on Jun. 4, 2009.

(30) Foreign Application Priority Data

Apr. 28, 2009 (JP) ................................. 2009-109126

(51) Int. Cl.
*H01L 21/336* (2006.01)

(52) U.S. Cl.
USPC .... 438/268; 257/329; 257/331; 257/E29.262; 257/E21.41

(58) Field of Classification Search
USPC .................. 257/329, 331, E29.262, E21.41; 438/268
See application file for complete search history.

(56) References Cited

U.S. PATENT DOCUMENTS 5,017,977 A 5/1991 Richardson
5,258,635 A 11/1993 Nitayama et al.
(Continued)

FOREIGN PATENT DOCUMENTS

CN 1507035 6/2004
CN 1610126 A 4/2005
(Continued)

OTHER PUBLICATIONS

Agranov, G. et al., "Pixel Size Reduction of CMOS Image Sensors and Comparison of Characteristics", *The Institute of Image Formation and Television Engineers (ITE) Technical Report*, vol. 33, No. 38, pp. 9-12, Sep. 2009.

(Continued)

*Primary Examiner* — Allan R Wilson
(74) *Attorney, Agent, or Firm* — Brinks Gilson & Lione

(57) ABSTRACT

It is intended to provide a semiconductor device including a MOS transistor, comprising: a semiconductor pillar; a bottom doped region formed in contact with a lower part of the semiconductor pillar; a first gate formed around a sidewall of the semiconductor pillar through a first dielectric film therebetween; and a top doped region formed so as to at least partially overlap a top surface of the semiconductor pillar, wherein the top doped region has a top surface having an area greater than that of the top surface of the semiconductor pillar.

3 Claims, 48 Drawing Sheets

(a)

(b)

(56) References Cited

U.S. PATENT DOCUMENTS

| | | |
|---|---|---|
| 5,308,782 A | 5/1994 | Mazure et al. |
| 5,312,767 A | 5/1994 | Shimizu et al. |
| 5,382,816 A | 1/1995 | Mitsui |
| 5,416,350 A | 5/1995 | Watanabe |
| 5,480,838 A | 1/1996 | Mitsui |
| 5,627,390 A | 5/1997 | Maeda et al. |
| 5,656,842 A | 8/1997 | Iwamatsu et al. |
| 5,703,386 A | 12/1997 | Yasuda et al. |
| 5,707,885 A | 1/1998 | Lim |
| 5,710,447 A | 1/1998 | Tohyama |
| 5,767,549 A | 6/1998 | Chen et al. |
| 5,780,888 A | 7/1998 | Maeda et al. |
| 5,811,336 A | 9/1998 | Kasai |
| 5,872,037 A | 2/1999 | Iwamatsu et al. |
| 5,905,283 A | 5/1999 | Kasai |
| 5,994,735 A | 11/1999 | Maeda et al. |
| 6,121,086 A | 9/2000 | Kuroda et al. |
| 6,127,209 A | 10/2000 | Maeda et al. |
| 6,175,138 B1 | 1/2001 | Noda |
| 6,294,418 B1 | 9/2001 | Noble |
| 6,373,099 B1 * | 4/2002 | Kikuchi et al. ............... 257/331 |
| 6,392,271 B1 | 5/2002 | Alavi et al. |
| 6,406,962 B1 | 6/2002 | Agnello et al. |
| 6,420,751 B1 | 7/2002 | Maeda et al. |
| 6,461,900 B1 | 10/2002 | Sundaresan et al. |
| 6,483,171 B1 | 11/2002 | Forbes et al. |
| 6,624,459 B1 | 9/2003 | Dachtera et al. |
| 6,658,259 B2 | 12/2003 | McIntosh |
| 6,740,937 B1 | 5/2004 | Sushihara |
| 6,747,314 B2 | 6/2004 | Sundaresan et al. |
| 6,815,277 B2 | 11/2004 | Fried et al. |
| 6,849,903 B2 | 2/2005 | Sushihara |
| 6,861,684 B2 | 3/2005 | Skotnicki et al. |
| 6,878,991 B1 | 4/2005 | Forbes |
| 6,891,225 B2 * | 5/2005 | Horiguchi et al. ............. 257/331 |
| 6,943,407 B2 | 9/2005 | Ouyang et al. |
| 7,052,941 B2 | 5/2006 | Lee |
| 7,193,278 B2 | 3/2007 | Song |
| 7,198,976 B2 | 4/2007 | Hirata |
| 7,233,033 B2 | 6/2007 | Koyama et al. |
| 7,241,655 B2 | 7/2007 | Tang et al. |
| 7,271,052 B1 | 9/2007 | Forbes |
| 7,368,334 B2 | 5/2008 | Yeo et al. |
| 7,374,990 B2 | 5/2008 | Tang et al. |
| 7,413,480 B2 | 8/2008 | Thomas |
| 7,579,214 B2 | 8/2009 | Yamazaki et al. |
| 7,619,675 B2 | 11/2009 | Horii |
| 7,829,952 B2 | 11/2010 | Moniwa et al. |
| 7,872,287 B2 | 1/2011 | Masuoka et al. |
| 7,977,736 B2 | 7/2011 | Kim et al. |
| 7,977,738 B2 | 7/2011 | Minami et al. |
| 7,981,738 B2 | 7/2011 | Moniwa et al. |
| 8,039,893 B2 | 10/2011 | Masuoka et al. |
| 8,058,683 B2 | 11/2011 | Yoon et al. |
| 8,067,800 B2 | 11/2011 | Hsieh |
| 8,110,869 B2 | 2/2012 | Bhalla |
| 8,154,076 B2 * | 4/2012 | Takaishi ............... 257/331 |
| 8,188,537 B2 | 5/2012 | Masuoka et al. |
| 8,227,305 B2 | 7/2012 | Forbes |
| 8,343,835 B2 * | 1/2013 | Masuoka et al. ............ 438/268 |
| 8,378,400 B2 | 2/2013 | Masuoka et al. |
| 8,482,047 B2 * | 7/2013 | Abbott et al. ............... 257/302 |
| 2001/0052614 A1 | 12/2001 | Ishibashi |
| 2002/0000624 A1 | 1/2002 | Takemura et al. |
| 2002/0034853 A1 | 3/2002 | Alavi et al. |
| 2002/0110039 A1 | 8/2002 | Forbes et al. |
| 2002/0195652 A1 | 12/2002 | Maeda et al. |
| 2003/0002093 A1 | 1/2003 | Hynecek |
| 2003/0075758 A1 | 4/2003 | Sundaresan et al. |
| 2004/0005755 A1 | 1/2004 | Moniwa et al. |
| 2004/0113207 A1 | 6/2004 | Hsu et al. |
| 2004/0135215 A1 | 7/2004 | Song |
| 2004/0169293 A1 | 9/2004 | Sushihara |
| 2004/0256639 A1 | 12/2004 | Ouyang et al. |
| 2004/0262681 A1 | 12/2004 | Masuoka et al. |
| 2005/0127404 A1 | 6/2005 | Sushihara |
| 2005/0145911 A1 | 7/2005 | Forbes et al. |
| 2005/0263821 A1 | 12/2005 | Cho et al. |
| 2005/0281119 A1 | 12/2005 | Shibata et al. |
| 2006/0006444 A1 | 1/2006 | Leslie |
| 2006/0007333 A1 | 1/2006 | Horii |
| 2006/0033524 A1 | 2/2006 | Sushihara |
| 2006/0043520 A1 | 3/2006 | Jerdev et al. |
| 2006/0046391 A1 | 3/2006 | Tang et al. |
| 2006/0261406 A1 | 11/2006 | Chen |
| 2007/0007601 A1 | 1/2007 | Hsu et al. |
| 2007/0075359 A1 | 4/2007 | Yoon et al. |
| 2007/0117324 A1 | 5/2007 | Previtali |
| 2007/0138557 A1 | 6/2007 | Ipposhi |
| 2007/0173006 A1 | 7/2007 | Moniwa et al. |
| 2008/0048245 A1 | 2/2008 | Kito et al. |
| 2008/0173936 A1 | 7/2008 | Yoon et al. |
| 2008/0210985 A1 | 9/2008 | Ogawa et al. |
| 2008/0227241 A1 | 9/2008 | Nakabayashi et al. |
| 2009/0032955 A1 | 2/2009 | Tanaka et al. |
| 2009/0057722 A1 | 3/2009 | Masuoka et al. |
| 2009/0065832 A1 | 3/2009 | Masuoka et al. |
| 2009/0085088 A1 * | 4/2009 | Takaishi ............... 257/314 |
| 2009/0114989 A1 | 5/2009 | Hamamoto |
| 2009/0159964 A1 | 6/2009 | Lee |
| 2009/0174024 A1 | 7/2009 | Kim |
| 2009/0197379 A1 | 8/2009 | Leslie |
| 2009/0290082 A1 | 11/2009 | Yamazaki et al. |
| 2009/0291551 A1 | 11/2009 | Cho |
| 2010/0052029 A1 | 3/2010 | Huang |
| 2010/0200731 A1 | 8/2010 | Masuoka et al. |
| 2010/0200913 A1 | 8/2010 | Masuoka et al. |
| 2010/0207172 A1 | 8/2010 | Masuoka et al. |
| 2010/0207200 A1 | 8/2010 | Masuoka et al. |
| 2010/0207201 A1 | 8/2010 | Masuoka et al. |
| 2010/0213525 A1 | 8/2010 | Masuoka et al. |
| 2010/0213539 A1 | 8/2010 | Masuoka et al. |
| 2010/0219457 A1 | 9/2010 | Masuoka et al. |
| 2010/0219483 A1 | 9/2010 | Masuoka et al. |
| 2010/0270611 A1 | 10/2010 | Masuoka et al. |
| 2010/0276750 A1 | 11/2010 | Tu |
| 2010/0295123 A1 | 11/2010 | Lung et al. |
| 2011/0073925 A1 | 3/2011 | Park et al. |
| 2011/0215381 A1 | 9/2011 | Masuoka et al. |
| 2011/0254067 A1 | 10/2011 | Abbott et al. |
| 2011/0275207 A1 | 11/2011 | Moniwa et al. |
| 2011/0303973 A1 | 12/2011 | Masuoka et al. |
| 2011/0303985 A1 | 12/2011 | Masuoka et al. |
| 2012/0086051 A1 | 4/2012 | Wang et al. |
| 2012/0196415 A1 | 8/2012 | Masuoka et al. |

FOREIGN PATENT DOCUMENTS

| | | |
|---|---|---|
| CN | 1983601 A | 6/2007 |
| CN | 101542733 A | 9/2009 |
| DE | 4443968 | 11/1995 |
| EP | 1770769 A1 | 4/2007 |
| EP | 2197032 A1 | 6/2010 |
| EP | 2239770 A1 | 10/2010 |
| EP | 2239771 A1 | 10/2010 |
| EP | 2244305 A1 | 10/2010 |
| EP | 2246895 A1 | 11/2010 |
| JP | 60-070757 A | 4/1985 |
| JP | 61-013661 | 1/1986 |
| JP | 62-045058 A | 2/1987 |
| JP | 62-190751 | 8/1987 |
| JP | 63-037633 A | 2/1988 |
| JP | 63-158866 A | 7/1988 |
| JP | 64-089560 A | 4/1989 |
| JP | 01-175775 A | 7/1989 |
| JP | 02-066969 A | 3/1990 |
| JP | 02-071556 | 3/1990 |
| JP | 02-089368 A | 3/1990 |
| JP | 02-188966 | 7/1990 |
| JP | 03-114233 | 5/1991 |
| JP | 03-145761 | 6/1991 |
| JP | 03-225873 A | 10/1991 |
| JP | 04-234166 A | 8/1992 |
| JP | 05-276442 A | 10/1993 |

(56) References Cited

FOREIGN PATENT DOCUMENTS

| | | |
|---|---|---|
| JP | 06-021467 A | 1/1994 |
| JP | 06-069441 | 3/1994 |
| JP | 06-237003 A | 8/1994 |
| JP | 07-099311 | 4/1995 |
| JP | 07-321228 | 12/1995 |
| JP | 08-078533 A | 3/1996 |
| JP | 09-008295 | 1/1997 |
| JP | 10-079482 A | 3/1998 |
| JP | 10-223777 A | 8/1998 |
| JP | 11-087649 | 3/1999 |
| JP | 2000-012705 A | 1/2000 |
| JP | 2000-068516 | 3/2000 |
| JP | 2000-208434 | 7/2000 |
| JP | 2000-243085 | 9/2000 |
| JP | 2000-244818 A | 9/2000 |
| JP | 2000-357736 | 12/2000 |
| JP | 2001-028399 | 1/2001 |
| JP | 2001-237421 A | 8/2001 |
| JP | 2001-339057 A | 12/2001 |
| JP | 2001-352047 A | 12/2001 |
| JP | 2002-009257 | 1/2002 |
| JP | 2002-033399 A | 1/2002 |
| JP | 2002-231951 A | 8/2002 |
| JP | 2002-246580 A | 8/2002 |
| JP | 2002-246581 A | 8/2002 |
| JP | 2003-068883 A | 3/2003 |
| JP | 2003-142684 | 5/2003 |
| JP | 2003-179160 A | 6/2003 |
| JP | 2003-224211 A | 8/2003 |
| JP | 2004-079694 | 3/2004 |
| JP | 2004-096065 A | 3/2004 |
| JP | 2004-153246 | 5/2004 |
| JP | 2004-193588 A | 7/2004 |
| JP | 2004-259733 A | 9/2004 |
| JP | 2004-319808 A | 11/2004 |
| JP | 2005-012213 A | 1/2005 |
| JP | 2005-135451 | 5/2005 |
| JP | 2006-024799 A | 1/2006 |
| JP | 2006-514392 | 4/2006 |
| JP | 2006-294995 A | 10/2006 |
| JP | 2007-0250652 A | 9/2007 |
| JP | 2008-177565 | 7/2008 |
| JP | 2008-205168 A | 9/2008 |
| JP | 2008-300558 A | 12/2008 |
| JP | 2009-110049 A | 5/2009 |
| JP | 2009-182316 A | 8/2009 |
| JP | 2009-182317 A | 8/2009 |
| JP | 2010-171055 | 8/2010 |
| JP | 2010-0213539 A | 9/2010 |
| JP | 2010-258345 | 11/2010 |
| JP | 2011-066105 | 3/2011 |
| JP | 2011-071235 | 4/2011 |
| JP | 2011-077437 | 4/2011 |
| JP | 2011-211161 A | 10/2011 |
| KR | 10-0132560 | 12/1997 |
| KR | 10-0200222 | 6/1999 |
| KR | 10-0327875 B1 | 9/2002 |
| KR | 2004-0063348 A | 7/2004 |
| WO | WO 94/14198 A1 | 6/1994 |
| WO | WO 01/22494 A1 | 3/2001 |
| WO | WO 2005/036651 | 4/2005 |
| WO | WO 2006/127586 | 11/2006 |
| WO | WO 2009/034623 A1 | 3/2009 |
| WO | WO 2009/034731 A1 | 3/2009 |
| WO | WO 2009/057194 A1 | 5/2009 |
| WO | WO 2009/095997 A1 | 8/2009 |
| WO | WO 2009/096001 A1 | 8/2009 |
| WO | WO 2009/096464 A1 | 8/2009 |
| WO | WO 2009/096465 A1 | 8/2009 |
| WO | WO 2009/096466 A1 | 8/2009 |
| WO | WO 2009/096470 A1 | 8/2009 |
| WO | WO 2009/102059 A1 | 8/2009 |
| WO | WO 2009/133957 A1 | 11/2009 |
| WO | WO 2011/111662 A1 | 9/2011 |

OTHER PUBLICATIONS

Chen, Yijian et al., "Vertical integrated-gate CMOS for ultra-dense IC", *Microelectronic Engineering*, vol. 83, 2006, pp. 1745-1748.
Choi, Yang-Kyu et al., "FinFET Process Refinements for Improved Mobility and Gate Work Function Engineering," IEEE, 2002, 4 pages.
Restriction Requirement for U.S. Appl. No. 13/412,959, dated Nov. 8, 2012, 6 pages.
European Search Report for counterpart European Application No. 09705485.2, dated Feb. 14, 2011, 5 pages.
Examination Report for European Application No. 08722595.9, dated Jul. 11, 2012, 4 pages.
Examination Report in corresponding European Application No. 07 807 139.6, dated Jun. 11, 2012, 4 pages.
Extended European Search Report for European Application No. 07807139.6, dated Jun. 24, 2011, 10 pages.
Extended European Search Report for European Application No. 10004492.4, dated Jun. 21, 2012, 10 pages.
Extended European Search Report for European Application No. 10009574.4, dated May 15, 2012, 6 pages.
Extended European Search Report for European Application No. 12001395.8, dated Apr. 26, 2012, 7 pages.
Extened European Search Report for European Application No. 10009579.3, dated Jun. 11, 2012, 11 pages.
Guidash, R.M. et al. "A 0.6 μm CMOS Pinned Photodiode Color Imager Technology", *IEDM Digest Papers*, pp. 927-929, 1997.
Hieda, K. et al., "New Effects of Trench Isolated Transistor Using Side-Wall Gates", *VLSI Research Center*, Toshiba Corporation, 1987, 4 pages.
International Preliminary Report on Patentability for International Application No. PCT/JP2011/055264, dated Oct. 11, 2012, 7 pages.
International Search Report for International Application No. PCT/JP2007/067732, dated Dec. 11, 2007, 2 pages.
International Search Report for International Application No. PCT/JP2007/071052, dated Jan. 29, 2008, 6 pages.
International Search Report for International Application No. PCT/JP2008/051301, dated Apr. 1, 2008, 2 pages.
International Search Report for International Application No. PCT/JP2008/051302, dated Apr. 8, 2008, 2 pages.
International Search Report for International Application No. PCT/JP2008/051304, dated Apr. 15, 2008, 2 pages.
International Search Report for International Application No. PCT/JP2008/058412, dated Jun. 10, 2008, 2 pages.
International Search Report for International Application No. PCT/JP2009/051460, dated Apr. 21, 2009, 2 pages.
International Search Report for International Application No. PCT/JP2009/051461, dated Apr. 21, 2009, 2 pages.
International Search Report for International Application No. PCT/JP2009/051463, dated Feb. 24, 2009, 2 pages.
International Search Report for International Application No. PCT/JP2009/058629, dated Jun. 2, 2009, 2 pages.
Iwai, Makoto et al., "High-Performance Buried Gate Surrounding Gate Transistor for Future Three-Dimensional Devices", *Japanese Journal of Applied Physics*, 2004, vol. 43, No. 10, pp. 6904-6906.
Kasano, Masahiro, "A 2.0.mu.m Pixel Pitch MOS Image Sensor with an Amorphous Si Film Color Filter," IEEE International Solid-State Circuits Conference, Feb. 8, 2005, 3 pages.
Maeda, Shigenobu et al., "Impact of a Vertical .PHI.-Shape Transistor (V.PHI.T) Cell for 1 Gbit DRAM and Beyond," IEEE Transactions on Electron Devices, vol. 42, No. 12, Dec. 1995, pp. 2117-2124.
Mendis, Sunetra K. et al. "A 128×128 CMOS Active Pixel Image Sensor for Highly Integrated Imaging System", *IEDM93, Digest Papers*, 22.6.1, pp. 583-586, 1993.
Mistry et al., "A 45nm Logic Technology with High-k+Metal Gate Transistors, Strained Silicon, 9 Cu Interconnect Layers, 193nm Dry Patterning, and 100% Pb-free Packaging", IEEE, pp. 247-250, 2007.
Nakamura, Jun-ichi et al., "Nondestructive Readout Mode Static Induction Transistor (SIT) Photo Sensors," IEEE Transactions on Electron Devices, 1993, vol. 40, pp. 334-341.
Nitayama, Akihiro et al., "Multi-Pillar Surrounding Gate Transistor (M-SGT) for Compact and High-Speed Circuits", *IEEE Transactions on Electron Devices*, vol. 3, No. 3, Mar. 1991, pp. 679-583.

(56) References Cited

OTHER PUBLICATIONS

Non-Certified Partial Translation of Office Action from counterpart Korean Application No. 10-2010-7018204, dated Mar. 29, 2012, 1 page.
Notice of Allowance for U.S. Appl. No. 12/704,955, dated Mar. 15, 2012, 8 pages.
Notice of Allowance for U.S. Appl. No. 13/447,721, dated Nov. 2, 2012, 9 pages.
Notice of Allowance for U.S. Appl. No. 12/700,294, dated Oct. 5, 2012, 7 pages.
Office Action from co-pending U.S. Appl. No. 12/704,935, dated Nov. 18, 2011, 9 pages.
Office Action from co-pending U.S. Appl. No. 12/894,923, dated Oct. 2, 2012, 21 pages.
Office Action from co-pending U.S. Appl. No. 13/043,081, dated Jul. 16, 2012, 6 pages.
Office Action from co-pending U.S. Appl. No. 13/046,113, dated Jan. 9, 2013, 6 pages.
Office Action from co-pending U.S. Appl. No. 13/113,482, dated Jan. 2, 2013, 9 pages.
Office Action from co-pending U.S. Appl. No. 13/412,959, dated Dec. 7, 2012, 9 pages.
Office Action from co-pending U.S. Appl. No. 12/704,955, dated Dec. 8, 2011, 12 pages.
Takahashi, Hidekazu, "A 3.9.mu.m Pixel Pitch VGA Format 10b Digital Image Sensor with 1.5-Transistor/Pixel," IEEE International Solid-State Circuits Conference, Feb. 16, 2004, 10 pages.
Takato, Hiroshi et al., "Impact of Surrounding Gate Transistor (SGT) for Ultra-High-Density LSI's," IEEE Transactions on Electron Devices, vol. 38, No. 3, Mar. 1991, pp. 573-578.
Watanabe, S. et al., "A Novel Circuit Technology with Surrounding Gate Transistors (SGT's) for Ultra High Density DRAM's", IEEE Journal of Solid-State Circuits, vol. 30, No. 9, Sep. 1995, pp. 960-971.
Written Opinion of the International Searching Authority for International Application No. PCT/JP2007/067732, dated Dec. 11, 2007, 4 pages.
Written Opinion of the International Searching Authority for International Application No. PCT/JP2007/071052, dated Jan. 29, 2008, 9 pages.
Written Opinion of the International Searching Authority for International Application No. PCT/JP2008/051301, dated Apr. 1, 2008, 5 pages.
Written Opinion of the International Searching Authority for International Application No. PCT/JP2008/051302, dated Apr. 8, 2008, 5 pages.
Written Opinion of the International Searching Authority for International Application No. PCT/JP2008/058412, dated Jun. 10, 2008, 4 pages.
Written Opinion of the International Searching Authority for International Application No. PCT/JP2009/051460, dated Apr. 21, 2009, 5 pages.
Written Opinion of the International Searching Authority for International Application No. PCT/JP2009/051461, dated Apr. 21, 2009, 6 pages.
Written Opinion of the International Searching Authority for International Application No. PCT/JP2009/058629, dated Jun. 2, 2009, 4 pages.
Wu et al., "High Performance 22/20nm FinFET CMOS Devices with Advanced High-K/Metal Gate Scheme", IEEE, pp. 27.1.1-27.1.4, 2010.
Wuu, S.G. et al., "A Leading-Edge 0.9 µm Pixel CMOS Image Sensor Technology with Backside Illumination: Future Challenges for Pixel Scaling", *IEDM2010 Digest Papers*, 14.1.1, pp. 332-335, 2010.

Yonemoto, Kazuya, "A CMOS Image Sensor with a Simple FPN-Reduction Technology and a Hole Accumulated Diode," 2000 IEEE International Solid-State Circuits Conference, 9 pages.
Notice of Allowance for U.S. Appl. No. 12/894,923, dated Feb. 21, 2013, 5 pages.
Notice of Allowance for U.S. Appl. No. 12/894,923, dated Mar. 14, 2013, 5 pages.
Restriction Requirement for U.S. Appl. No. 13/116,506, dated Feb. 28, 2013, 6 pages.
Office Action for U.S. Appl. No. 13/412,959, dated Mar. 13, 2013, 7 pages.
Lee, et al., "An Active Pixel Sensor Fabricated Using CMOS/CCD Process Technology" in Program IEEE Workshop on Charge-Coupled Devices and Advanced Image Sensors, 1995, 5 pages.
Murakami et al., "Technologies to Improve Photo-Sensitivity and Reduce VOD Shutter Voltage for CCD Image Sensors", IEEE Transactions on Electron Devices, vol. 47, No. 8, 2000, pp. 1566-1572.
Takahashi et al., "A 3.9-µm Pixel Pitch VGA Format 10-b Digital Output CMOS Image Sensor With 1.5 Transistor/Pixel", IEEE Journal of Solid-State Circuit, Vo.39, No. 12, 2004, pp. 2417-2425.
Yasutomi et al, "A High-Speed CMOS Image Sensor with Global Electronic Shutter Pixel Using Pinned Diodes", IEEJ Trans. SM, vol. 129, No. 10, 2009, pp. 321-327.
Notice of Allowance for U.S. Appl. No. 13/043,081, dated Mar. 18, 2013, 6 pages.
Notice of Allowance for U.S. Appl. No. 13/113,482, dated Apr. 4, 2013, 10 pages.
International Preliminary Report on Patentability for International Application No. PCT/JP2008/051300, dated Aug. 31, 2010, 9 pages.
International Preliminary Report on Patentability for International Application No. PCT/JP2009/051459, dated Aug. 31, 2010, 9 pages.
International Search Report for International Application No. PCT/JP2008/051300, dated May 13, 2008, 4 pages.
International Search Report for International Application No. PCT/JP2009/051459, dated Apr. 14, 2009, 4 pages.
International Search Report for International Application No. PCT/JP2011/070534, including English translation, dated Dec. 6, 2011, 12 pages.
International Search Report for International Application No. PCT/JP2011/071162, including English translation, dated Dec. 13, 2011, 25 pages.
Office Action from co-pending U.S. Appl. No. 12/768,290, dated Jan. 24, 2012, 12 pages.
Office Action from counterpart Korean Application No. 10-2010-7018204, dated Mar. 29, 2012, 7 pages.
Written Opinion of the International Searching Authority for International Application No. PCT/JP2008/051300, dated Aug. 30, 2010, 8 pages.
Written Opinion of the International Searching Authority for International Application No. PCT/JP2009/051459, dated Aug. 30, 2010, 8 pages.
International Search Report for PCT/JP2011/079300, dated Mar. 13, 2012, 7 pages.
Notice of Allowance for U.S. Appl. No. 12/768,290, dated Apr. 18, 2013, 9 pages.
Notice of Allowance for U.S. Appl. No. 12/704,935, dated May 16, 2013, 10 pages.
Notice of Allowance for U.S. Appl. No. 13/046,113, dated May 13, 2013, 10 pages.
Notice of Allowance for U.S. Appl. No. 13/412,959, dated May 8, 2013, 9 pages.
Office Action for U.S. Appl. No. 13/116,506, dated Jul. 18, 2013, 12 pages.
Notice of Allowance for U.S. Appl. No. 12/894,923, dated Jul. 2, 2013, 9 pages.
Notice of Allowance for U.S. Appl. No. 13/606,823, dated Jul. 8, 2013, 12 pages.

* cited by examiner

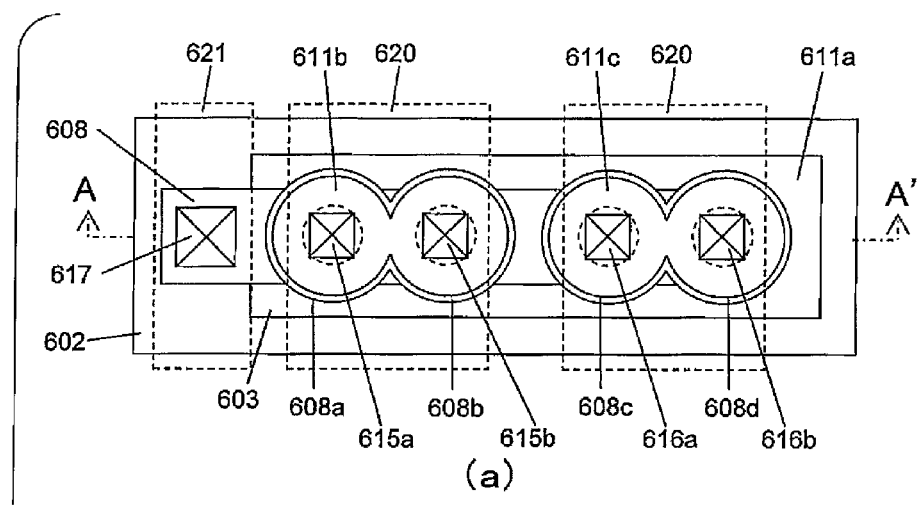
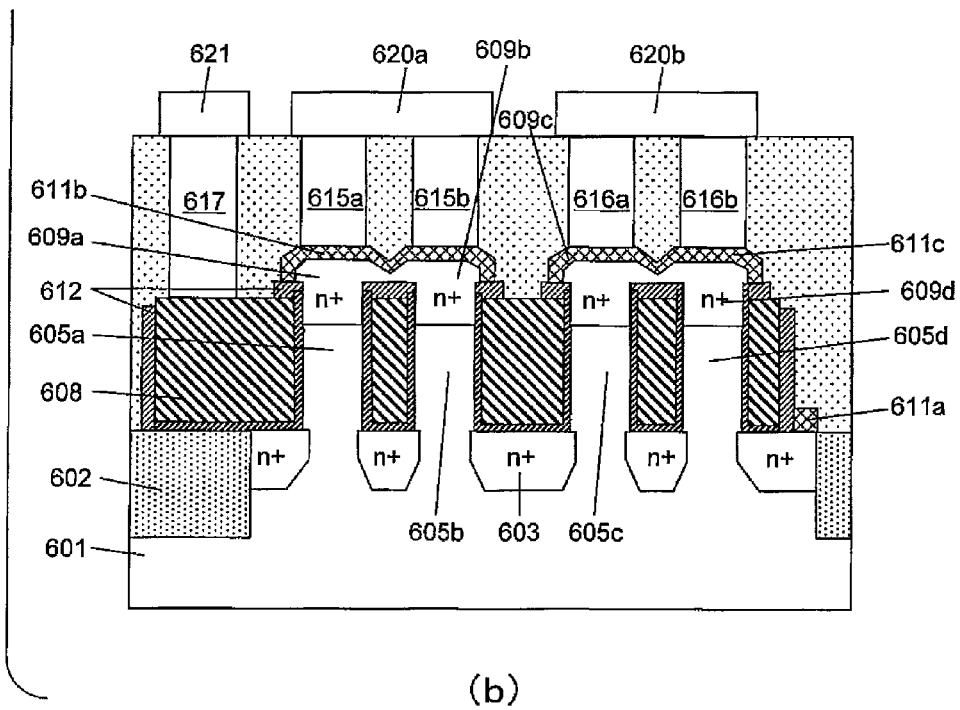
FIG. 21

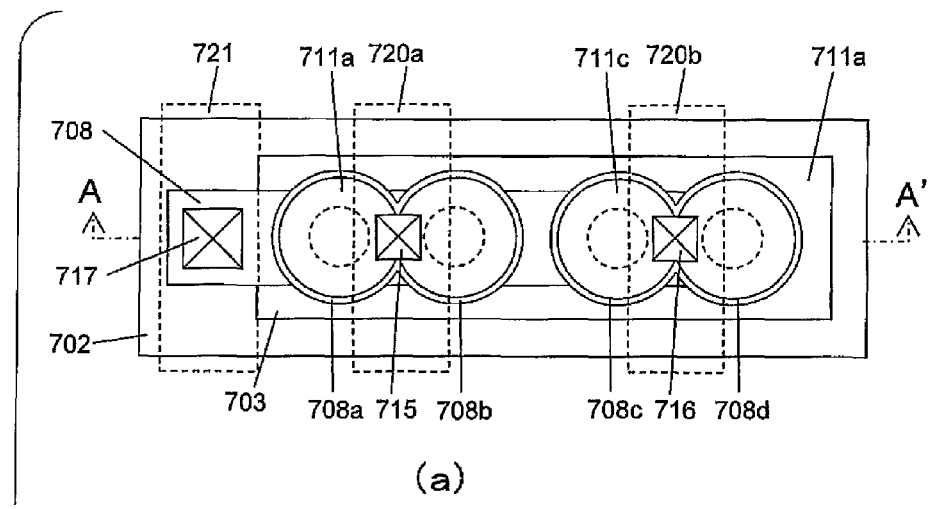
FIG. 22
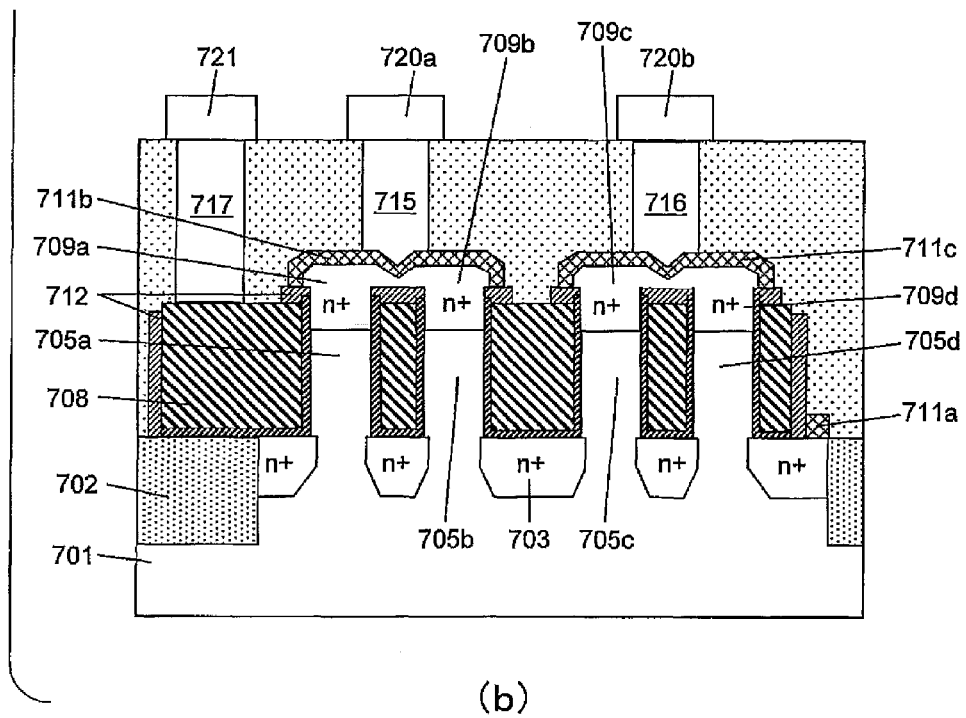

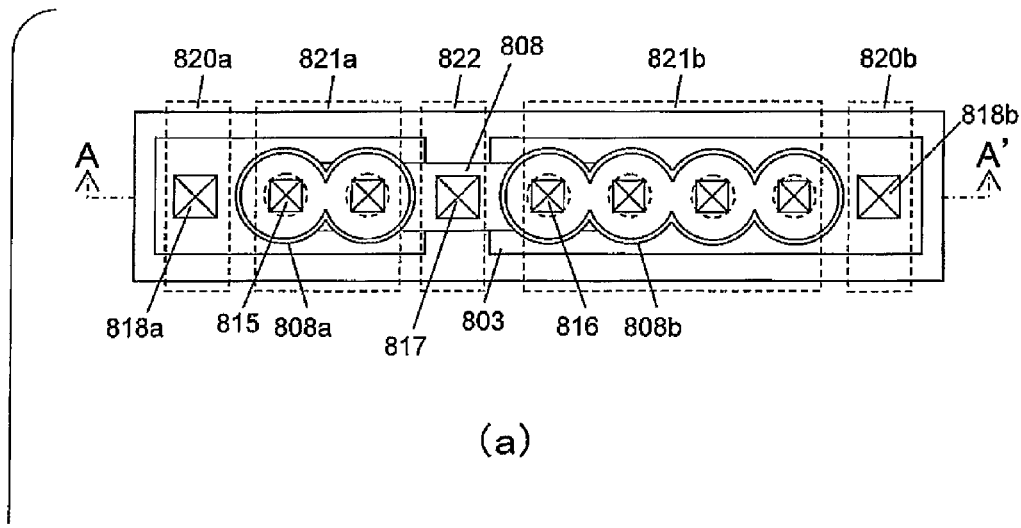
(a)
FIG. 23
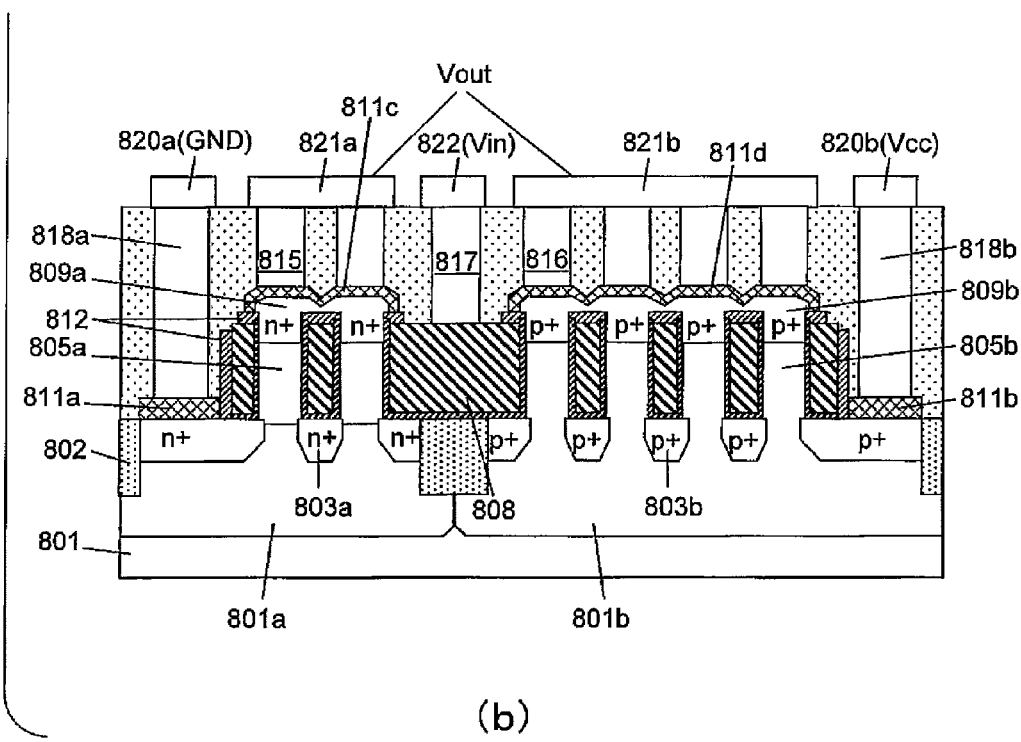
(b)

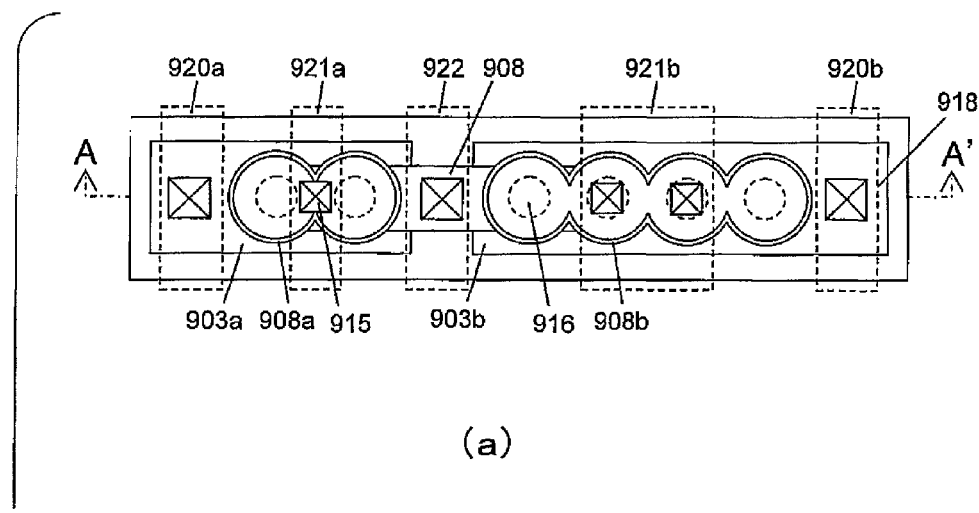
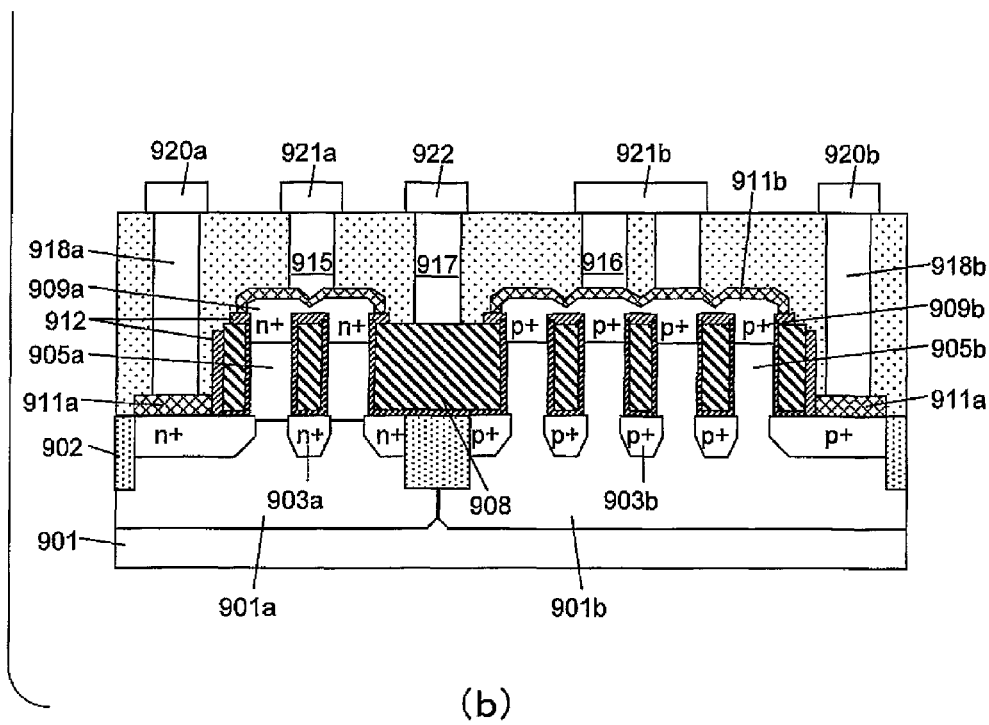
FIG. 24

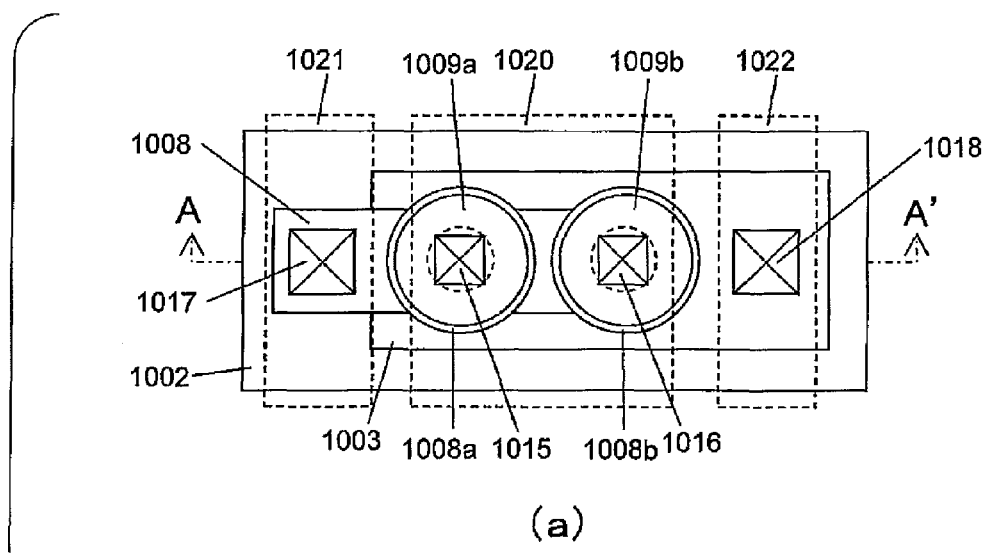
(a)
FIG. 25
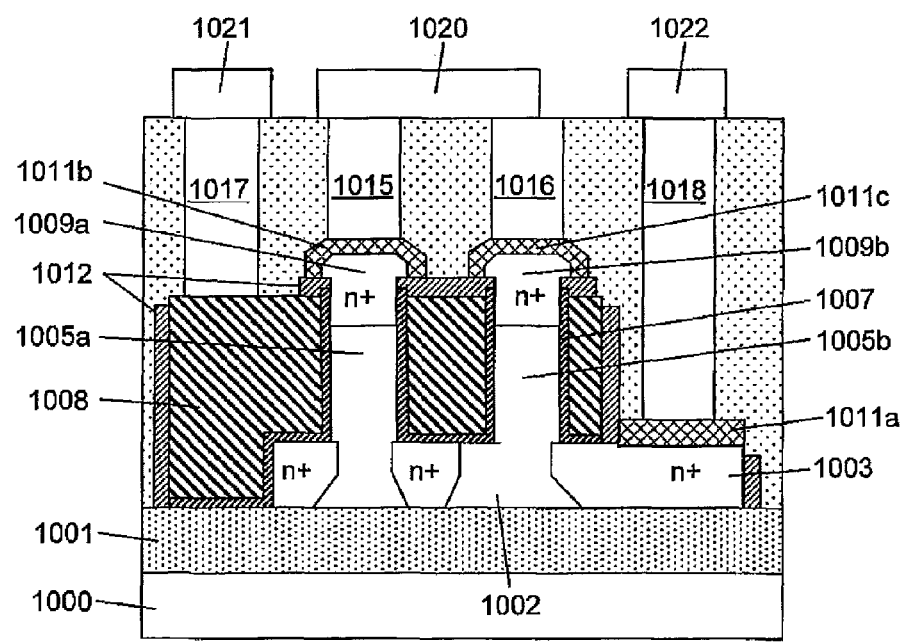
(b)

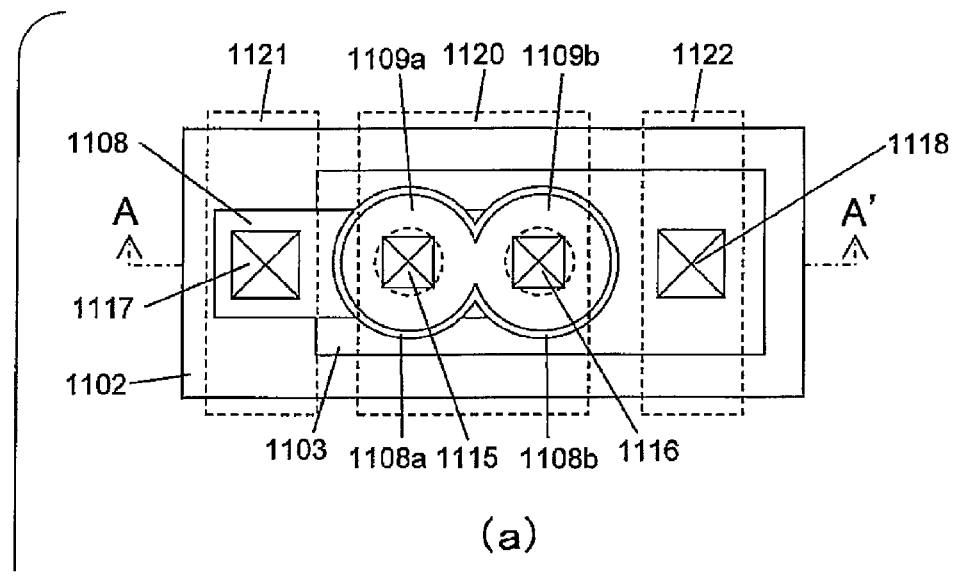
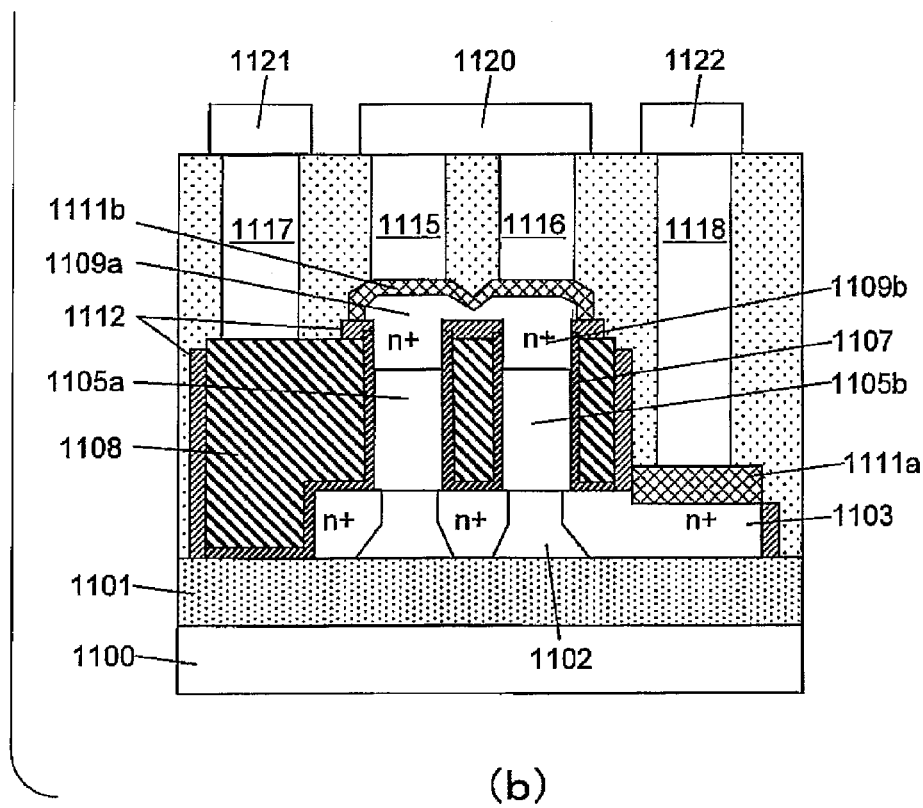
FIG. 26

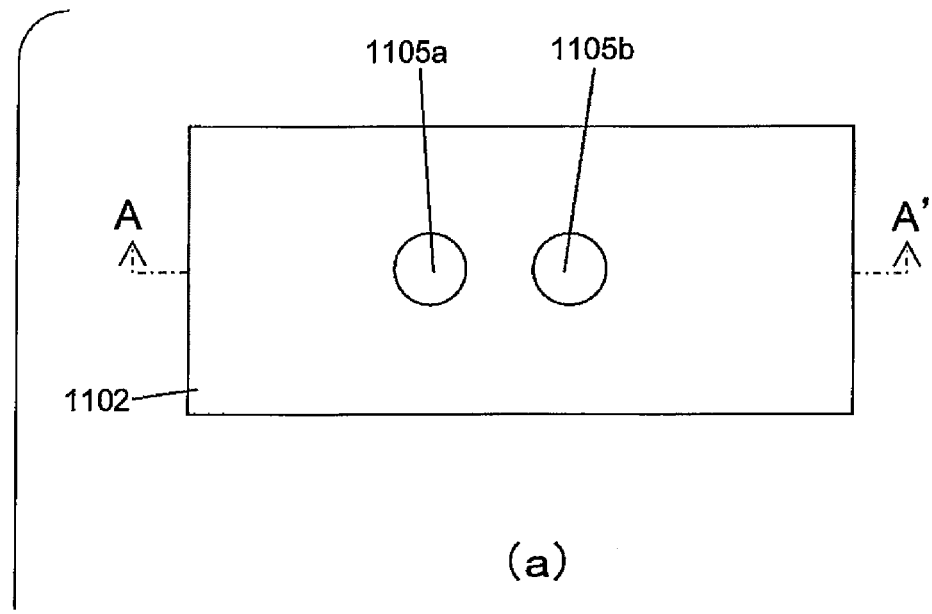
(a)
FIG. 27
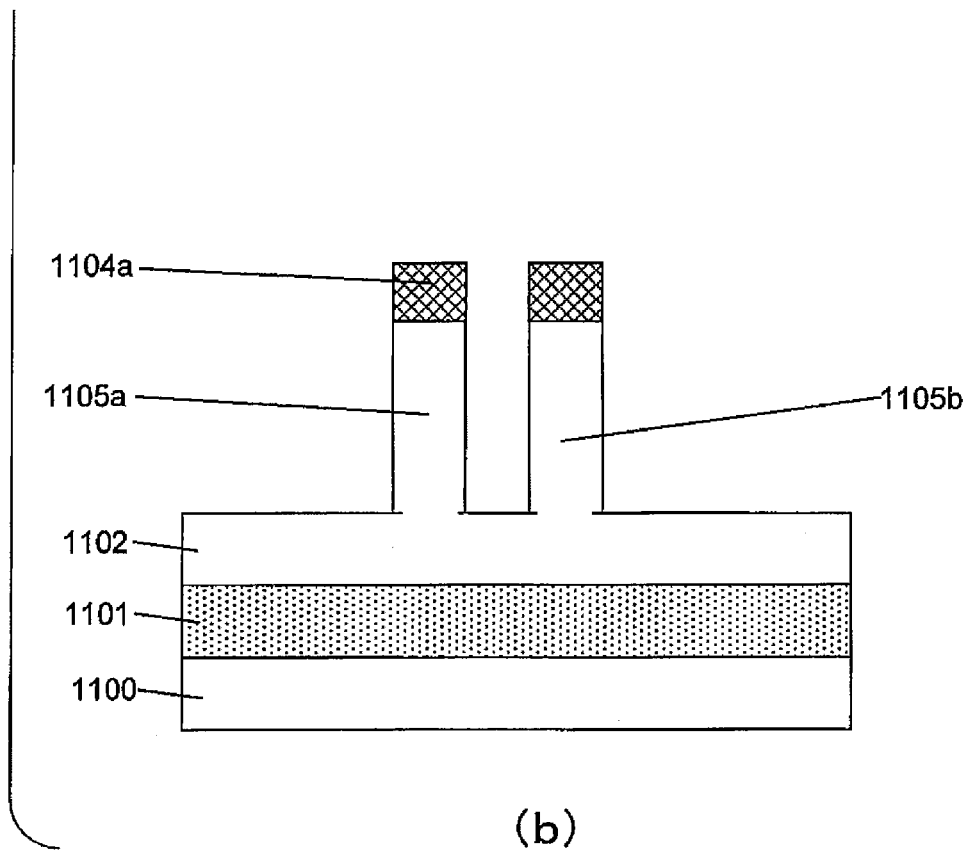
(b)

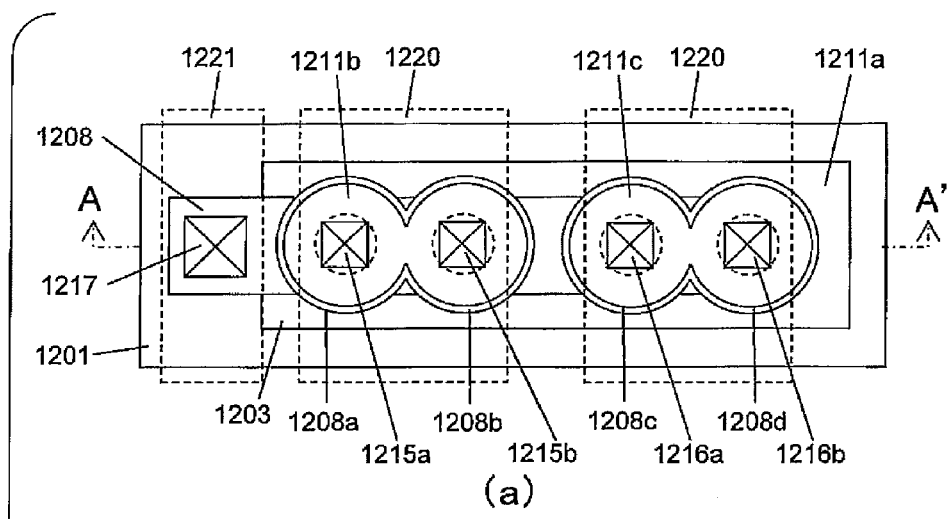
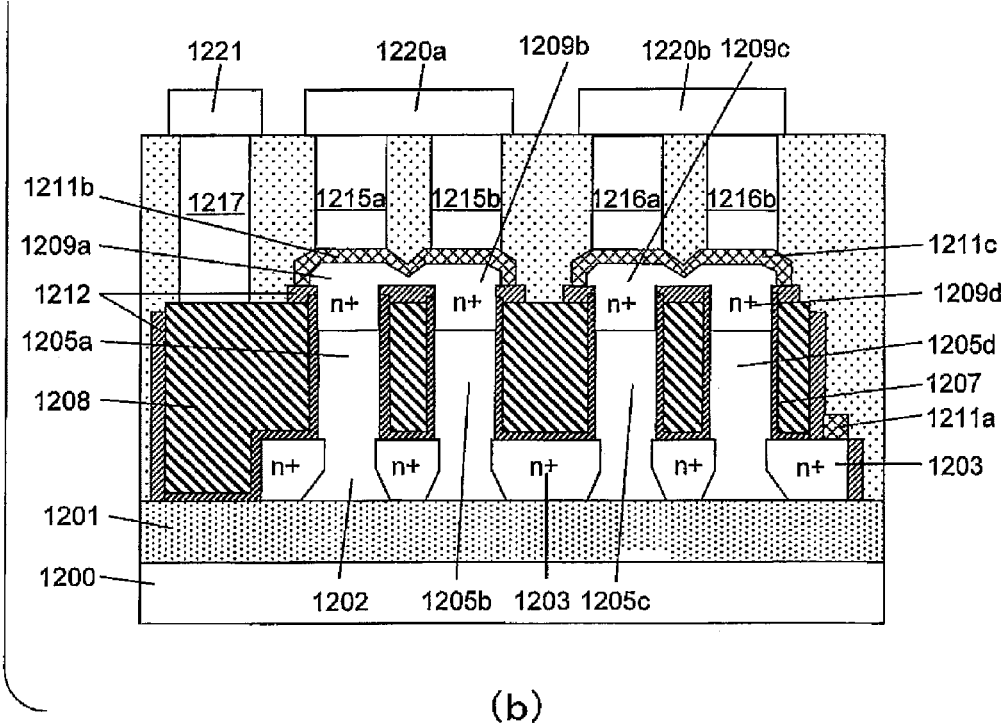
FIG. 42

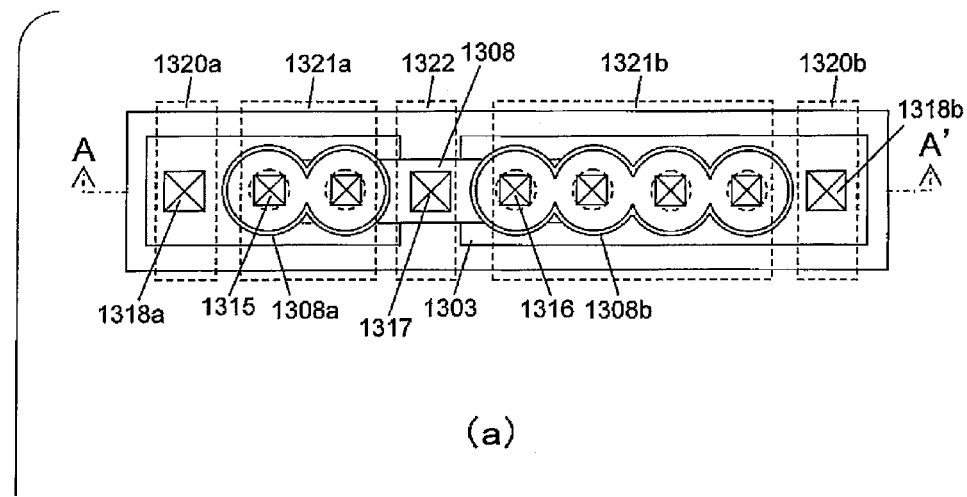
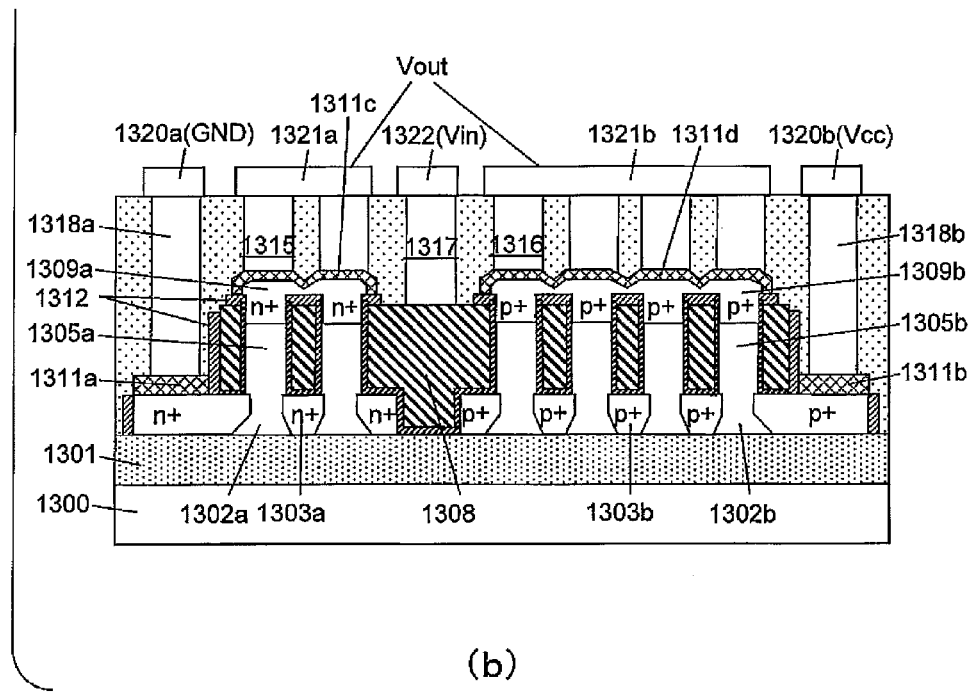
FIG. 43

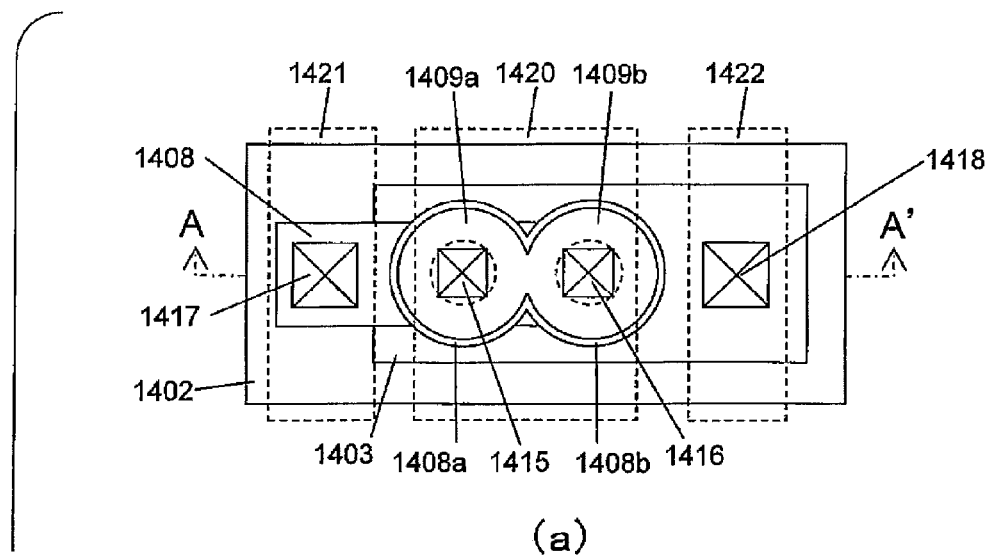
(a)
FIG. 44
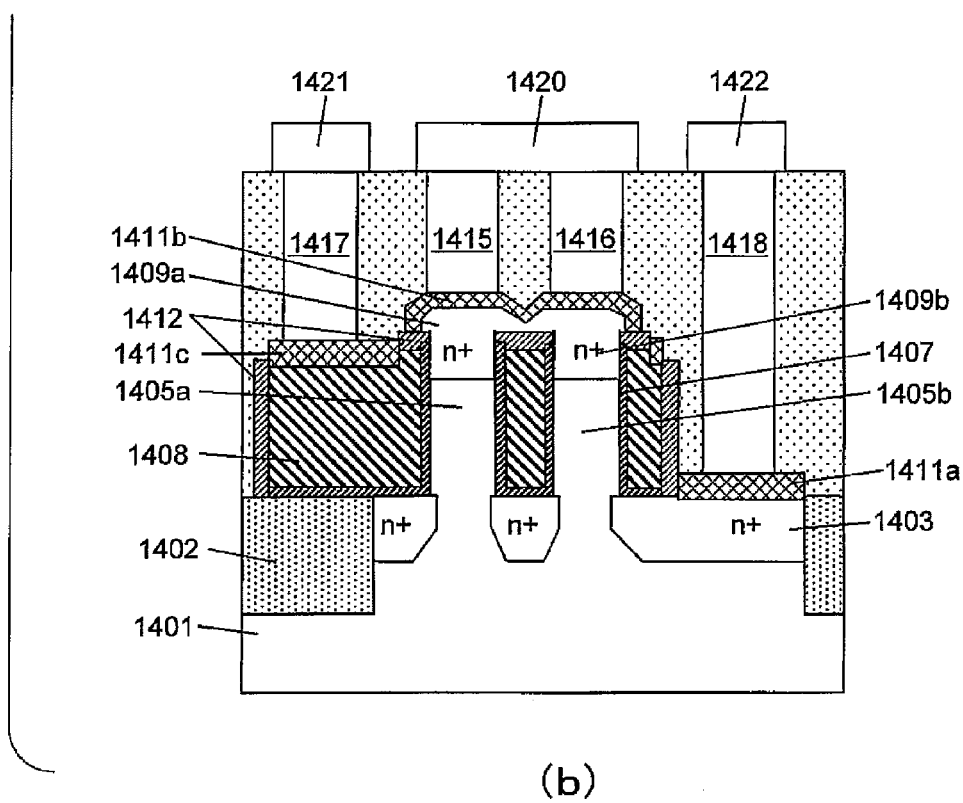
(b)

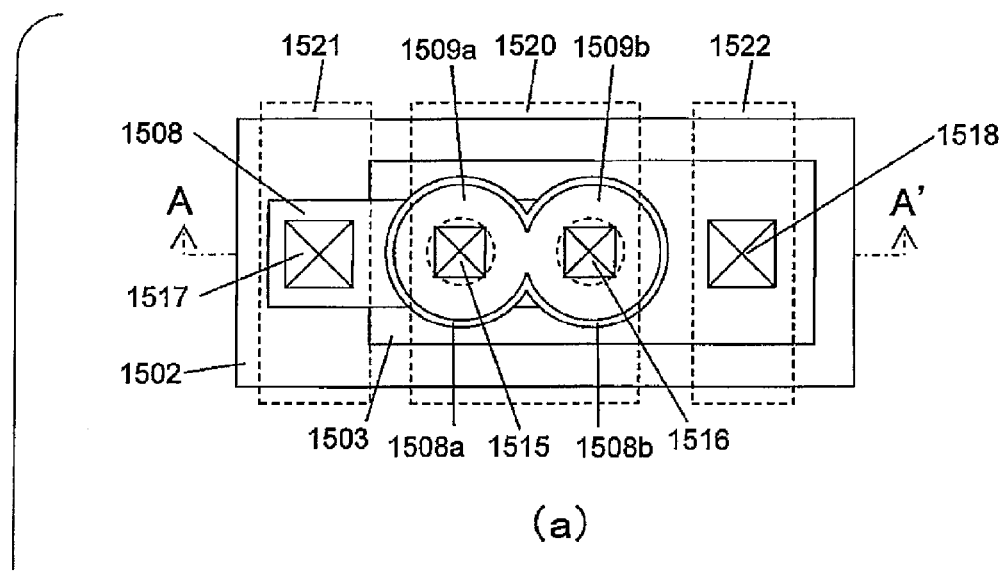
(a)
FIG. 45
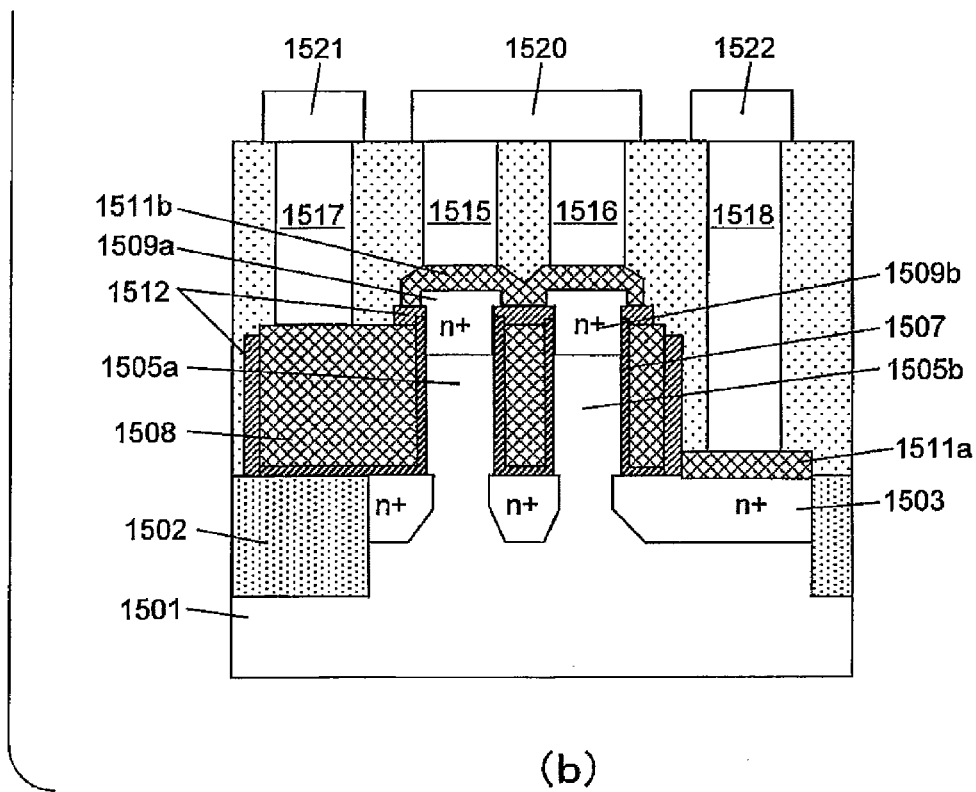
(b)

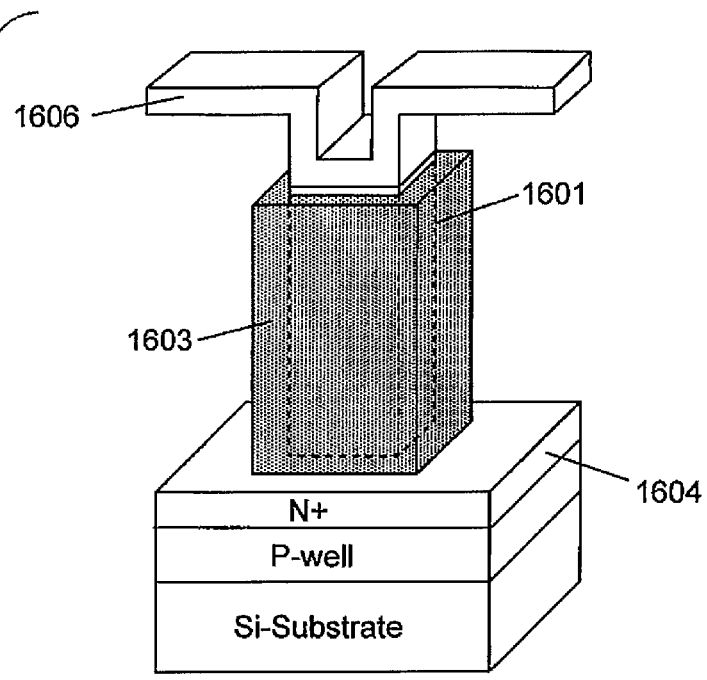
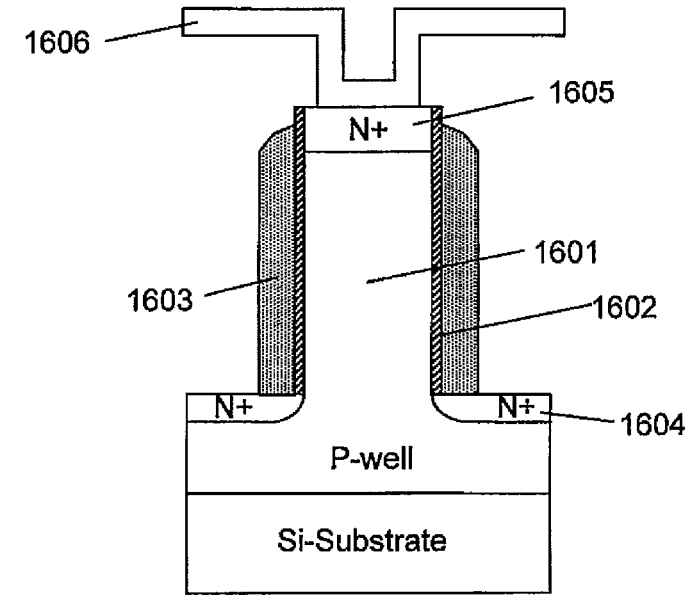
FIG. 46
Prior Art

FIG. 47 Prior Art
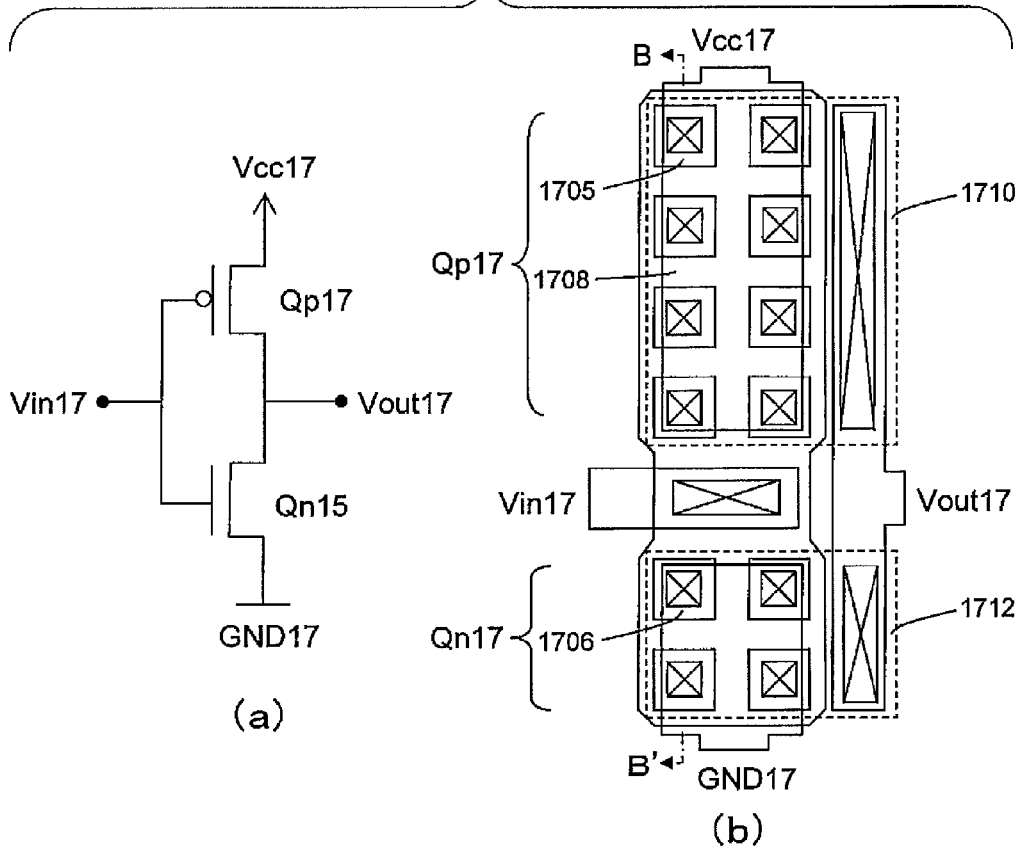
(a)
(b)
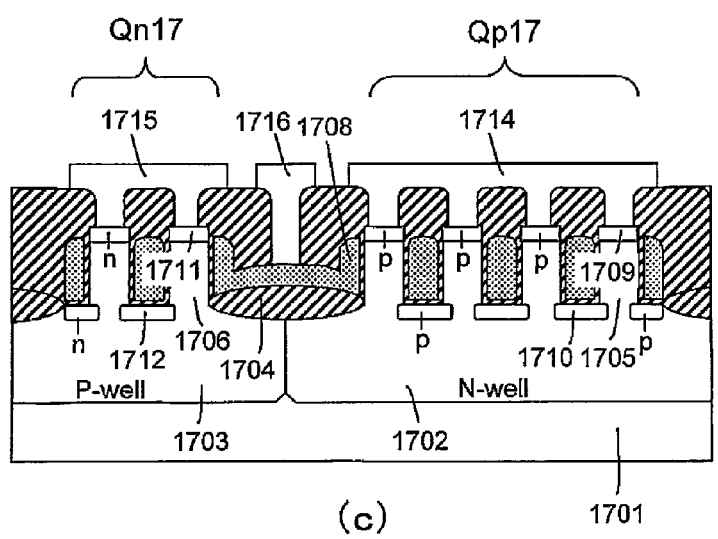
(c)

SEMICONDUCTOR DEVICE INCLUDING A MOS TRANSISTOR AND PRODUCTION METHOD THEREFOR

RELATED APPLICATIONS

This application is a divisional patent application of U.S. patent application Ser. No. 12/768,290, filed Apr. 27, 2010, which pursuant to 35 U.S.C. §119(e), claims the benefit of Provisional U.S. Patent Application Ser. No. 61/217,896 filed on Jun. 4, 2009. This application also claims priority under 35 U.S.C. §119(a) to JP2009-109126 filed on Apr. 28, 2009. The entire contents of these applications are hereby incorporated by reference.

BACKGROUND OF THE INVENTION

1. Field of the Invention

The present invention relates to a semiconductor device and a production method therefor, and more particularly to a structure and a production method for an SGT (Surrounding Gate Transistor) which is a vertical MOS transistor comprising a pillar-shaped semiconductor layer having a sidewall serving as a channel region, and a gate electrode formed to surround the channel region.

2. Background Art

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (see, for example, Patent Document 1: JP 2-188966A). In the SGT, a drain, a gate and a source are arranged in a vertical direction, so that an occupancy area can be significantly reduced as compared with a conventional planar transistor.

FIGS. 46(a) and 46(b) show an SGT disclosed in the Patent Document 1, wherein FIG. 46(a) and FIG. 46(b) are, respectively, a bird's-eye view and a sectional view of the SGT. With reference to FIGS. 46(a) and 46(b), a structure of the SGT will be briefly described below. A pillar-shaped silicon layer 1601 is formed on a silicon substrate. A gate dielectric film 1602 is formed to surround the pillar-shaped silicon layer 1601, and a gate electrode 1603 is formed to surround the gate dielectric film 1602. A lower diffusion layer 1604 and an upper diffusion layer 1605 are formed underneath and in an upper portion of the pillar-shaped silicon layer 1601, respectively. The upper diffusion layer 1605 is connected to an interconnection layer 1606 via a contact.

FIGS. 47(a) to 47(c) show a CMOS inverter using an SGT, wherein FIG. 47(a), FIG. 47(b) and FIG. 47(c) are, respectively, an equivalent circuit of the CMOS inverter, a top plan view of the CMOS inverter, and a sectional view taken along the line B-B' in FIG. 47(b). Referring to FIGS. 47(b) and 47(c), an N-well 2702 and a P-well 1703 are formed in an upper region of a Si substrate 1701. A pillar-shaped silicon layer 1705 constituting a PMOS transistor (PMOS pillar-shaped silicon layer 1705) and a pillar-shaped silicon layer 1706 constituting an NMOS transistor (NMOS pillar-shaped silicon layer 1706) are formed on a surface of the Si substrate, specifically on respective ones of the N-well region and the P-well region, and a gate 1708 is formed to surround the pillar-shaped silicon layers. Each of a P⁺ drain diffusion layer 1710 formed underneath the PMOS pillar-shaped silicon layer, and a N⁺ drain diffusion layer 1712 formed underneath the NMOS pillar-shaped silicon layer, is connected to an output terminal Vout 17. A source diffusion layer 1709 formed in an upper portion of the PMOS pillar-shaped silicon layer is connected to a power supply potential Vcc 17, and a source diffusion layer 1711 formed in an upper portion of the NMOS pillar-shaped silicon layer is connected to a ground potential GND 17. Further, the gate 1708 common to the PMOS and NMOS pillar-shaped silicon layers is connected to an input terminal Vin 17. In this manner, the CMOS inverter is formed.

As a prerequisite to enhancing a channel controllability by a gate in an SGT to sufficiently suppress short-channel effects, it is necessary to form a pillar-shaped silicon layer to have a sufficiently-small size relative to a gate length. A size of a pillar-shaped silicon layer can be reduced in a relatively easy manner, for example, by causing dimensional shrinking during dry etching for forming the pillar-shaped silicon layer, or by performing sacrificial oxidation after formation of the pillar-shaped silicon layer. Thus, in many cases, a pillar-shaped silicon layer is formed to have a size less than a minimum fabrication size F, in order to sufficiently suppress the short-channel effects in an SGT. FIG. 48 shows a structure of an SGT which comprises a pillar-shaped silicon layer 1611 having a size less than the minimum fabrication size F. In this SGT structure, a gate length is sufficiently large relative to the size of the pillar-shaped silicon layer 1611, so that the short-channel effects can be suppressed. Further, a contact 1616 to be formed on a top of the pillar-shaped silicon layer is formed in a similar size to the minimum fabrication size F, so that it will become structurally larger than the pillar-shaped silicon layer 1611.

However, the SGT structure illustrated in FIG. 48 has the following problems. Firstly, in terms of a need for forming a silicide layer on each of upper and lower sides of the pillar-shaped silicon layer to reduce a parasitic resistance in an SGT, a reduction in size of a pillar-shaped silicon layer causes difficulty in forming an adequate silicide on top of the pillar-shaped silicon layer due to the so-called "narrow width effect" on the silicide layer. Moreover, even if an adequate silicide can be formed on top of the pillar-shaped silicon layer, an interface area between the silicide and an upper diffusion layer 1615 becomes smaller along with a reduction in diameter of the pillar-shaped silicon layer, so that an interface resistance between the silicide and the upper diffusion layer is increased to cause deterioration in transistor characteristics.

Secondly, in view of a reduction in the number of steps in an SGT production process, it is desirable to simultaneously form two contacts on respective ones of the upper diffusion layer 1615 and a lower diffusion layer 1614. In this case, the contact 1616 to be formed on top of the pillar-shaped silicon layer has to undergo overetching to an extent corresponding to a height dimension of the pillar-shaped silicon layer or more, as compared with the contact to be formed on the lower diffusion layer 1614. In the SGT structure illustrated in FIG. 48, the contact to be formed on top of the pillar-shaped silicon layer is excessively overetched during etching for the contacts, so that a short-circuiting between the gate and the contact becomes more likely to occur.

SUMMARY OF THE INVENTION

In view of the above circumstances, it is an object of the present invention to, in a vertical transistor, reduce the narrow width effect on a silicide layer on top of a pillar-shaped silicon layer while reducing an interface resistance between the silicide and an upper diffusion layer, to improve transistor characteristics. It is another object of the present invention to achieve a structure free of the occurrence of a short-circuiting between a contact and a gate.

In order to achieve the above objects, according to a first aspect of the present invention, there is provided a MOS transistor which comprises: a pillar-shaped semiconductor layer; one of drain and source regions which is formed underneath the pillar-shaped semiconductor layer to serve as a first drain/source region; a gate electrode formed around a sidewall of the pillar-shaped semiconductor layer through a first dielectric film; an epitaxial semiconductor layer formed on top of an upper surface of the pillar-shaped semiconductor layer; and a remaining one of the drain and source regions which is formed so as to be at least partially in the epitaxial semiconductor layer to serve as a second drain/source region, wherein an area of an upper surface of the second drain/source region is greater than an area of the upper surface of the pillar-shaped semiconductor layer.

Preferably, the MOS transistor of the present invention further comprises a silicide layer formed on the upper surface of the second drain/source region.

More preferably, an interface area between the silicide layer and the second drain/source region is greater than the area of the upper surface of the pillar-shaped semiconductor layer.

Preferably, in the MOS transistor of the present invention, the epitaxial semiconductor layer consists of a silicon (Si) layer or a silicon carbide (SiC) layer formed by epitaxial growth, in cases where it is an n-type epitaxial semiconductor layer, or consists of a silicon (Si) layer or a silicon germanium (SiGe) layer formed by epitaxial growth, in cases where it is a p-type epitaxial semiconductor layer.

Preferably, in the MOS transistor of the present invention, when the number of the pillar-shaped semiconductor layers is at least two, the epitaxial semiconductor layers formed on tops of respective upper surfaces of the at least two pillar-shaped semiconductor layers are connected to each other to form a single common drain/source region.

Preferably, in the MOS transistor of the present invention, the epitaxial semiconductor layer is formed on top of the gate electrode through a second dielectric film.

Preferably, the above MOS transistor further comprises a contact formed on the silicide layer, wherein an area of the contact is less than an area of an upper surface of the silicide layer.

Preferably, the above MOS transistor further comprises at least one contact formed on the epitaxial semiconductor layers on tops of the upper surfaces of the at least two pillar-shaped semiconductor layers, wherein the number of the contacts is less than the number of the pillar-shaped semiconductor layers.

Preferably, the above MOS transistor further comprises at least one contact formed on the connected epitaxial semiconductor layers, wherein the at least one contact includes a contact formed on the connected epitaxial semiconductor layers at a position corresponding to a position between adjacent two of the at least two pillar-shaped semiconductor layers.

Preferably, the above MOS transistor further comprises a plurality of contacts at least one of which is formed on the connected epitaxial semiconductor layers, wherein an area of the at least one contact in cross-section parallel to a principal surface of the substrate is greater than that of each of the remaining contacts.

According to a second aspect of the present invention, there is provided a method of producing a semiconductor device having a MOS transistor. The method comprises the steps of: providing a substrate having a plurality of pillar-shaped semiconductor layers formed thereover; forming one of drain and source regions underneath the pillar-shaped semiconductor layers to serve as a first drain/source region; forming a first dielectric film on a surface of the obtained product; forming a conductive film on the first dielectric film; etching back the first dielectric film and the conductive film to form each of the first dielectric film and the conductive film to have a height dimension equal to a gate length along a sidewall of each of the pillar-shaped semiconductor layers; removing a part of the conductive film and the first dielectric film by selective etching to form a gate electrode around the pillar-shaped semiconductor layers, and a gate line extending from the gate electrode; forming an epitaxial layer on top of an upper surface of at least one of the pillar-shaped semiconductor layers by epitaxial growth, in such a manner that an area of an upper surface of the epitaxial layer becomes greater than that an area of the upper surface of the at least one pillar-shaped semiconductor layer; and forming a remaining one of the drain and source regions in the epitaxial layer and each of the pillar-shaped semiconductor layers to serve as a second drain/source region having a same conductive type as that of the first drain/source region formed on the substrate.

Preferably, the method of the present invention further comprises the step of forming a silicide layer in a surface of the epitaxial layer.

Preferably, in the method of the present invention, the epitaxial semiconductor layer consists of a silicon (Si) layer or a silicon carbide (SiC) layer formed by epitaxial growth, in cases where it is an n-type epitaxial semiconductor layer, or consists of a silicon (Si) layer or a silicon germanium (SiGe) layer formed by epitaxial growth, in cases where it is a p-type epitaxial semiconductor layer.

Preferably, in the method of the present invention, when at least two of the pillar-shaped semiconductor layers are arranged adjacent to each other with a given distance or less therebetween to constitute a MOS transistor, conditions for film formation by epitaxial growth are adjusted in such a manner that only the epitaxial layers formed on tops of respective upper surfaces of the at least two of the pillar-shaped semiconductor layers constituting the MOS transistor are self-alignedly connected together to allow a single common drain/source region to be formed therein.

Preferably, the method of the present invention further comprises, as a pretreatment for the step of forming an epitaxial layer, the step of forming a second dielectric film for isolating between the gate electrode and the epitaxial semiconductor layer.

More preferably, the step of forming a second dielectric film includes the sub-steps of: forming a silicon nitride film or a laminated film comprised of a silicon nitride film and a silicon oxide film, on a surface of the product obtained from the step of removing a part of the conductive film and the first dielectric film; and etching back the silicon nitride film or the laminated film to cover a sidewall of each of the pillar-shaped semiconductor layers, a sidewall of the gate electrode and a sidewall of the gate line by the etched silicon nitride film or laminated film, while allowing the etched silicon nitride film or laminated film to remain on top of the gate electrode, and allowing the first drain/source region and an upper surface of each of the pillar-shaped semiconductor layers to be exposed.

Preferably, in the method of the present invention, the step of providing a substrate having a plurality of pillar-shaped semiconductor layers formed thereover, and the step of forming one of drain and source regions underneath the pillar-shaped semiconductor layers to serve as a first drain/source region, comprise the sub-steps of: forming a plurality of pillar-shaped semiconductor layers on a substrate; forming an element isolation region on the substrate; and forming one of drain and source regions on the substrate to serve as a first drain/source region.

Preferably, in the method of the present invention, the step of providing a substrate having a plurality of pillar-shaped semiconductor layers formed thereover, and the step of forming one of drain and source regions underneath the pillar-shaped semiconductor layers to serve as a first drain/source region, comprise the sub-steps of: forming a planar semiconductor layer, on a dielectric film on a substrate, and then forming a plurality of pillar-shaped semiconductor layers on the planar semiconductor layer substrate; isolating the planar semiconductor layer on an element-by-element basis; and forming one of drain and source regions in the isolated planar semiconductor layer to serve as a first drain/source region.

In the present invention, the term "over a substrate" means a position on the substrate or a position located upwardly of the substrate through a certain layer formed on the substrate.

In a vertical transistor, the present invention makes it possible to reduce the narrow width effect on a silicide layer on top of a pillar-shaped silicon layer while reducing an interface resistance between the silicide and an upper diffusion layer, to improve transistor characteristics. The present invention also makes it possible to achieve a structure free of the occurrence of a short-circuiting between a contact and a gate.

BRIEF DESCRIPTION OF THE DRAWINGS

FIGS. 21(a) and 21(b) are, respectively, a top plan view and a sectional view showing a transistor according to a second embodiment of the present invention.

FIGS. 22(a) and 22(b) are, respectively, a top plan view and a sectional view showing one example of modification of the transistor according to the second embodiment.

FIGS. 23(a) and 23(b) are, respectively, a top plan view and a sectional view showing a CMOS inverter according to a third embodiment of the present invention.

FIGS. 24(a) and 24(b) are, respectively, a top plan view and a sectional view showing one example of modification of the CMOS inverter according to the third embodiment.

FIGS. 25(a) and 25(b) are, respectively, a top plan view and a sectional view showing a transistor formed on an SOI substrate (SOI transistor), according to a fourth embodiment of the present invention.

FIGS. 26(a) and 26(b) are, respectively, a top plan view and a sectional view showing one example of modification of the SOI transistor according to the fourth embodiment.

FIGS. 27(a) and 27(b) are process diagrams showing one example of a production method for the SOI transistor illustrated in FIGS. 26(a) and 26(b), in order of process sequence.

FIGS. 42(a) and 42(b) are, respectively, a top plan view and a sectional view showing an SOI transistor according to a fifth embodiment of the present invention.

FIGS. 43(a) and 43(b) are, respectively, a top plan view and a sectional view showing a CMOS inverter formed on an SOI substrate (SOI CMOS inverter), according to a sixth embodiment of the present invention.

FIGS. 44(a) and 44(b) are, respectively, a top plan view and a sectional view showing a transistor according to a seventh embodiment of the present invention.

FIGS. 45(a) and 45(b) are, respectively, a top plan view and a sectional view showing a transistor according to an eighth embodiment of the present invention.

FIGS. 46(a) and 46(b) are, respectively, a bird's-eye view and a sectional view showing a conventional SGT.

FIGS. 47(a), 47(b) and 47(c) are, respectively, an equivalent circuit diagram, a top plan view and a sectional view showing a conventional SGT-based inverter.

DETAILED DESCRIPTION OF THE PREFERRED EMBODIMENTS

First Embodiment

Figure 1:
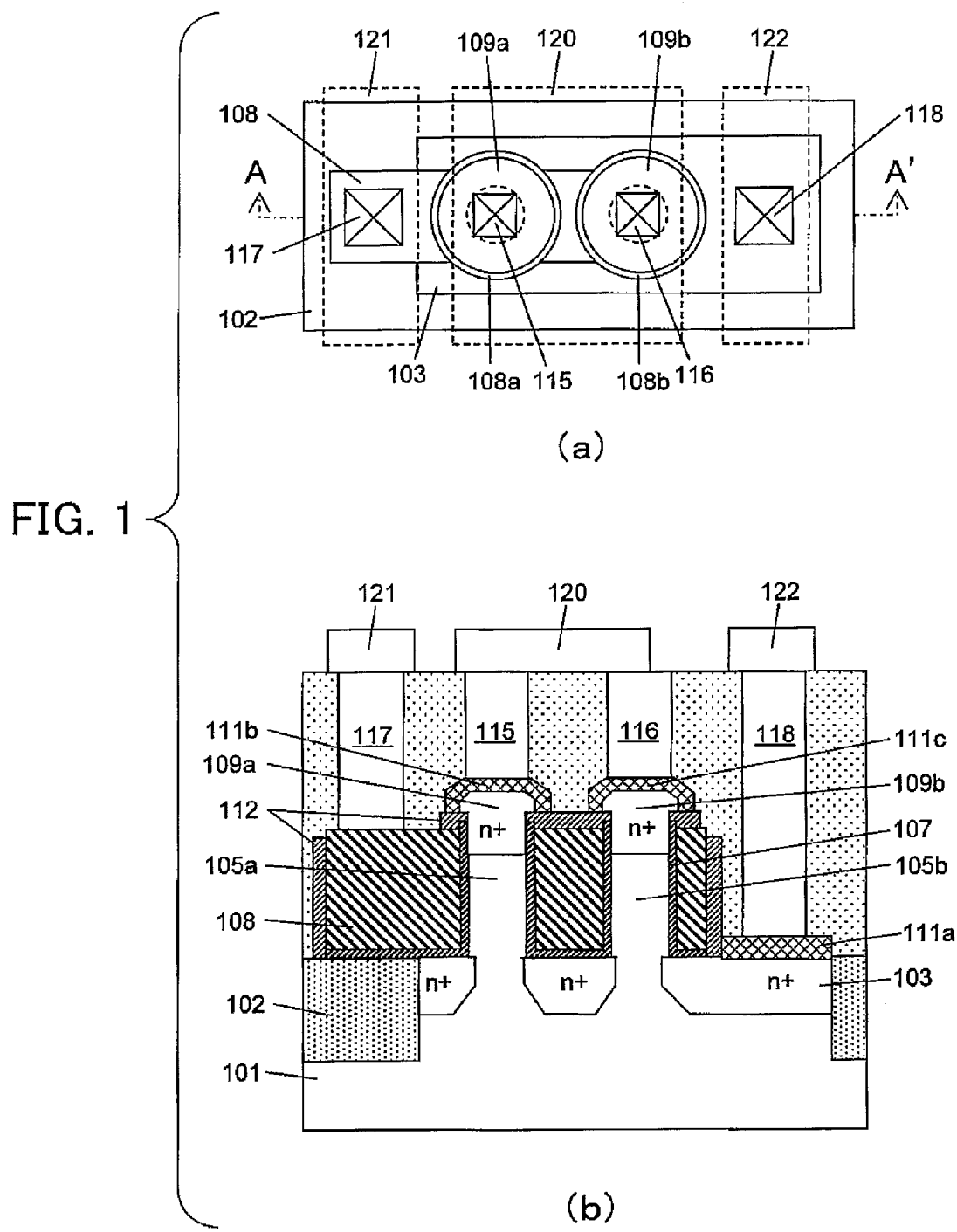
FIGS. 1(a) and 1(b) are, respectively, a top plan view and a sectional view showing a transistor according to a first embodiment of the present invention.

FIG. 1(a) is a top plan view showing a transistor according to a first embodiment of the present invention, and FIG. 1(b) is a sectional view taken along the line A-A' in FIG. 1(a). With reference to FIGS. 1(a) and 1(b), a structure of the transistor according to the first embodiment will be described below.

A silicon substrate 101 is isolated on an element-by-element basis by an element isolation region 102, and two pillar-shaped silicon layers (pillar-shaped semiconductor layers) 105a, 105b are formed on the silicon substrate. A gate dielectric film (first dielectric film) 107 and a gate electrode (108a, 108b) are formed around each of the pillar-shaped silicon layers (pillar-shaped semiconductor layers). In the first embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower $N^+$ diffusion layer (first drain/source diffusion region, i.e., one of drain and source diffusion regions) 103 is formed underneath the pillar-shaped silicon layers (pillar-shaped semiconductor layers), and a lower silicide layer 111a is formed on a surface of the lower $N^+$ diffusion layer (first drain/source diffusion region) 103, to reduce a parasitic resistance. An upper $N^+$ diffusion layer (second drain/source diffusion region, i.e., a remaining one of the drain and source diffusion regions) (109a, 109b) is formed on top of each of the pillar-shaped silicon layers (pillar-shaped semiconductor layers), in such a manner that an area of an upper surface thereof becomes greater than that of an upper surface of the pillar-shaped silicon layer. In the first embodiment, the upper $N^+$ diffusion layer (second drain/source diffusion region) (109a, 109b) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper $N^+$ diffusion layer (second drain/source diffusion region) (109a, 109b) may be formed only in a part or an entirety of the semiconductor epitaxial layer. The semiconductor epitaxial layer is electrically isolated from the gate electrode (108a, 108b) by a second dielectric film 112, such as a silicon nitride film or a laminated film comprised of a silicon nitride film and a silicon oxide film, interposed therebetween. An upper silicide layer (111b, 111c) is formed on the upper $N^+$ diffusion layer (second drain/source diffusion region) (109a, 109b). The upper silicide layer is formed on the epitaxial silicon layer (semiconductor epitaxial layer) having a diameter greater than that of the pillar-shaped silicon layer (pillar-shaped semiconductor layer). Thus, the narrow width effect on the upper silicide layer can be reduced. In addition, an interface area between the upper silicide layer and the upper $N^+$ diffusion layer can be set largely, so that an interface resistance between the upper silicide layer and the upper $N^+$ diffusion layer can be reduced. Further, the upper silicide layer (111b, 111c) may be formed on an upper surface of the upper $N^+$ diffusion layer (second drain/source diffusion region) to have a diameter greater than that of a contact (115, 116) to be formed on an upper side of the pillar-shaped silicon layer (pillar-shaped semiconductor layer). This makes it possible to prevent a short-circuiting between the contact and the gate electrode even if the contact undergoes overetching during etching for contacts. The contact (115, 116) formed on the upper side of the pillar-shaped silicon layer (pillar-shaped semiconductor layer) is connected to one of drain and source terminals through an interconnection layer 120. A contact 118 formed on a lower side of the pillar-shaped silicon layer (pillar-shaped semiconductor layer) is connected to a remaining one of the drain and source terminals through an interconnection layer 122, and a contact 117 formed on a gate line 108 extending from the gate electrode is connected to a gate terminal through an interconnection layer 121.

Figure 2:
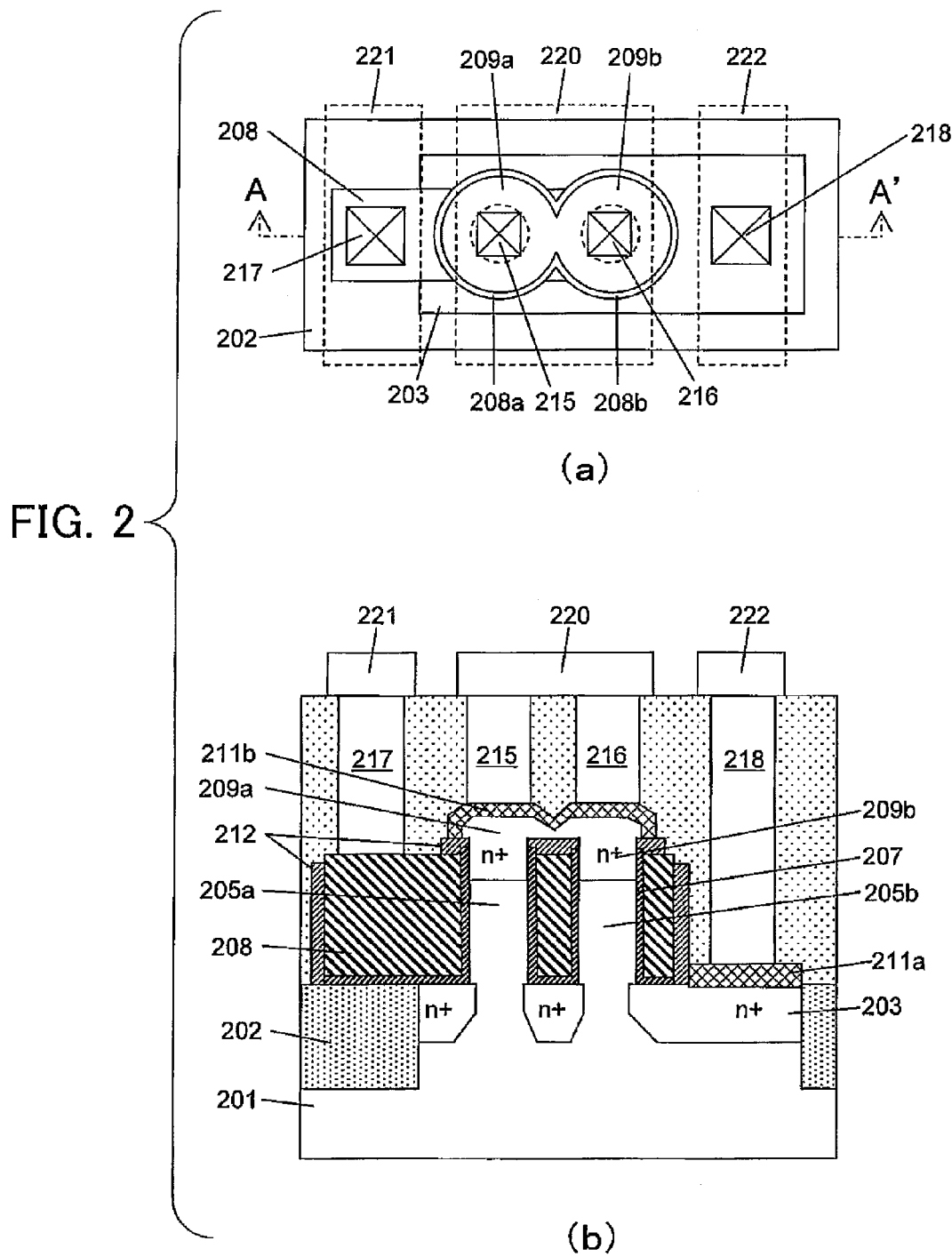
FIGS. 2(a) and 2(b) are, respectively, a top plan view and a sectional view showing one example of modification of the transistor according to the first embodiment.

As shown in FIGS. 2(a) and 2(b), in cases where a distance between two adjacent pillar-shaped silicon layers (pillar-shaped semiconductor layers) 205a, 205b is less than a given value, a thickness of a film to be epitaxially grown can be adjusted in such a manner that the silicon epitaxial layers (semiconductor epitaxial layers on respective ones of the adjacent pillar-shaped semiconductor layers are self-alignedly connected together. In this case, an interface area between an upper silicide layer 211b on an upper side of the pillar-shaped silicon layers (pillar-shaped semiconductor layers) and an integral set of upper $N^+$ diffusion layers (second drain/source diffusion regions) 209a, 209b becomes larger, so that an interface resistance between the an upper silicide layer and the integral set of upper $N^+$ diffusion layers (second drain/source diffusion regions) can be further reduced. In addition, an area of the upper silicide layer on the upper side of the pillar-shaped silicon layers (pillar-shaped semiconductor layers) becomes larger, so that the narrow width effect on the upper silicide layer can be significantly reduced to facilitate adequate formation of the upper silicide layer.

Figure 3:
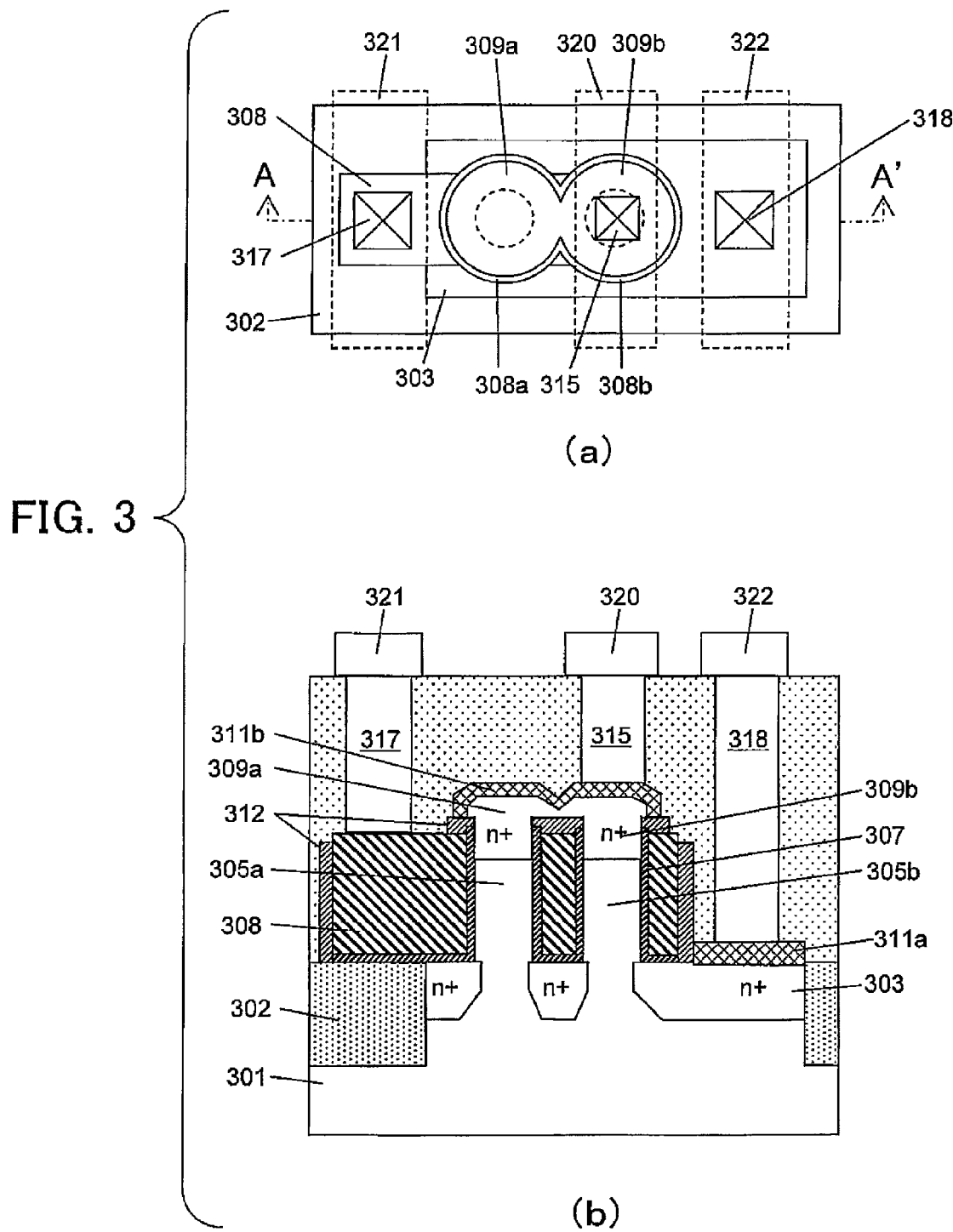
FIGS. 3(a) and 3(b) are, respectively, a top plan view and a sectional view showing another example of modification of the transistor according to the first embodiment.

Further, as shown in FIGS. 3(a) and 3(b), as to a contact for a plurality of pillar-shaped semiconductor layers, an upper side of the pillar-shaped semiconductor layers may be connected to an interconnection layer via a less number of contacts than the number of the pillar-shaped semiconductor layers.

Figure 4:
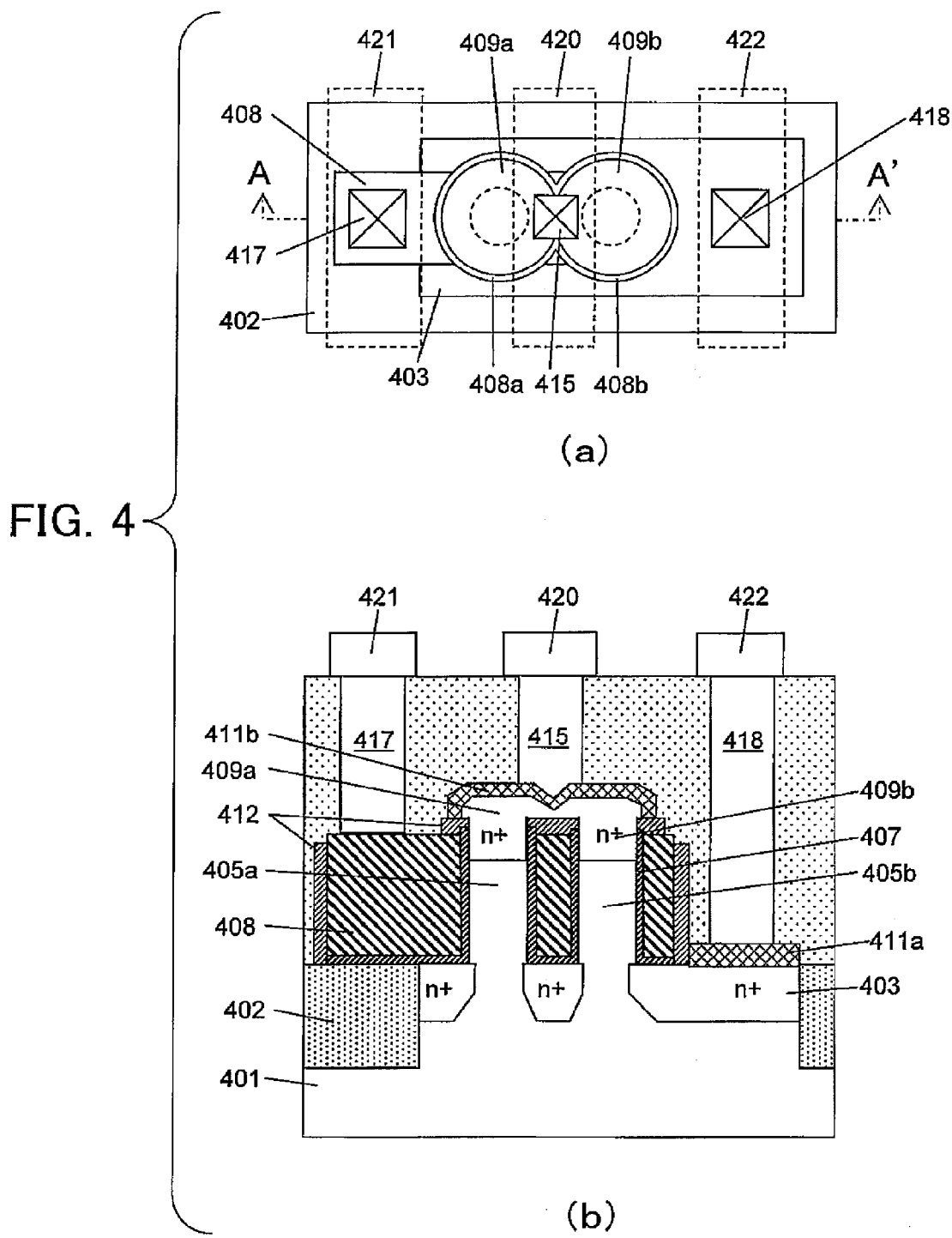
FIGS. 4(a) and 4(b) are, respectively, a top plan view and a sectional view showing yet another example of modification of the transistor according to the first embodiment.

Further, as shown in FIGS. 4(a) and 4(b), a contact 415 may be formed on an integral set of upper $N^+$ diffusion layers (second drain/source diffusion regions) 409a, 409b at a position corresponding to a position between adjacent pillar-shaped silicon layers (pillar-shaped semiconductor layers). In this case, an axis of the contact 415 may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between an interconnection line 420 and other interconnection line (421, 422) so as to facilitate interconnection layout.

Figure 5:
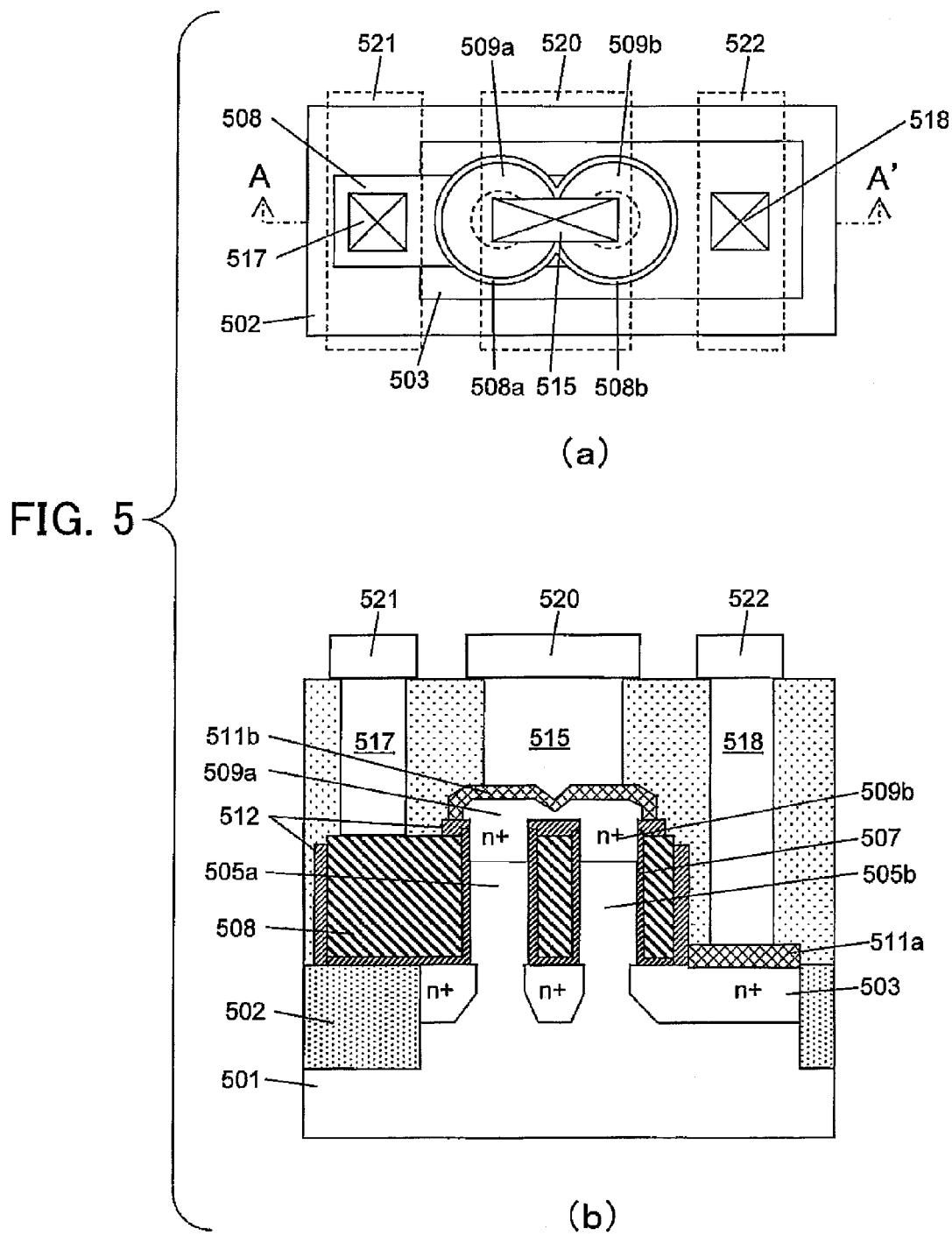
FIGS. 5(a) and 5(b) are, respectively, a top plan view and a sectional view showing still another example of modification of the transistor according to the first embodiment.
Figure 6:
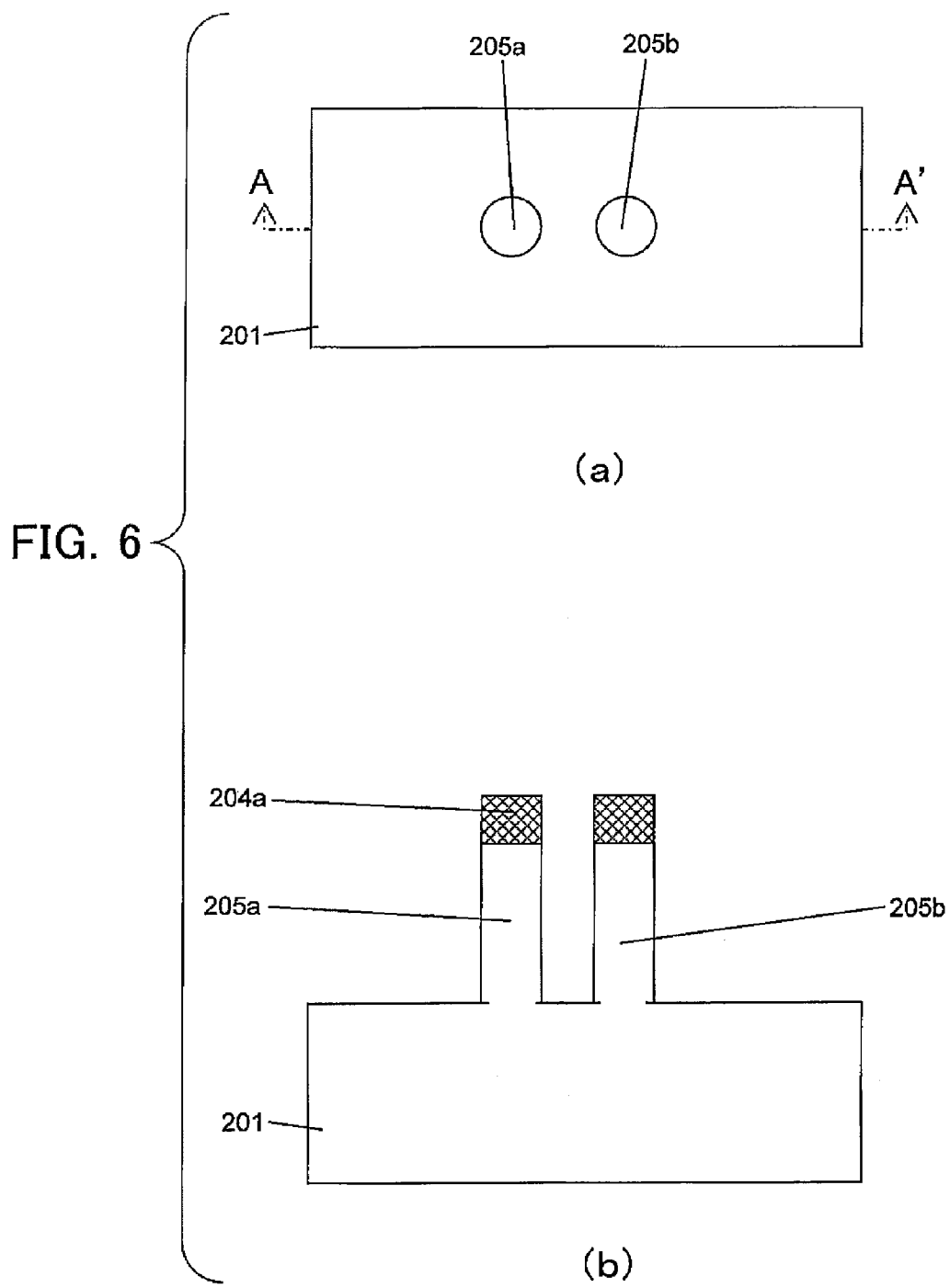
FIGS. 6(a) and 6(b) are process diagrams showing one example of a production method for the transistor illustrated in FIGS. 2(a) and 2(b), in order of process sequence.
Figure 7:
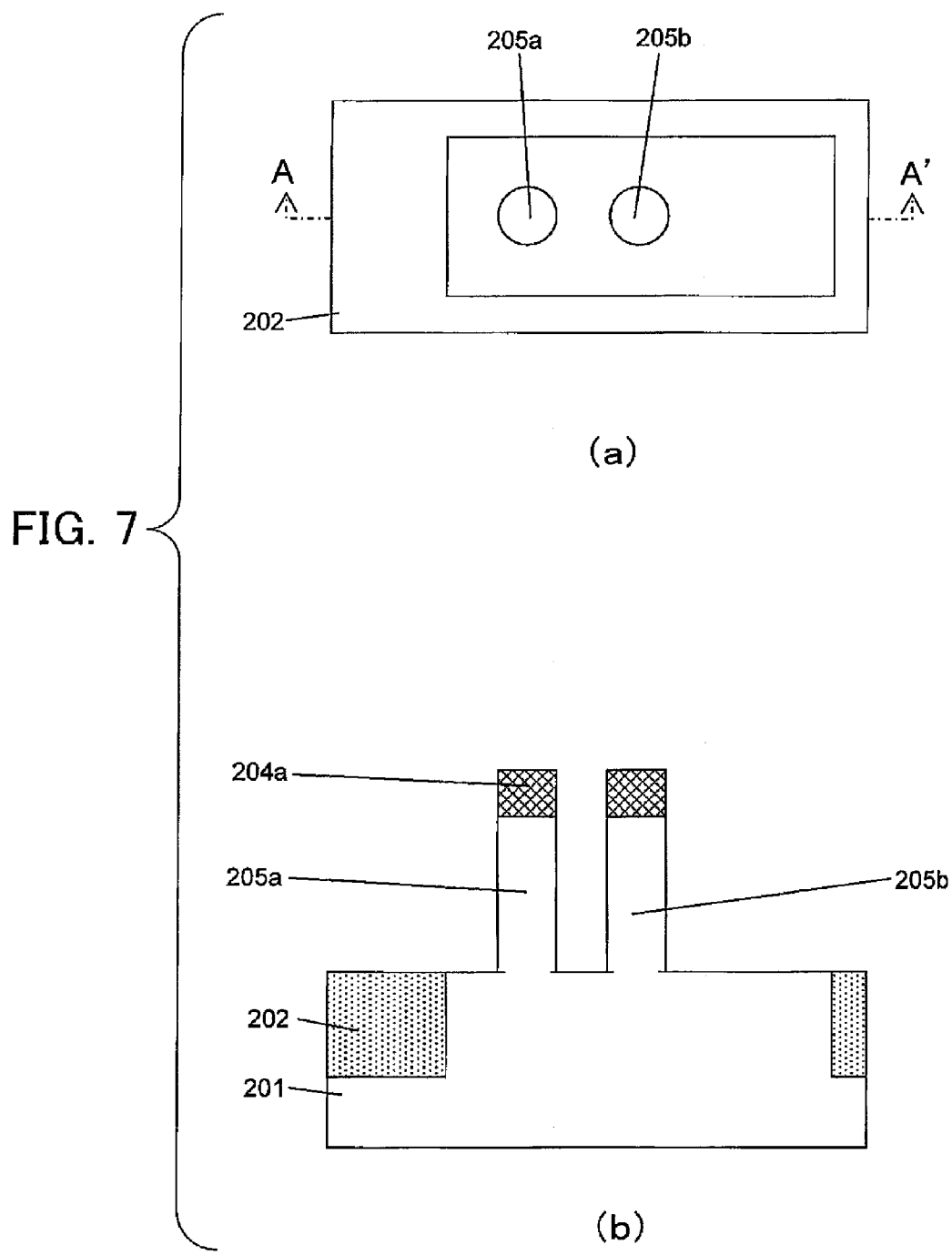
FIGS. 7(a) and 7(b) are process diagrams showing the example of the production method for the transistor illustrated in FIGS. 2(a) and 2(b), in order of process sequence.
Figure 8:
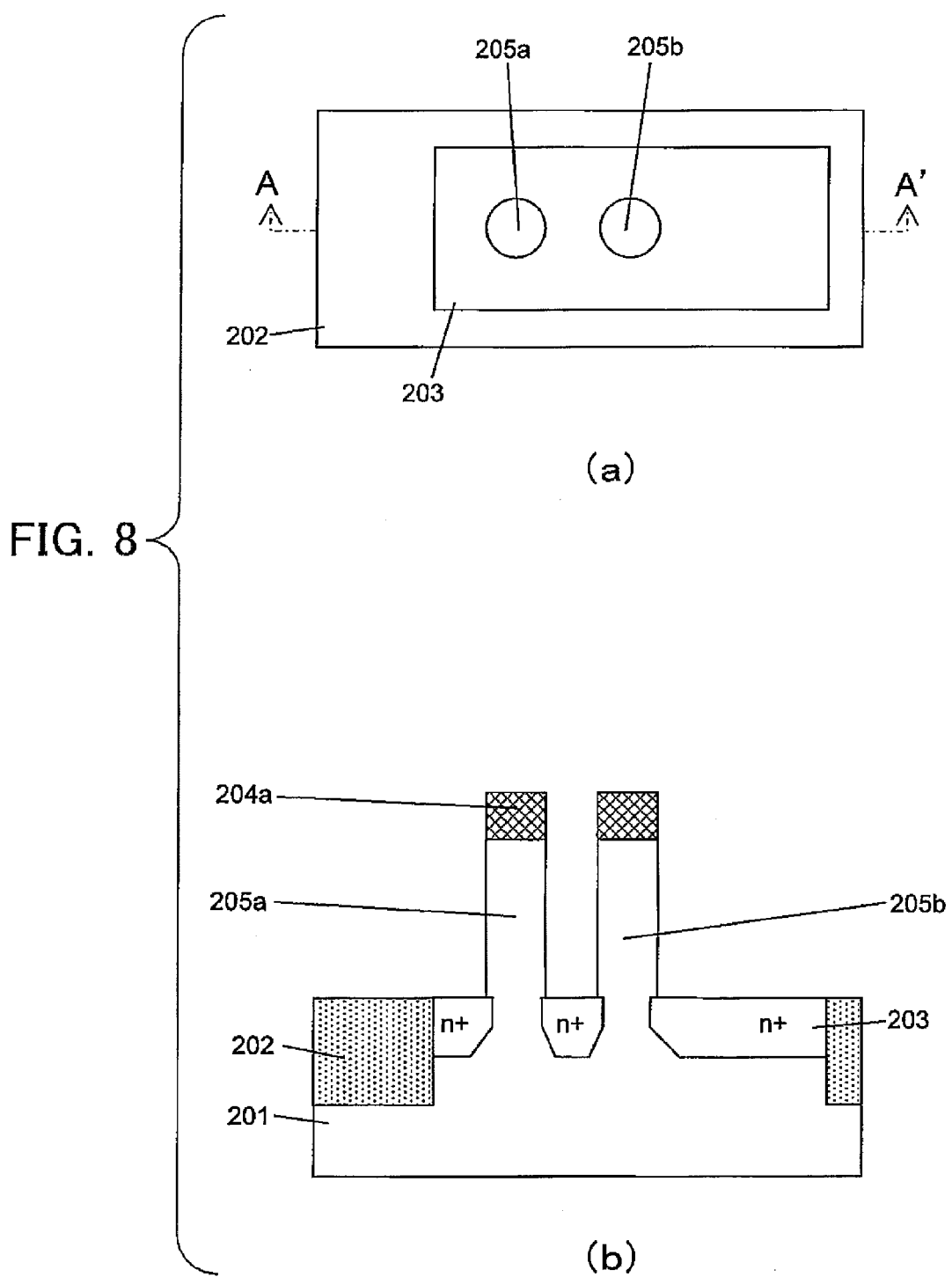
FIGS. 8(a) and 8(b) are process diagrams showing the example of the production method for the transistor illustrated in FIGS. 2(a) and 2(b), in order of process sequence.
Figure 9:
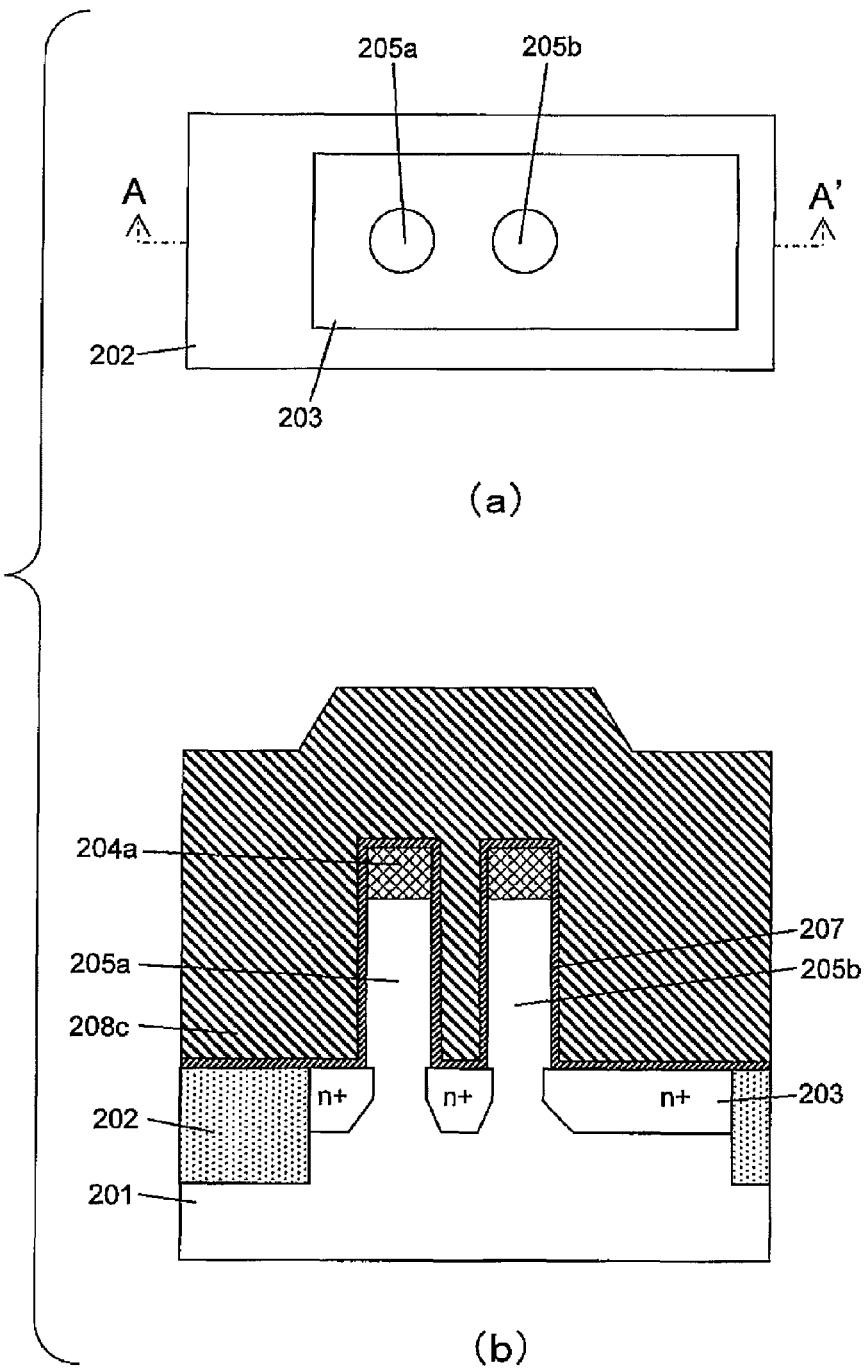
FIGS. 9(a) and 9(b) are process diagrams showing the example of the production method for the transistor illustrated in FIGS. 2(a) and 2(b), in order of process sequence.
Figure 10:
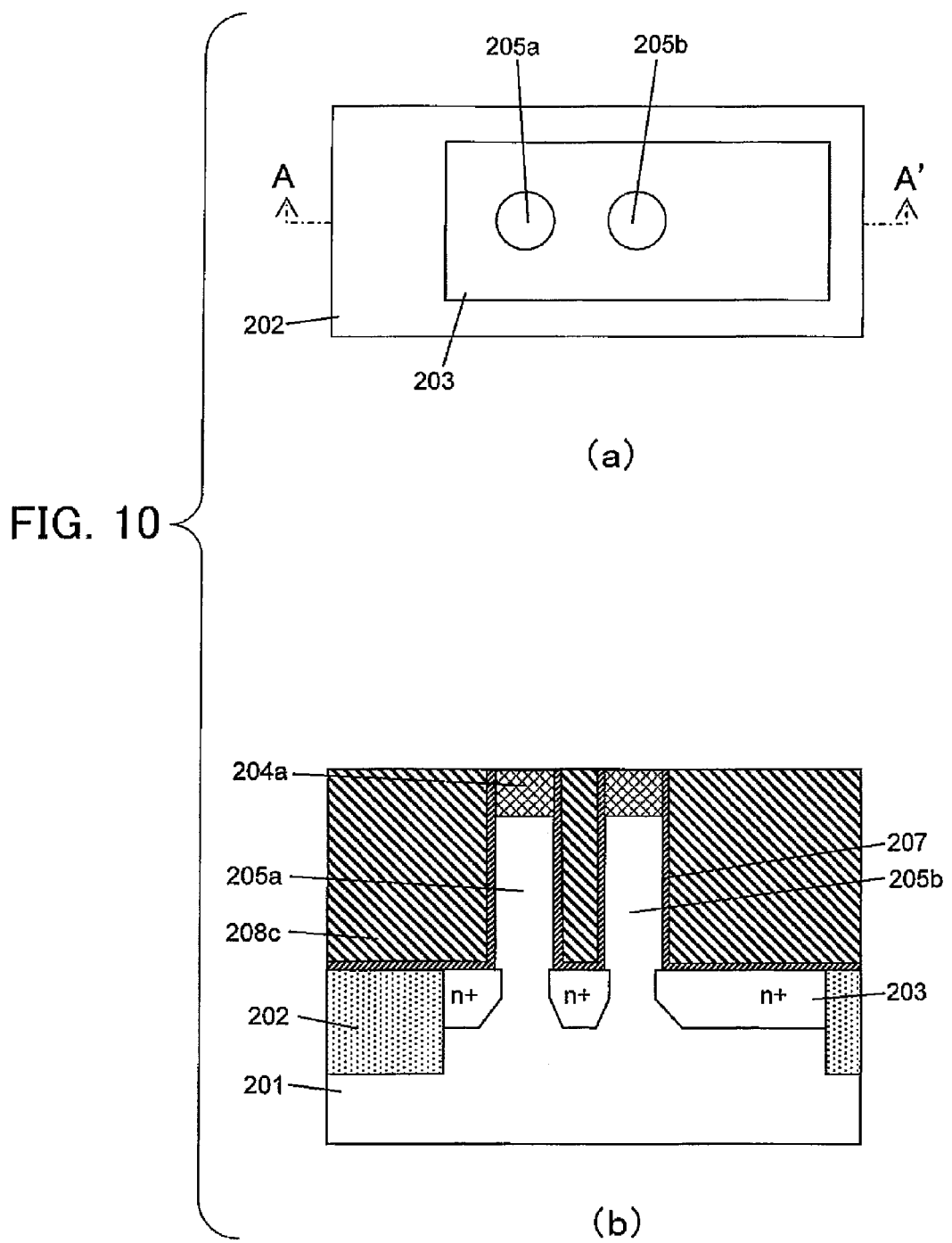
FIGS. 10(a) and 10(b) are process diagrams showing the example of the production method for the transistor illustrated in FIGS. 2(a) and 2(b), in order of process sequence.
Figure 11:
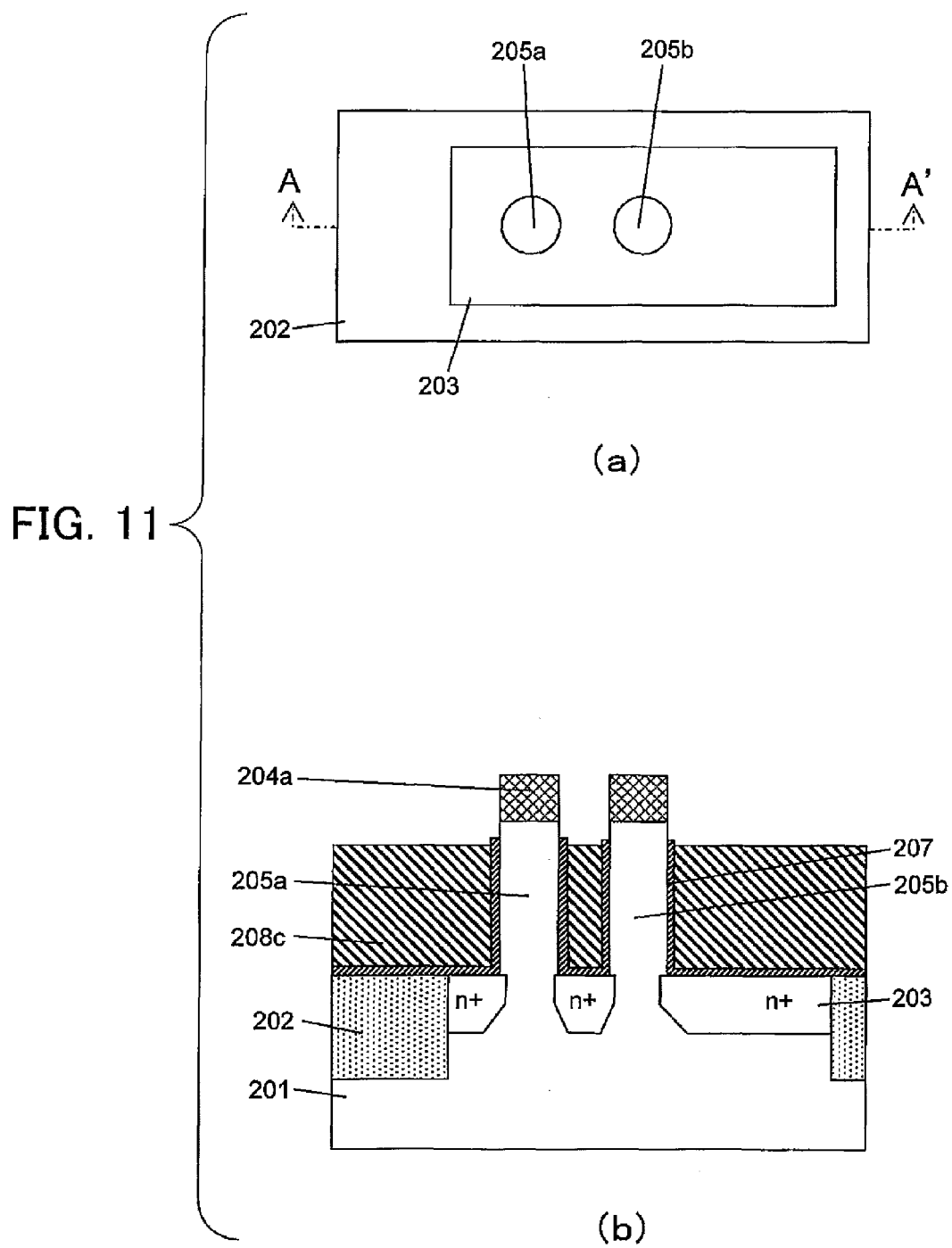
FIGS. 11(a) and 11(b) are process diagrams showing the example of the production method for the transistor illustrated in FIGS. 2(a) and 2(b), in order of process sequence.
Figure 12:
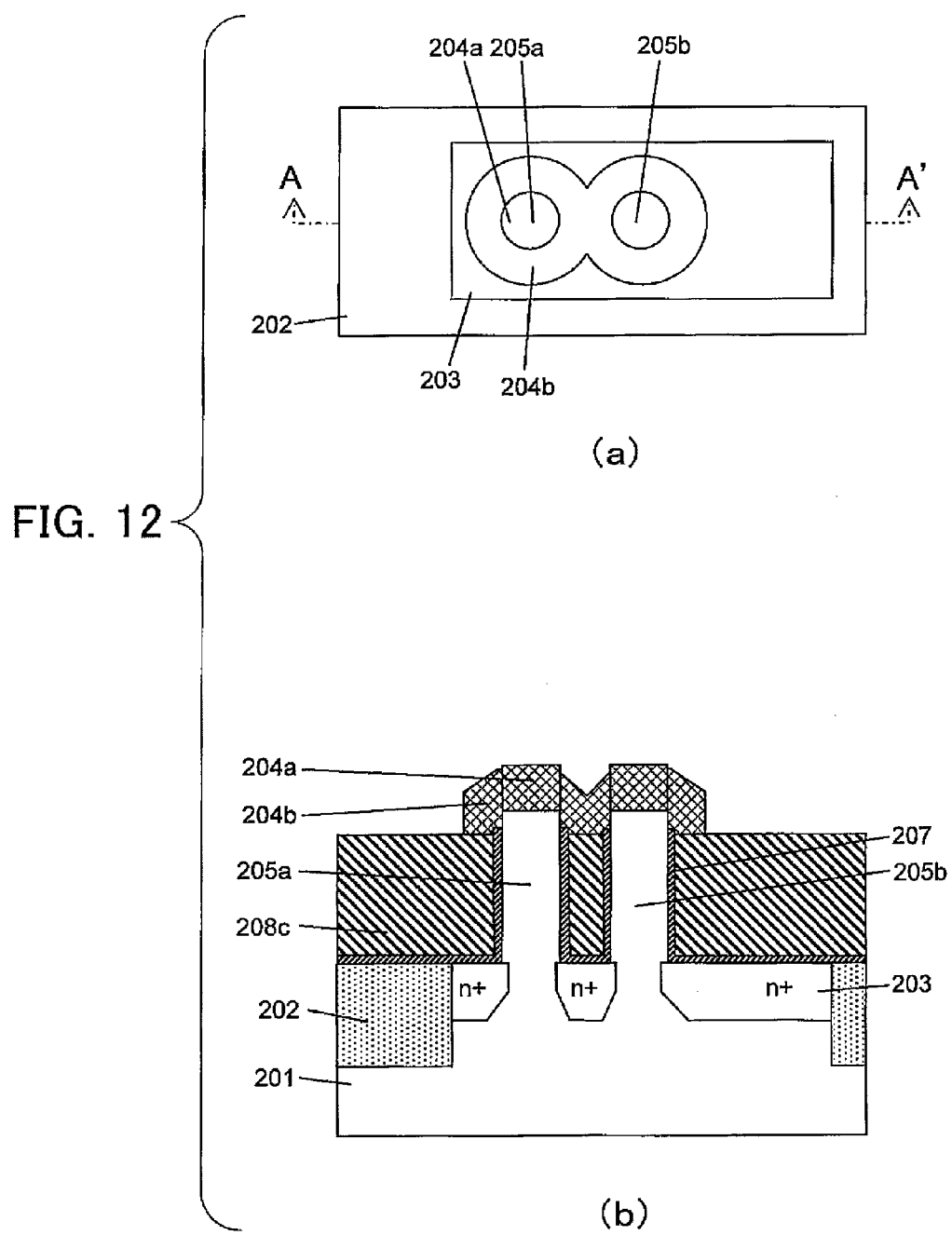
FIGS. 12(a) and 12(b) are process diagrams showing the example of the production method for the transistor illustrated in FIGS. 2(a) and 2(b), in order of process sequence.
Figure 13:
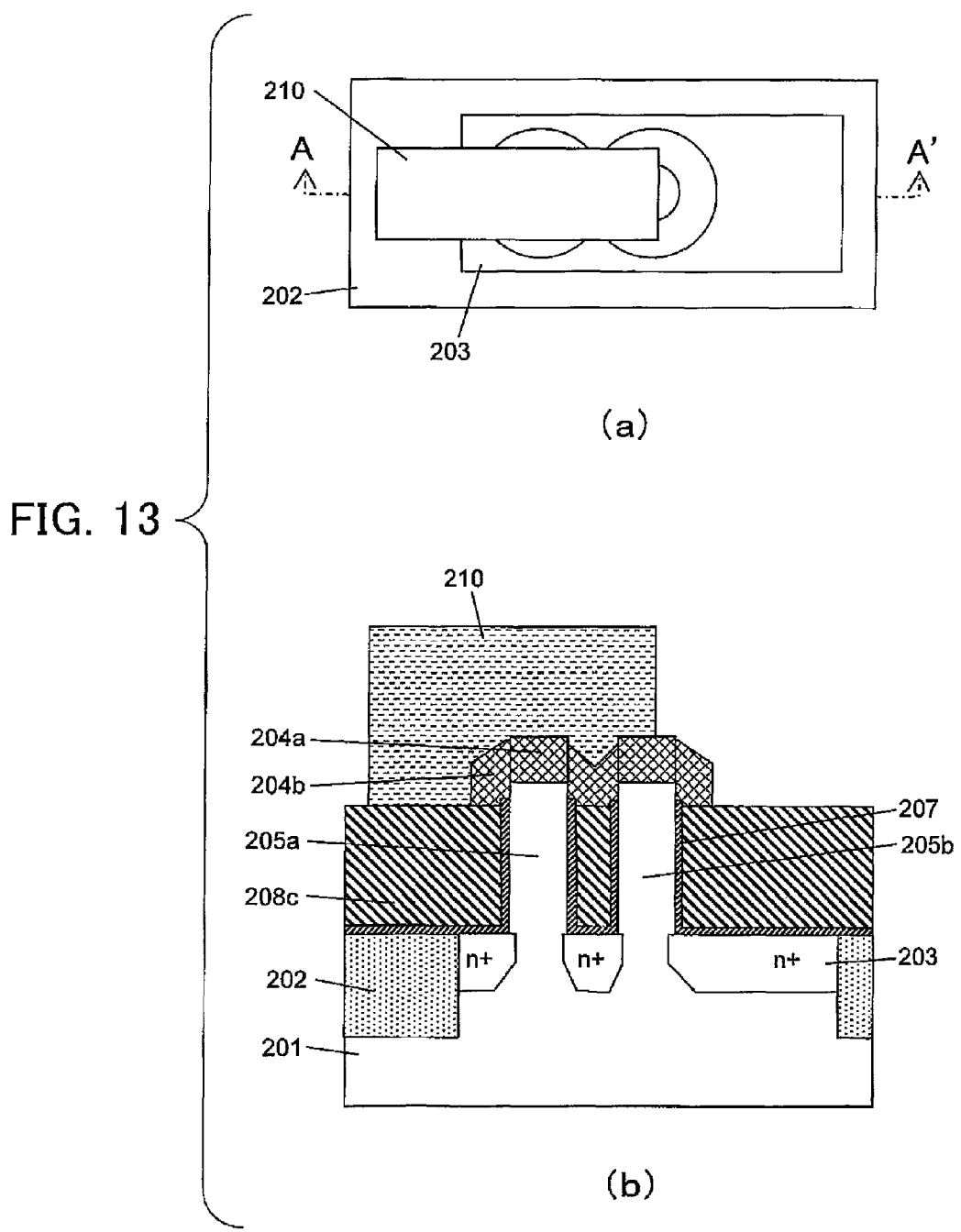
FIGS. 13(a) and 13(b) are process diagrams showing the example of the production method for the transistor illustrated in FIGS. 2(a) and 2(b), in order of process sequence.
Figure 14:
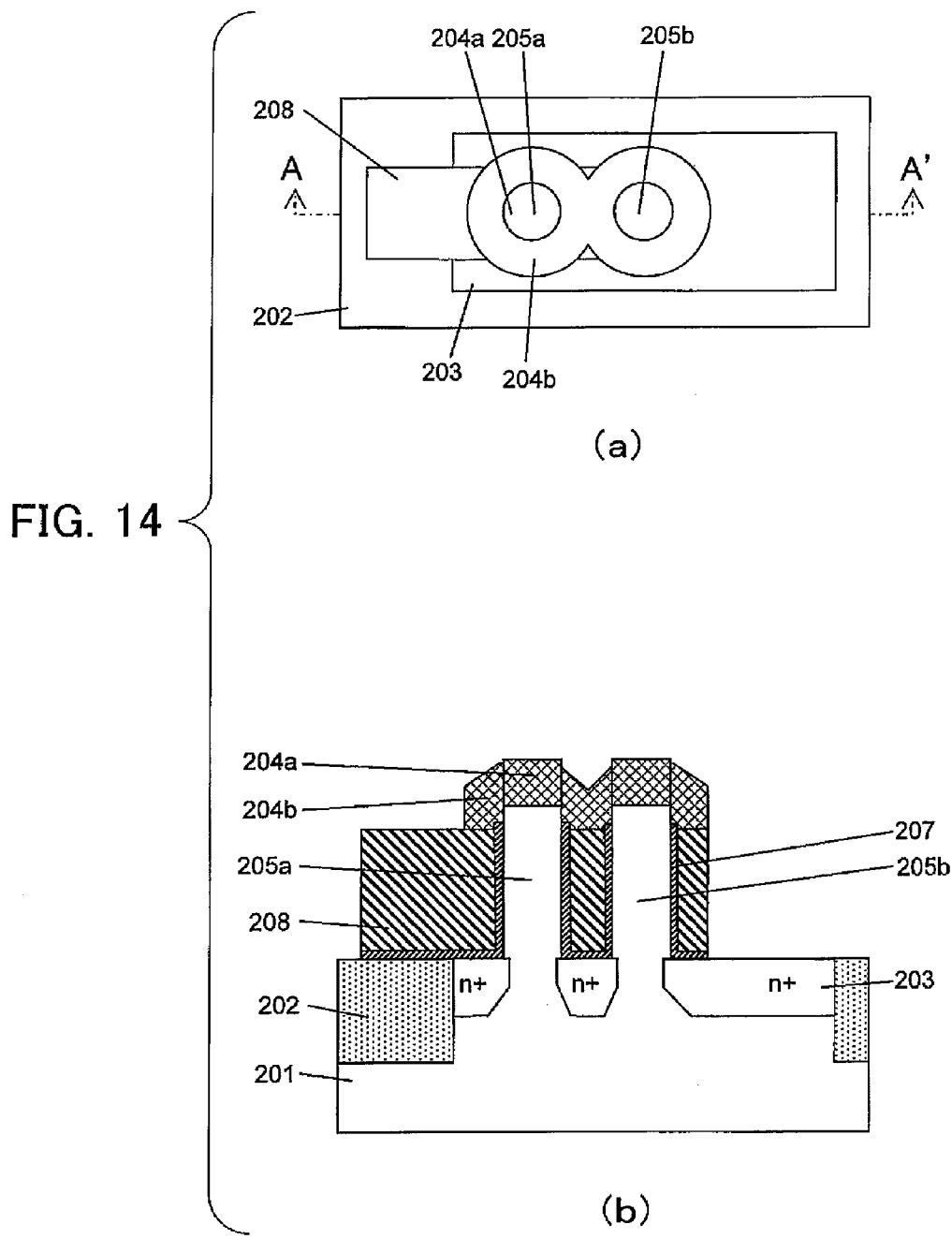
FIGS. 14(a) and 14(b) are process diagrams showing the example of the production method for the transistor illustrated in FIGS. 2(a) and 2(b), in order of process sequence.
Figure 15:
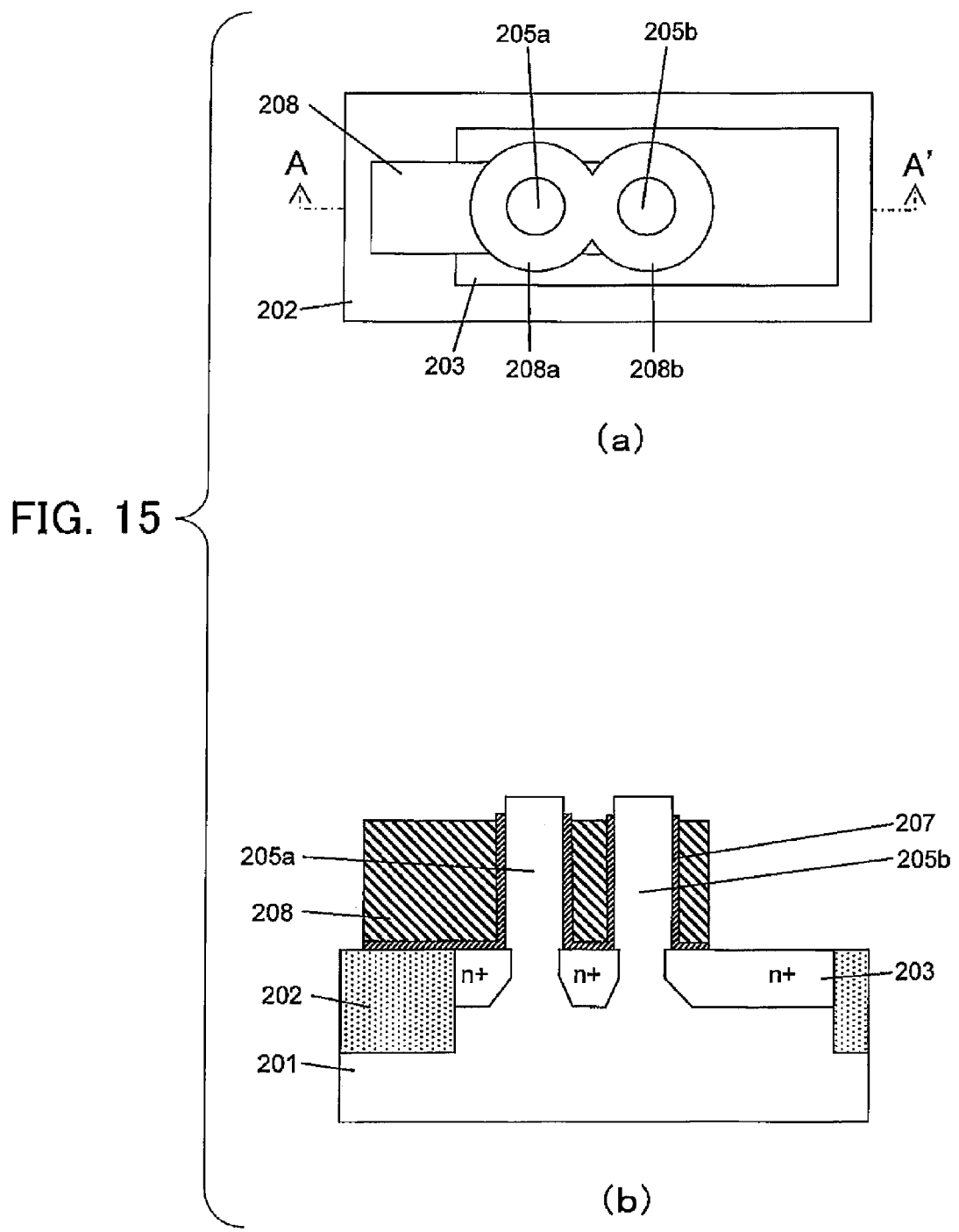
FIGS. 15(a) and 15(b) are process diagrams showing the example of the production method for the transistor illustrated in FIGS. 2(a) and 2(b), in order of process sequence.
Figure 16:
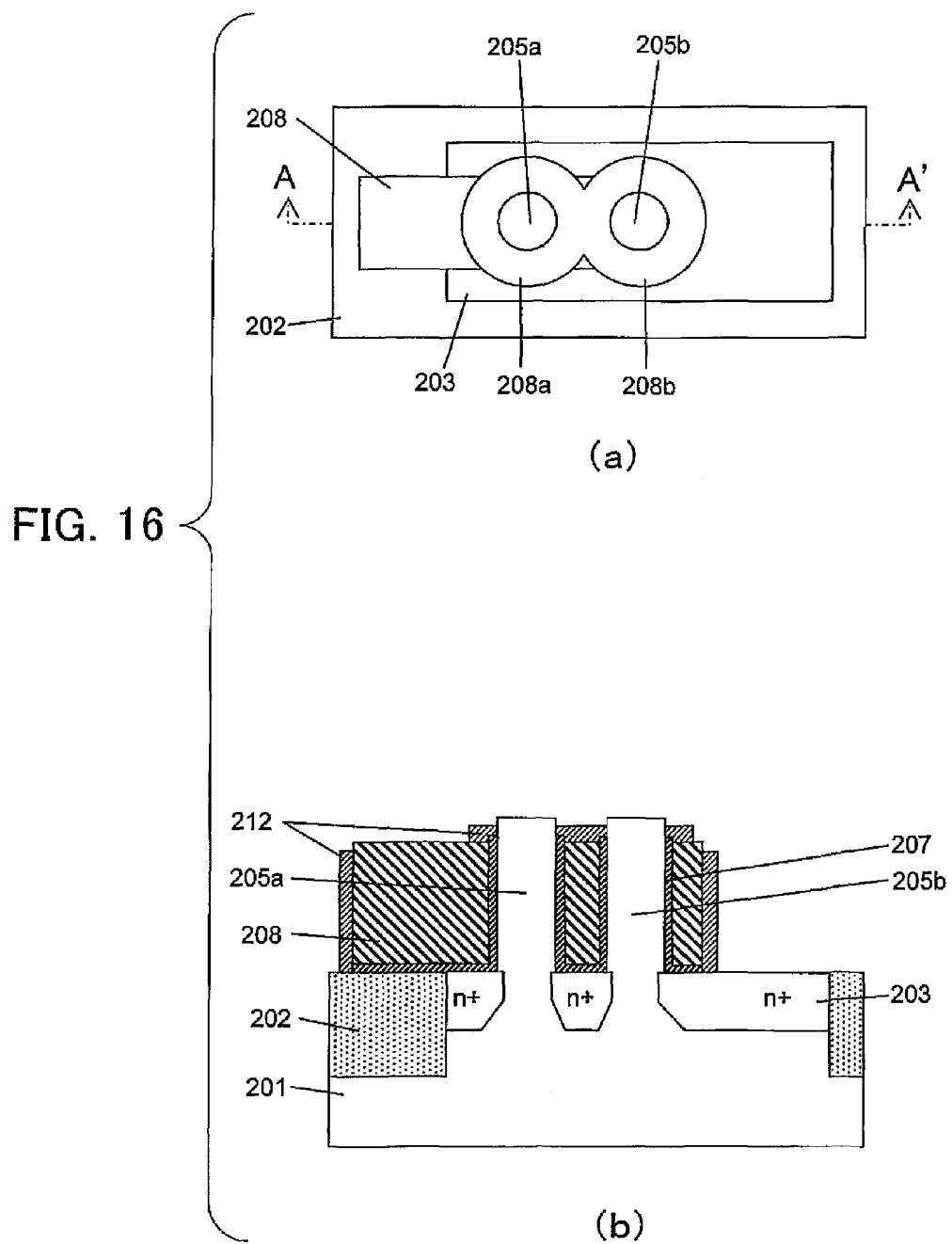
FIGS. 16(a) and 16(b) are process diagrams showing the example of the production method for the transistor illustrated in FIGS. 2(a) and 2(b), in order of process sequence.
Figure 17:
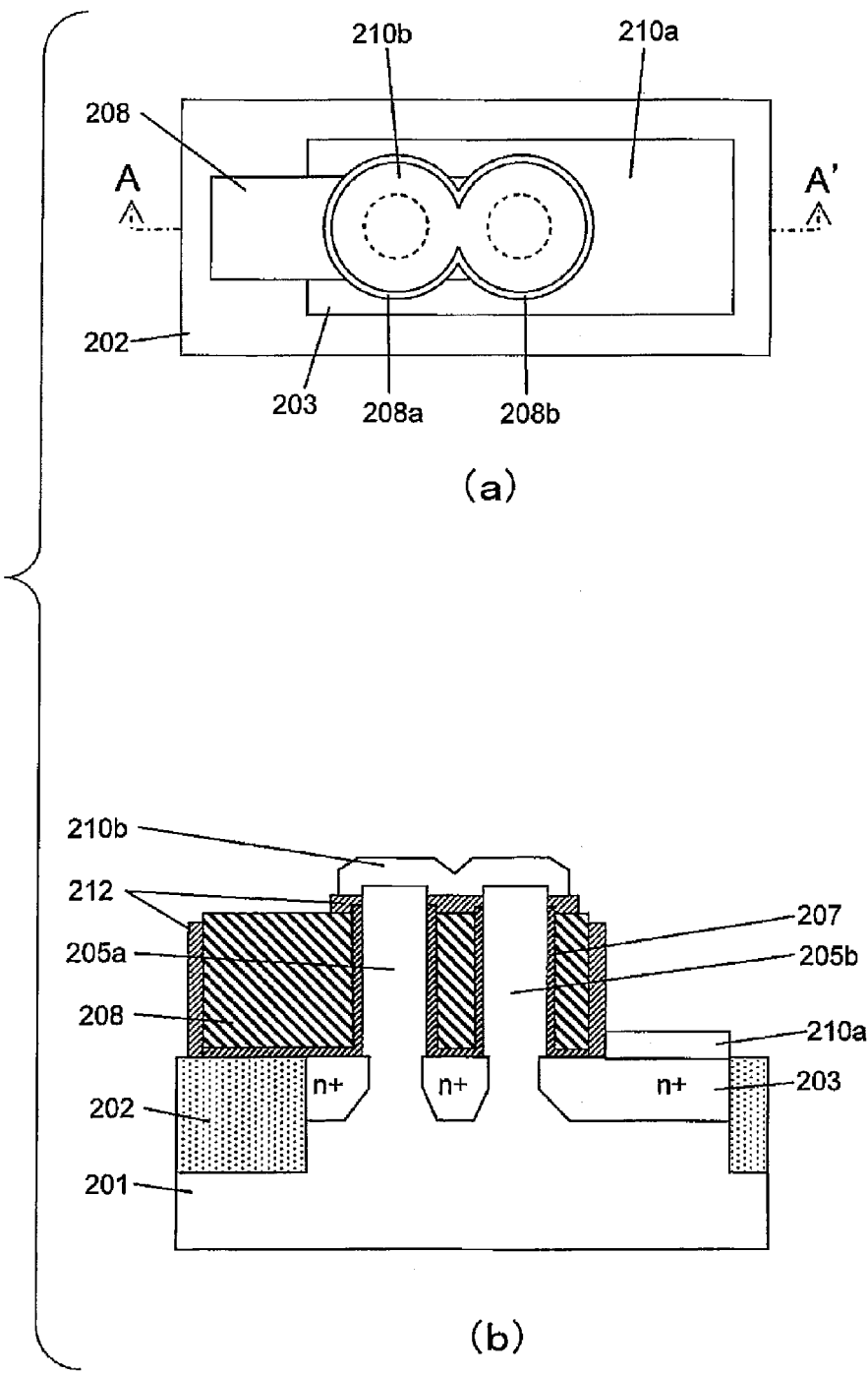
FIGS. 17(a) and 17(b) are process diagrams showing the example of the production method for the transistor illustrated in FIGS. 2(a) and 2(b), in order of process sequence.
Figure 18:
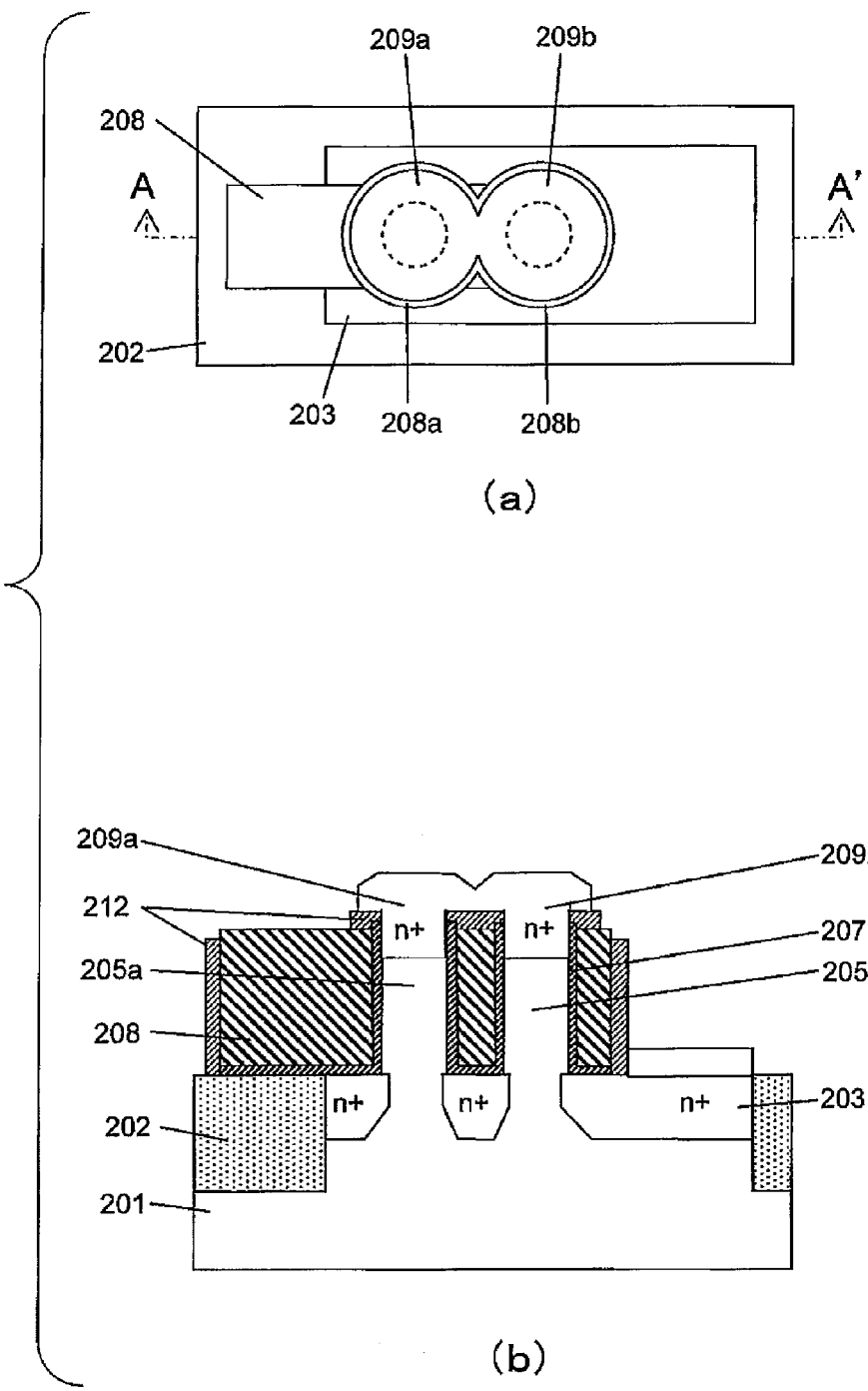
FIGS. 18(a) and 18(b) are process diagrams showing the example of the production method for the transistor illustrated in FIGS. 2(a) and 2(b), in order of process sequence.
Figure 19:
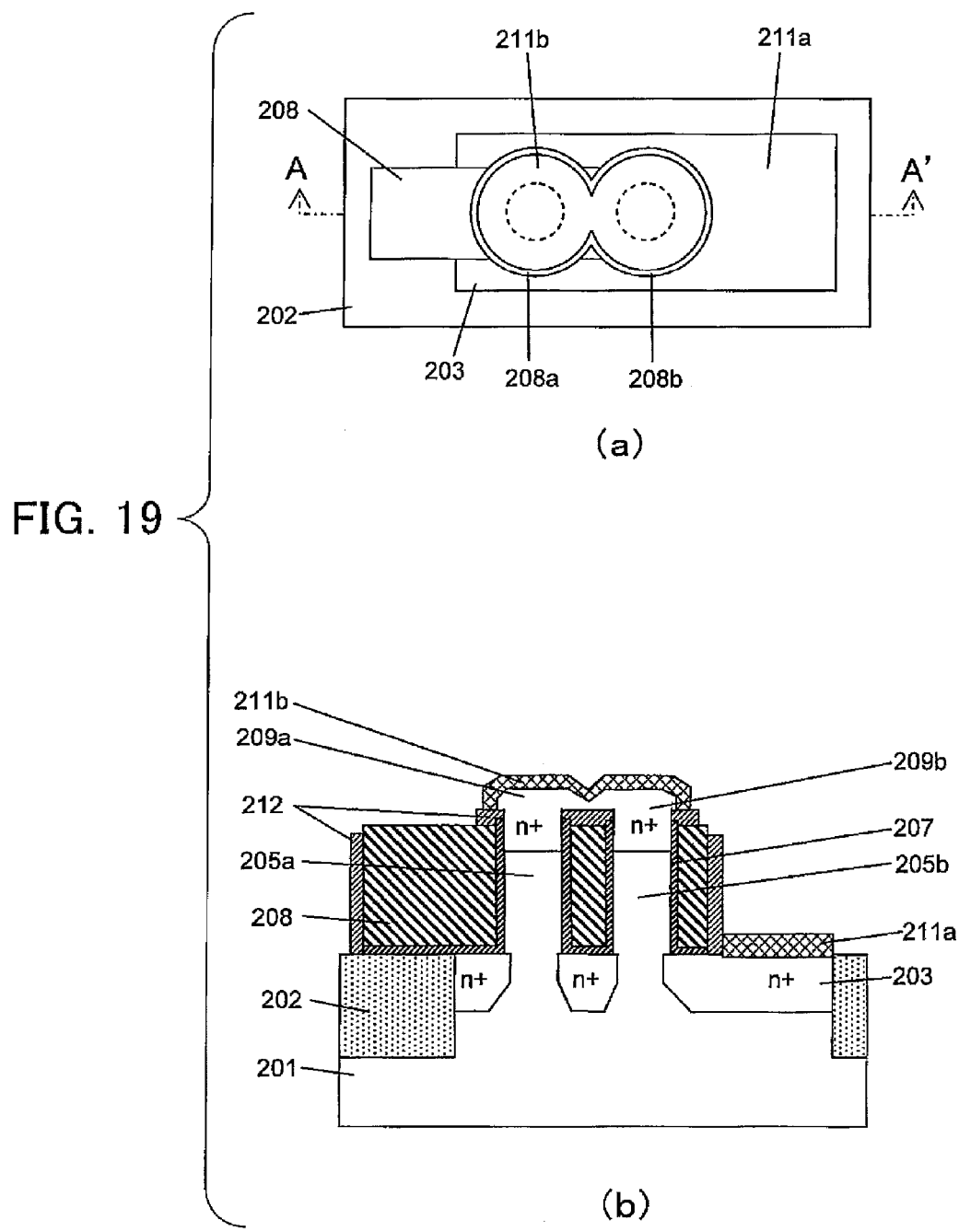
FIGS. 19(a) and 19(b) are process diagrams showing the example of the production method for the transistor illustrated in FIGS. 2(a) and 2(b), in order of process sequence.
Figure 20:
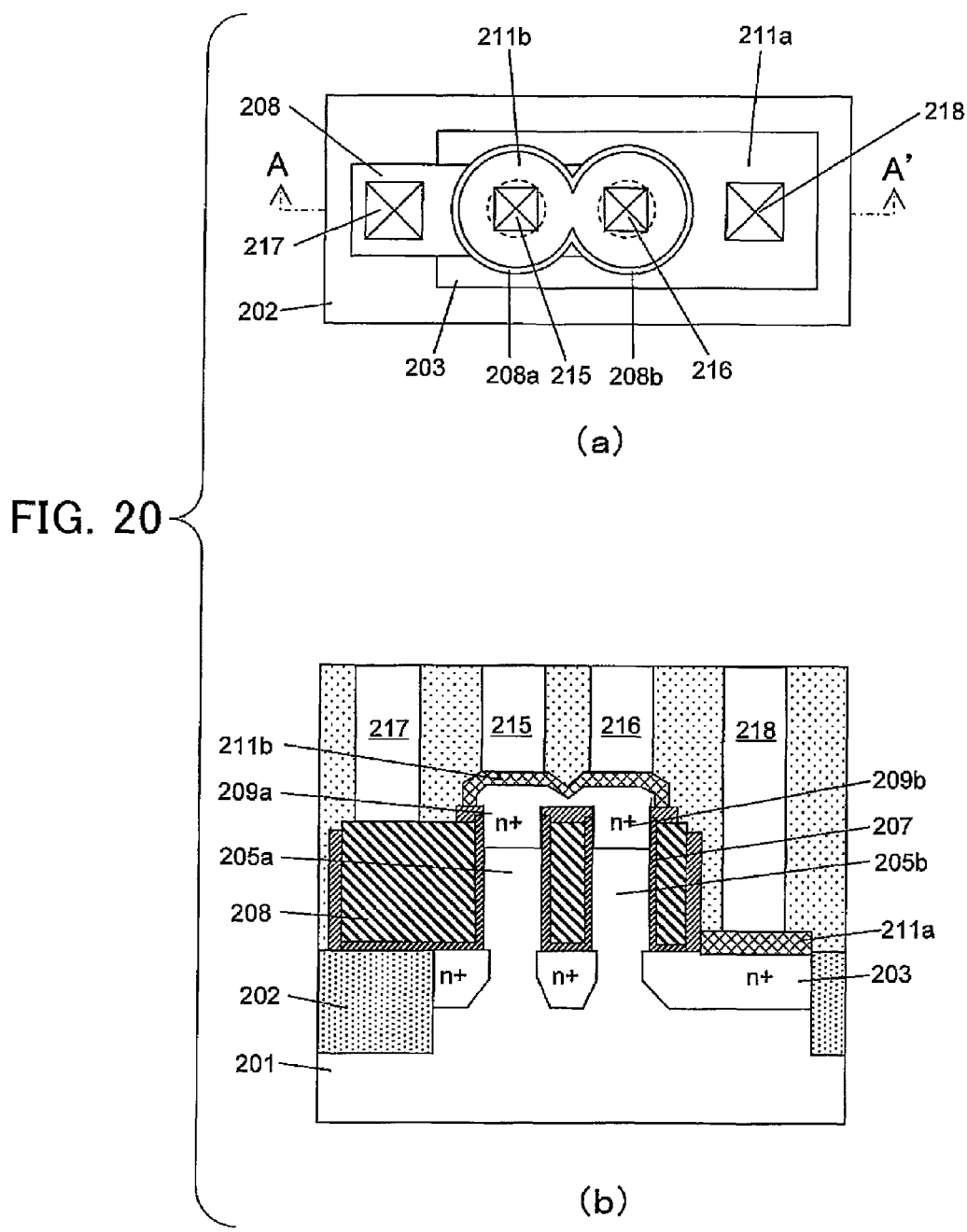
FIGS. 20(a) and 20(b) are process diagrams showing the example of the production method for the transistor illustrated in FIGS. 2(a) and 2(b), in order of process sequence.
Figure 28:
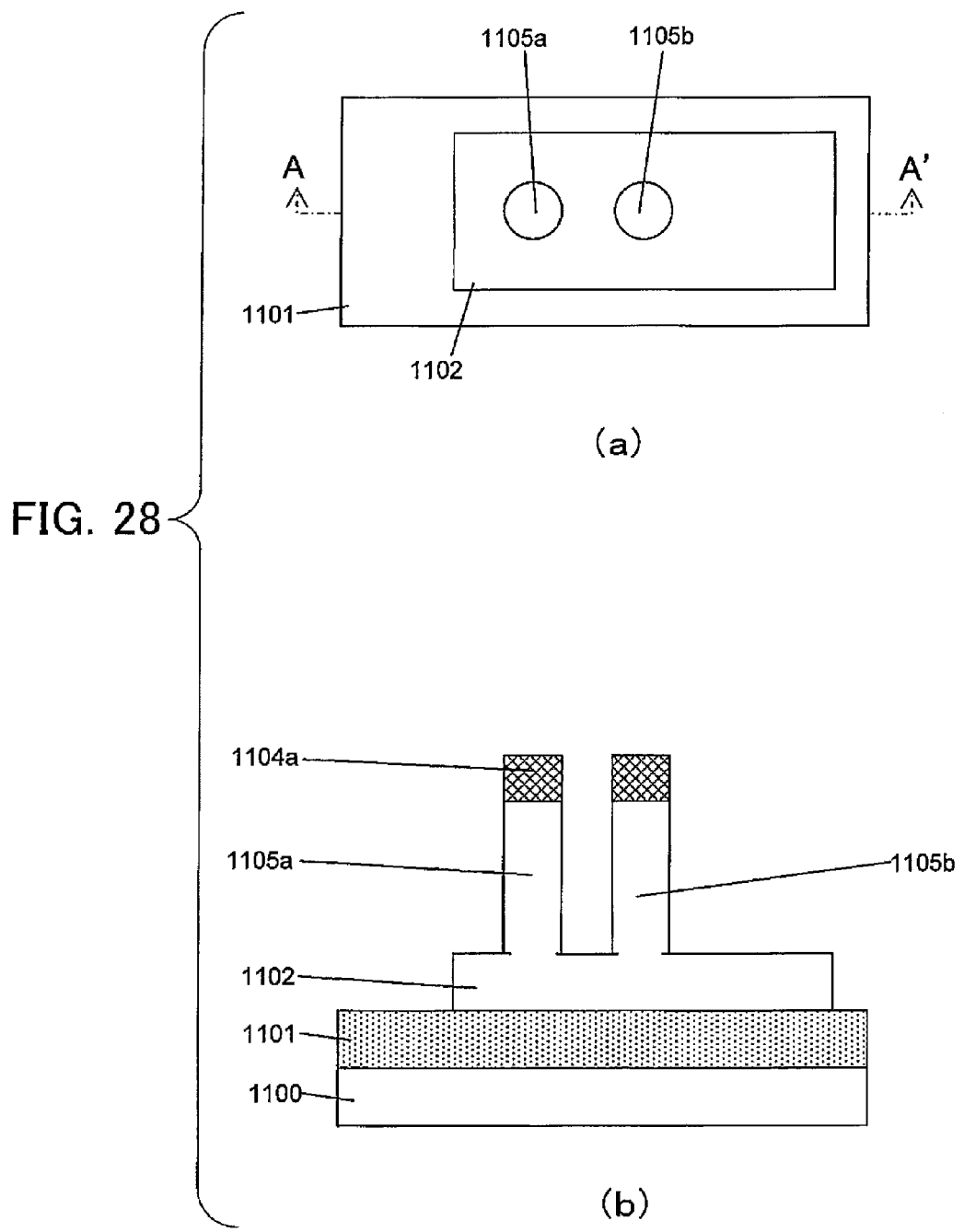
FIGS. 28(a) and 28(b) are process diagrams showing the example of the production method for the SOI transistor illustrated in FIGS. 26(a) and 26(b), in order of process sequence.
Figure 29:
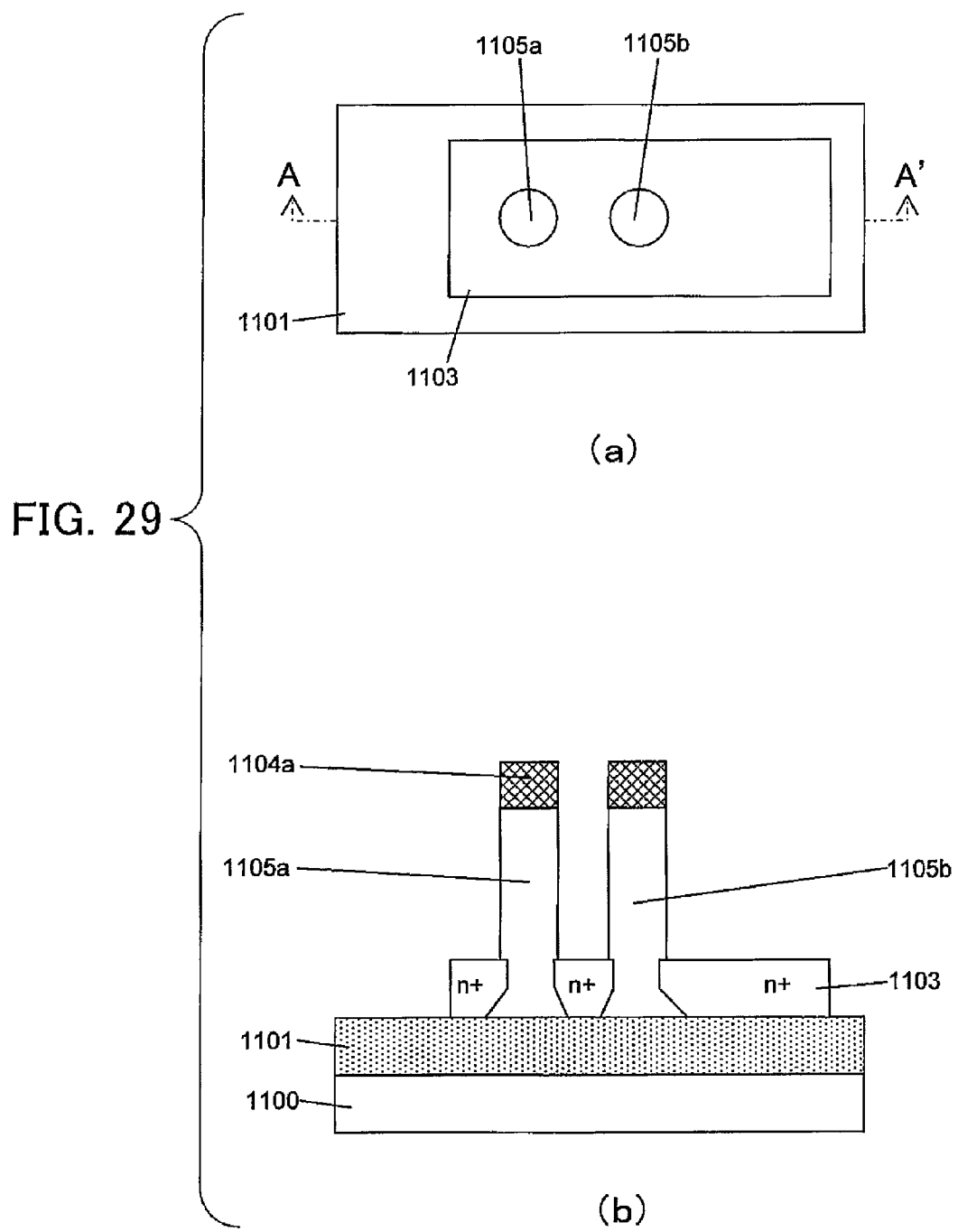
FIGS. 29(a) and 29(b) are process diagrams showing the example of the production method for the SOI transistor illustrated in FIGS. 26(a) and 26(b), in order of process sequence.
Figure 30:
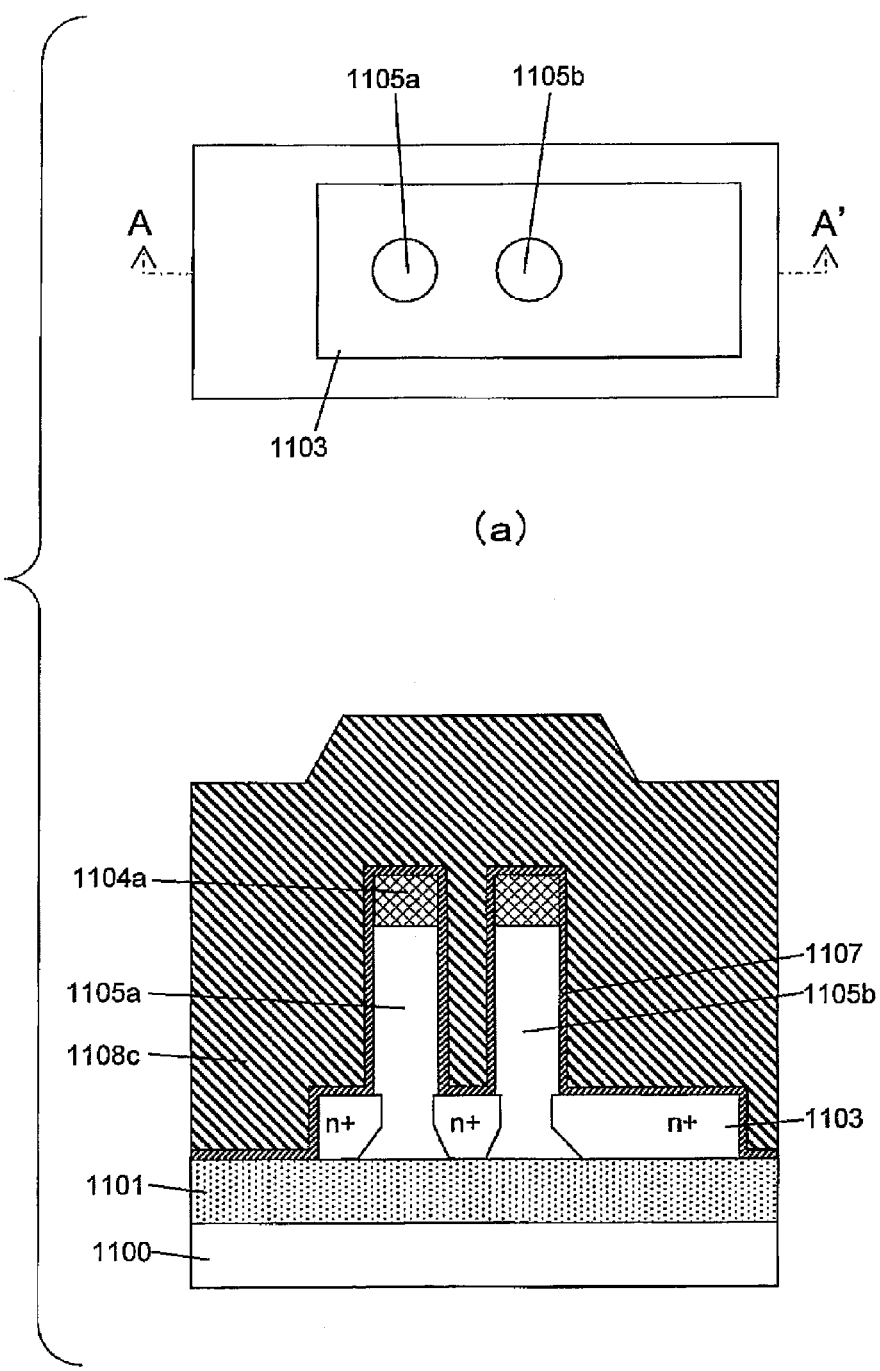
FIGS. 30(a) and 30(b) are process diagrams showing the example of the production method for the SOI transistor illustrated in FIGS. 26(a) and 26(b), in order of process sequence.
Figure 31:
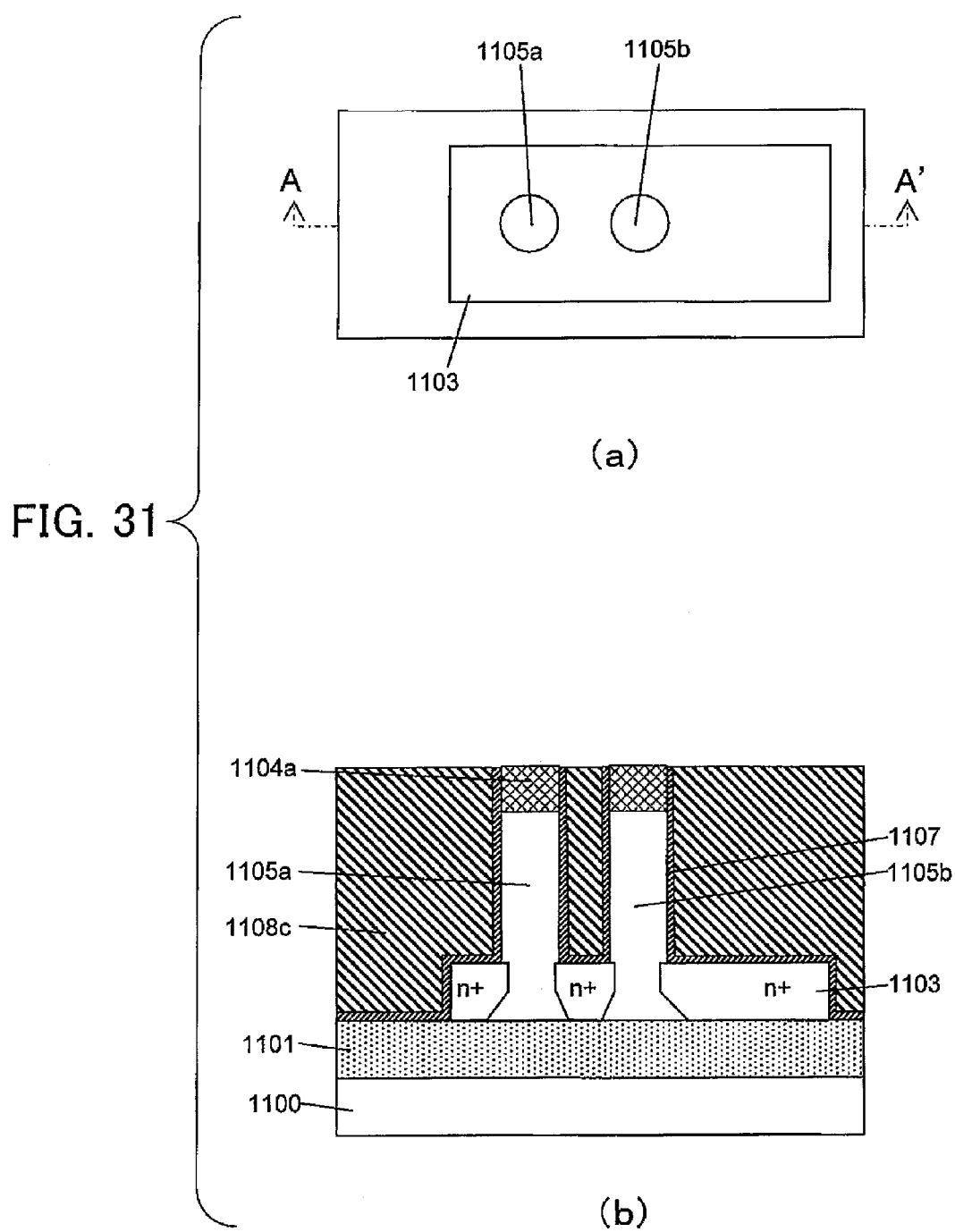
FIGS. 31(a) and 31(b) are process diagrams showing the example of the production method for the SOI transistor illustrated in FIGS. 26(a) and 26(b), in order of process sequence.
Figure 32:
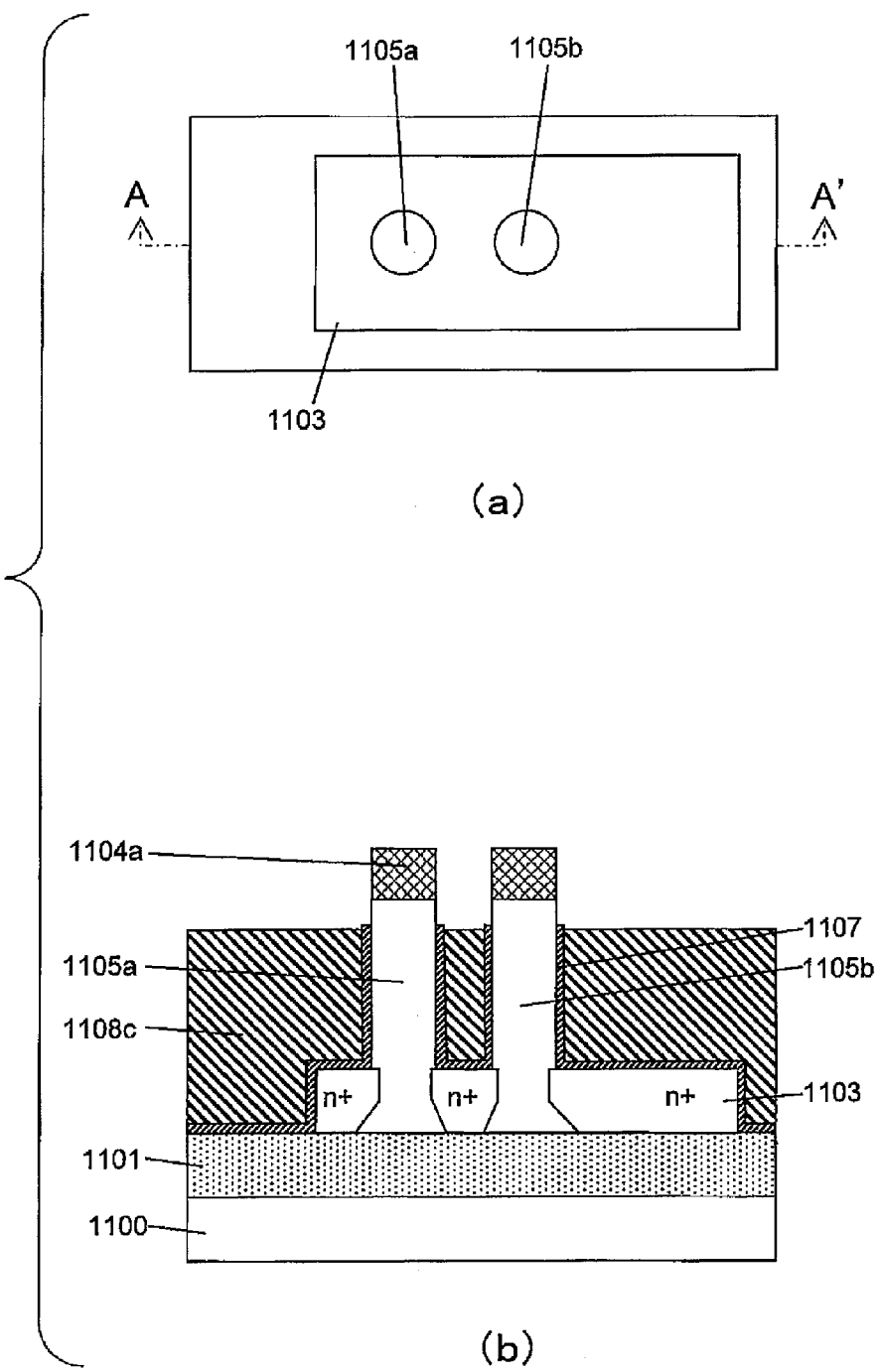
FIGS. 32(a) and 32(b) are process diagrams showing the example of the production method for the SOI transistor illustrated in FIGS. 26(a) and 26(b), in order of process sequence.
Figure 33:
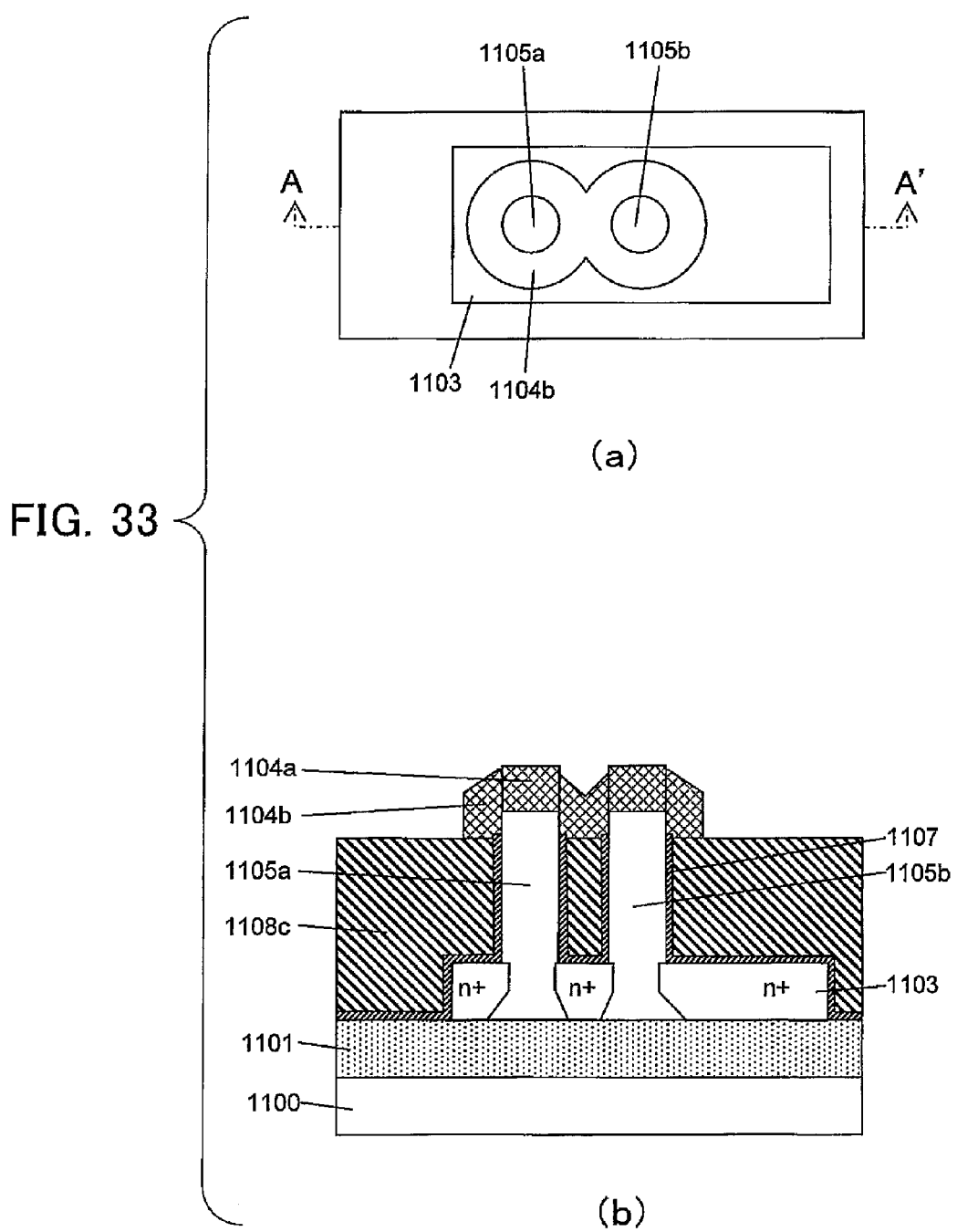
FIGS. 33(a) and 33(b) are process diagrams showing the example of the production method for the SOI transistor illustrated in FIGS. 26(a) and 26(b), in order of process sequence.
Figure 34:
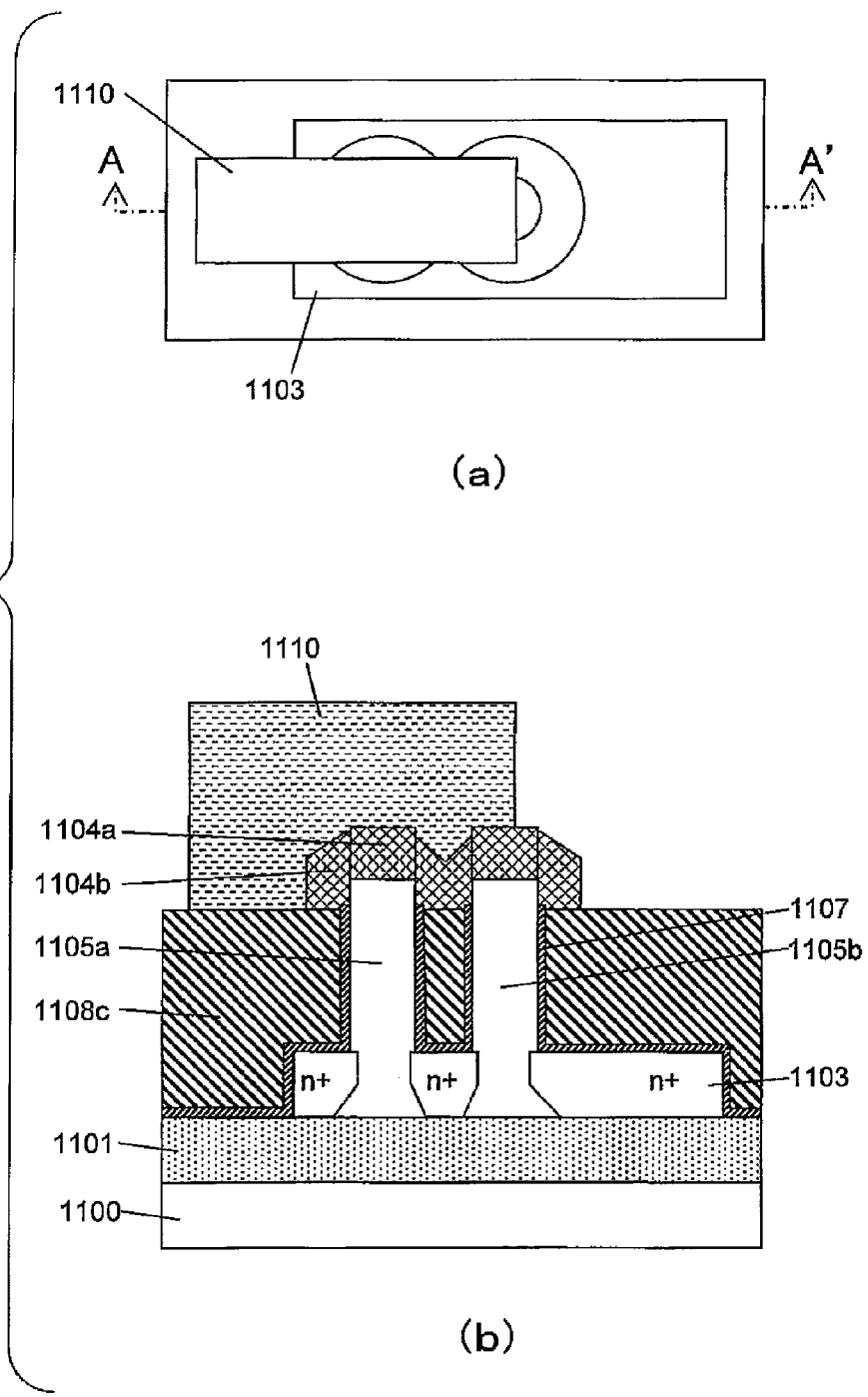
FIGS. 34(a) and 34(b) are process diagrams showing the example of the production method for the SOI transistor illustrated in FIGS. 26(a) and 26(b), in order of process sequence.
Figure 35:
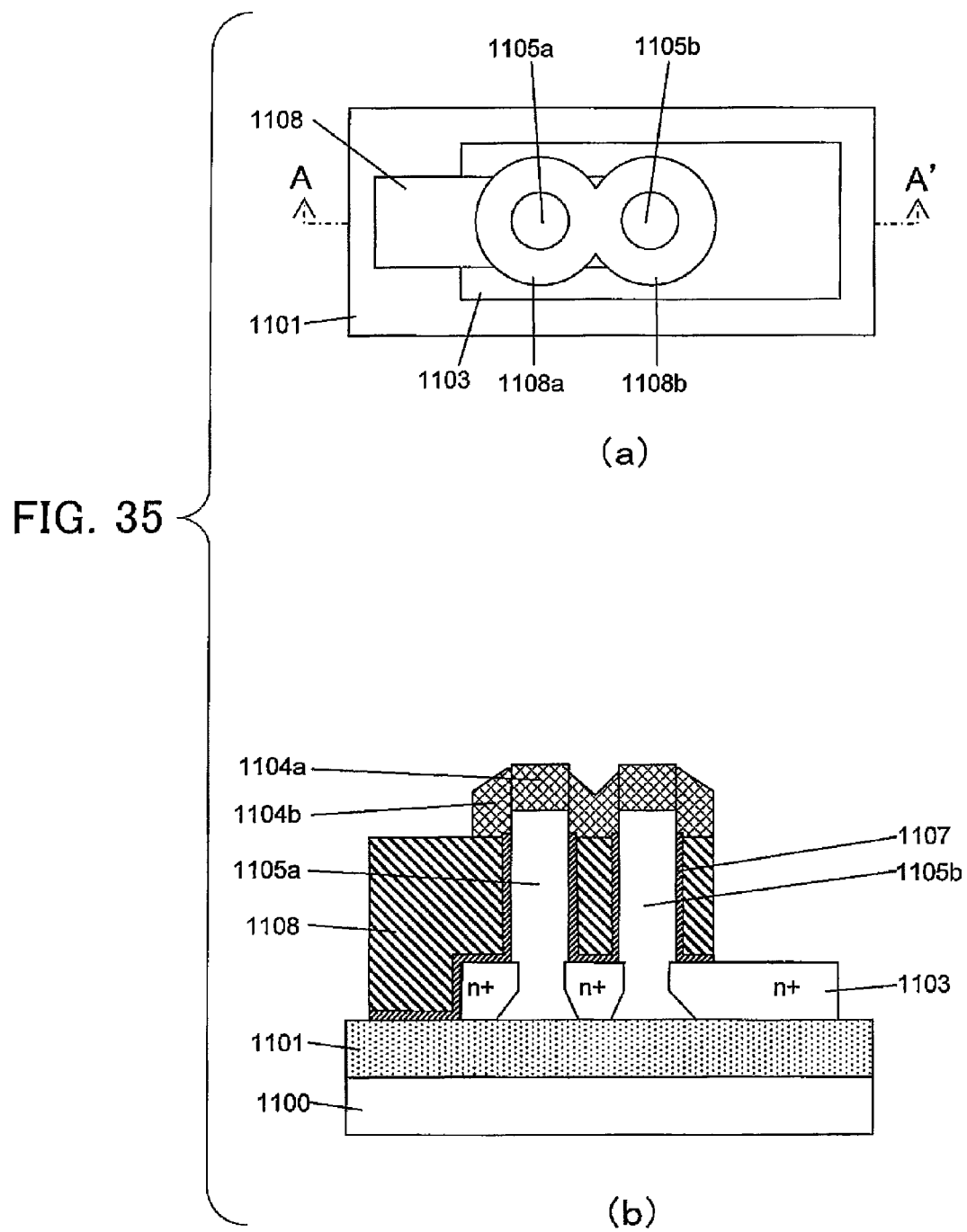
FIGS. 35(a) and 35(b) are process diagrams showing the example of the production method for the SOI transistor illustrated in FIGS. 26(a) and 26(b), in order of process sequence.
Figure 36:
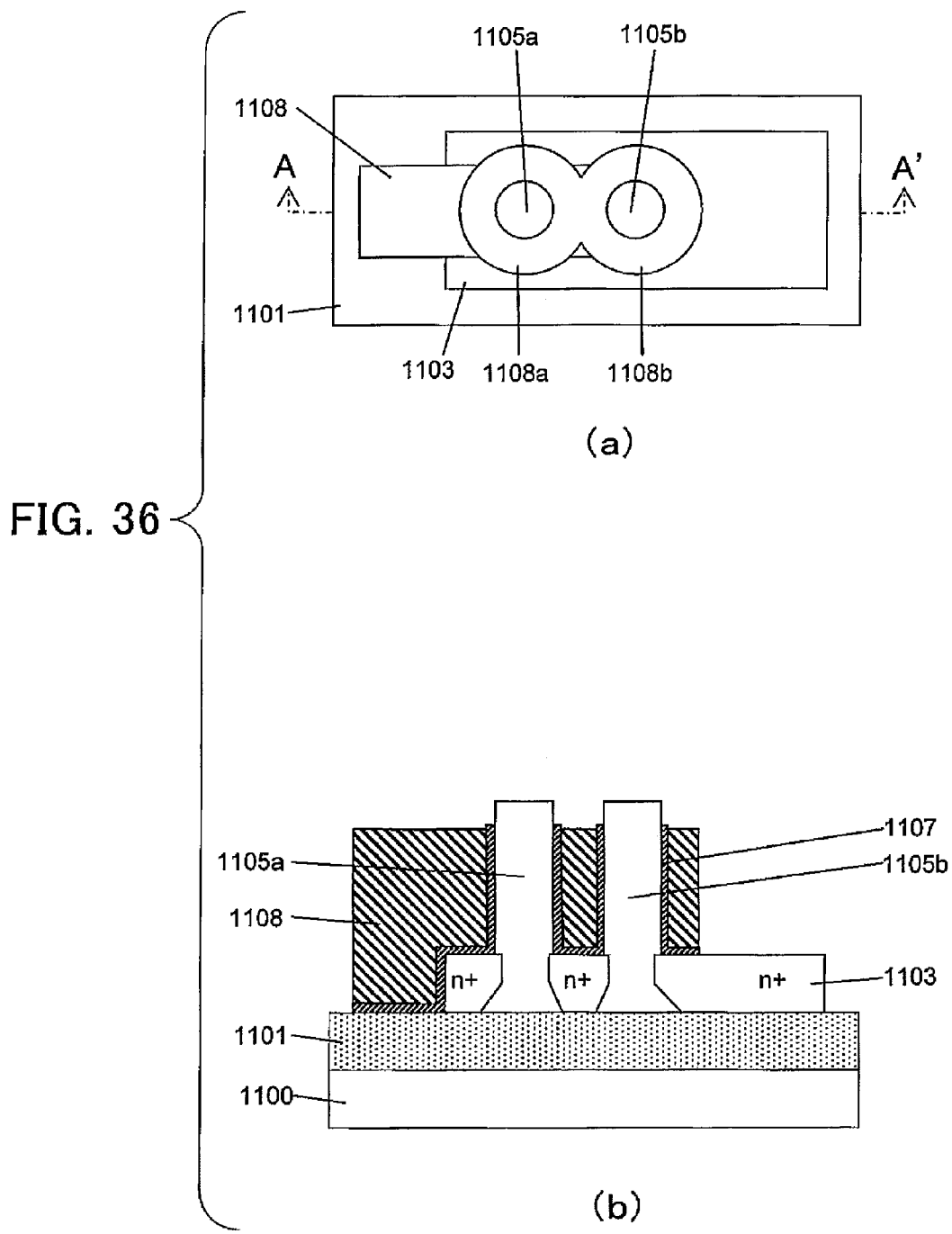
FIGS. 36(a) and 36(b) are process diagrams showing the example of the production method for the SOI transistor illustrated in FIGS. 26(a) and 26(b), in order of process sequence.
Figure 37:
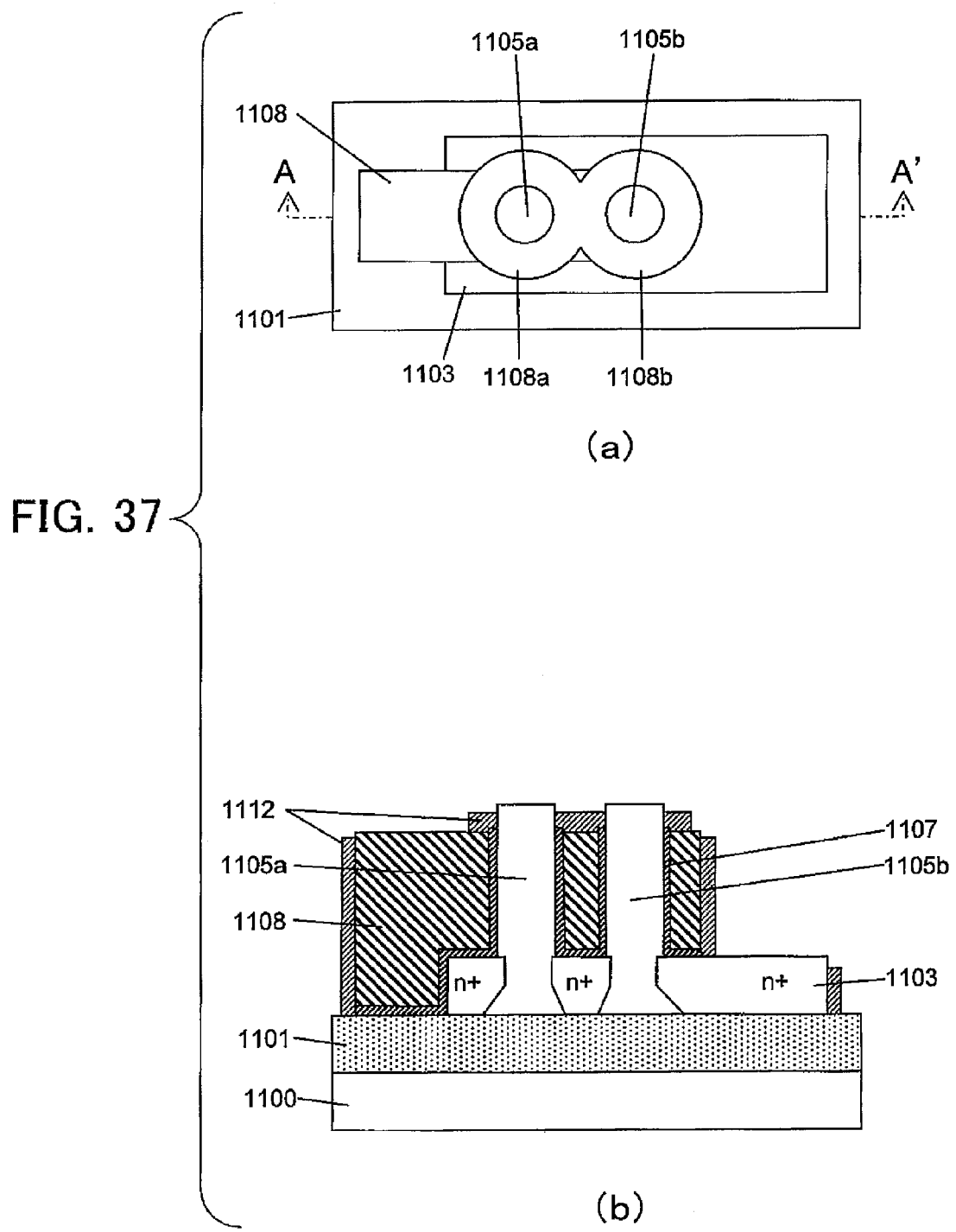
FIGS. 37(a) and 37(b) are process diagrams showing the example of the production method for the SOI transistor illustrated in FIGS. 26(a) and 26(b), in order of process sequence.
Figure 38:
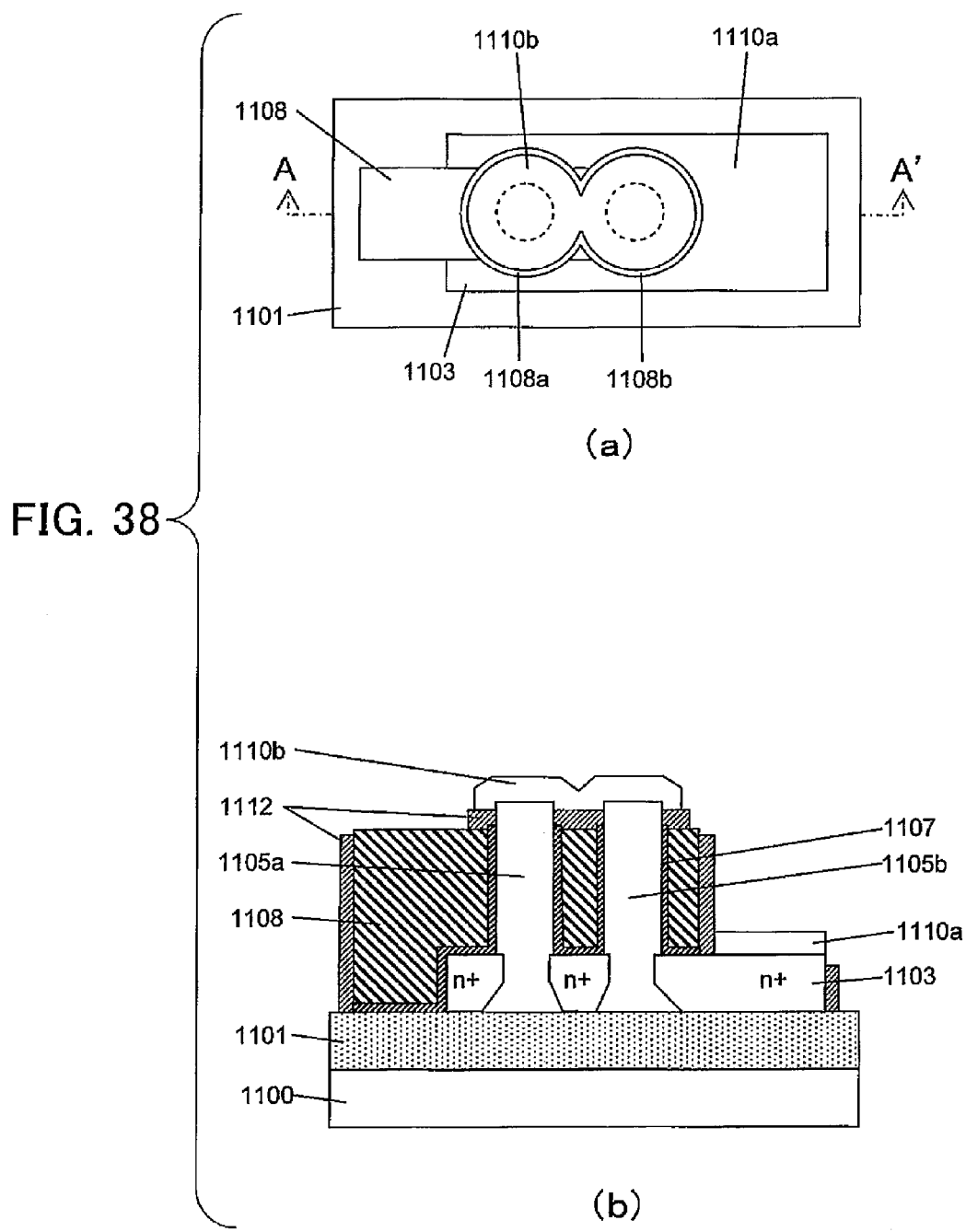
FIGS. 38(a) and 38(b) are process diagrams showing the example of the production method for the SOI transistor illustrated in FIGS. 26(a) and 26(b), in order of process sequence.
Figure 39:
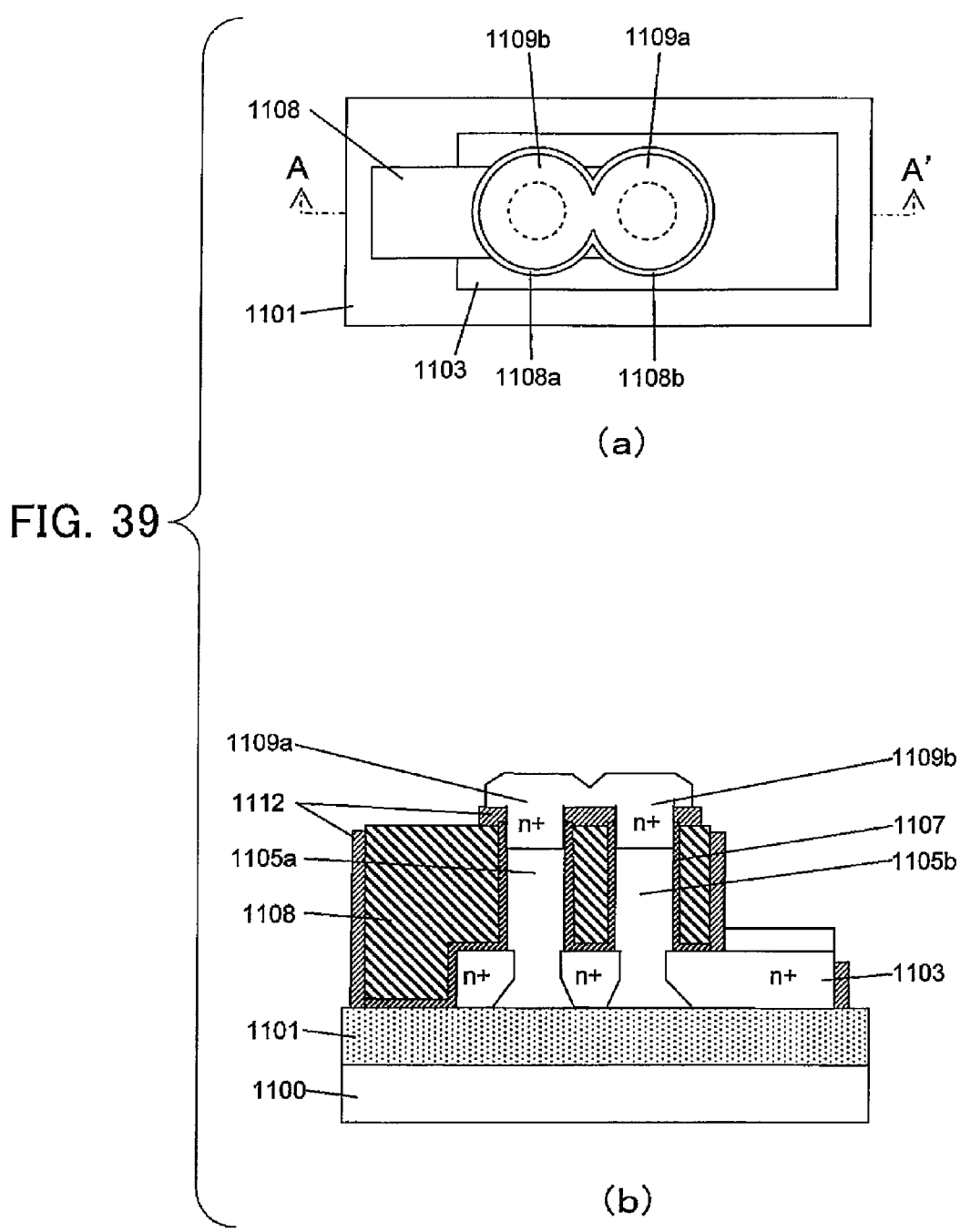
FIGS. 39(a) and 39(b) are process diagrams showing the example of the production method for the SOI transistor illustrated in FIGS. 26(a) and 26(b), in order of process sequence.
Figure 40:
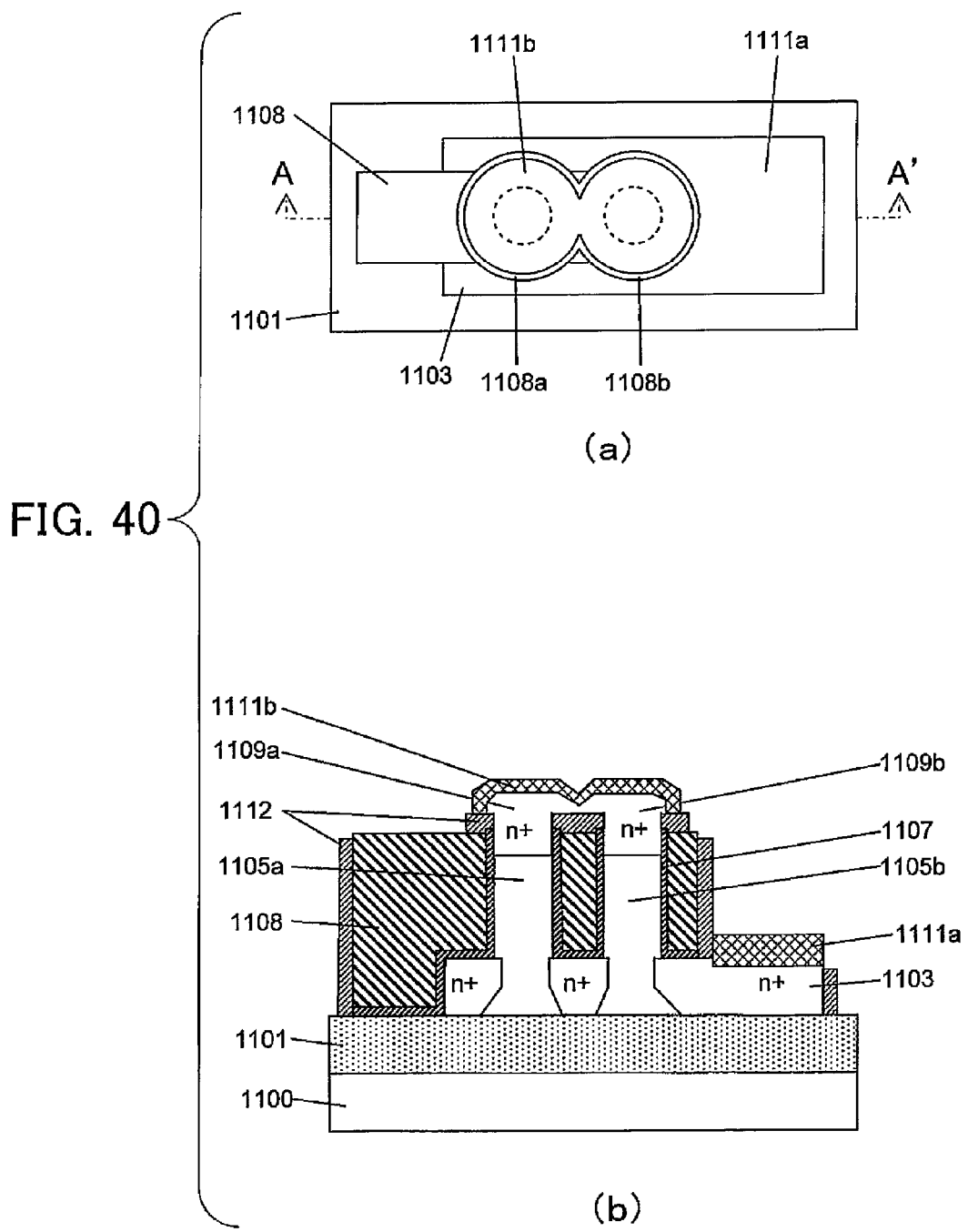
FIGS. 40(a) and 40(b) are process diagrams showing the example of the production method for the SOI transistor illustrated in FIGS. 26(a) and 26(b), in order of process sequence.
Figure 41:
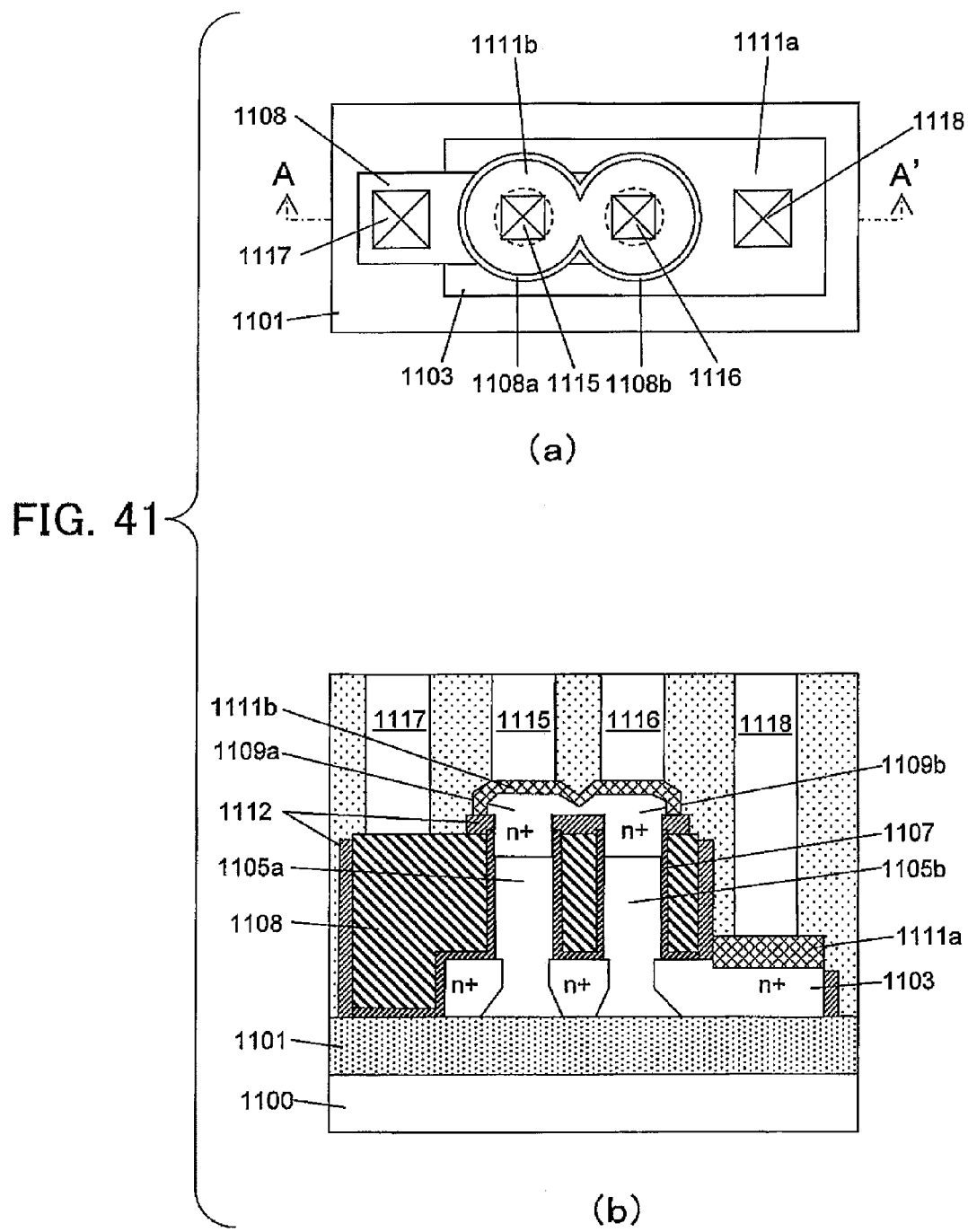
FIGS. 41(a) and 41(b) are process diagrams showing the example of the production method for the SOI transistor illustrated in FIGS. 26(a) and 26(b), in order of process sequence.
Figure 48:
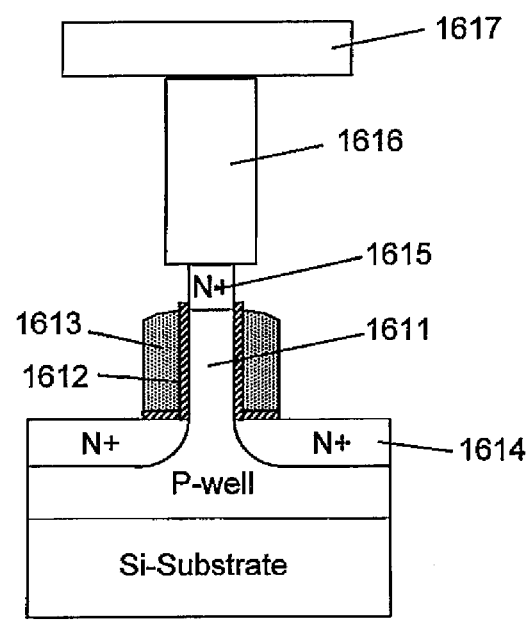
FIG. 48 shows a structure of an SGT comprising a pillar-shaped semiconductor layer having a small size.

Further, as shown in FIGS. 5(a) and 5(b), a contact 515 having an area greater than that of other contact (517, 518) in cross-section parallel to a principal surface of a substrate may be formed on an upper side of a plurality of pillar-shaped silicon layers (pillar-shaped semiconductor layers), in a number less than the number of the pillar-shaped semiconductor layers. This makes it possible to reduce a resistance of a contact, and stably form a contact.

With reference to FIGS. 6(a) to 20(b), one example of a production method for the transistor illustrated in FIGS. 2(a) and 2(b) will be described below. In FIGS. 6(a) and 6(b) to FIGS. 20(a) and 20(b), the figure suffixed with (a) is a top plan view, and the figure suffixed with (b) is a sectional view taken along the line A-A' in the figure suffixed with (a).

As shown in FIGS. 6(a) and 6(b), two pillar-shaped silicon layers (pillar-shaped semiconductor layers) 205a, 205b each having a hard mask layer 204a, such as a silicon nitride film, on top thereof, are formed on a substrate 201 by lithography and etching.

As shown in FIGS. 7(a) and 7(b), an element isolation 202 is formed in the substrate. The element isolation is formed by etching the substrate to form a trench pattern, filling an oxide film in the trench pattern through chemical vapor deposition (CVD) or silica coating or the like, and removing an excess part of the oxide film on the substrate through dry etching or wet etching.

As shown in FIGS. 8(a) and 8(b), after formation of the element isolation 202, a lower $N^+$ diffusion layer 203 is formed underneath the pillar-shaped silicon layers (pillar-shaped semiconductor layers) by ion implantation or the like. In this step, the pillar-shaped silicon layer (pillar-shaped semiconductor layer) (205a, 205b) is kept from impurity implantation by the hard mask layer 204a on top of the pillar-shaped silicon layer (pillar-shaped semiconductor layer).

As shown in FIGS. 9(a) and 9(b), a gate dielectric film (first dielectric film) 207 and a gate conductive film 208c are formed. The gate dielectric film (first dielectric film) 207 is formed of an oxide film, a High-k film or the like. The gate conductive film 208c is formed of a polysilicon film, a metal film or the like.

As shown in FIGS. 10(a) and 10(b), the gate conductive film 208c is flattened by chemical mechanical polishing (CMP) or the like.

As shown in FIGS. 11(a) and 11(b), the gate dielectric film (first dielectric film) 207 and the gate conductive film 208c are etched back to allow a height dimension of each of the gate dielectric film (first dielectric film) 207 and the gate conductive film 208c along a sidewall of the pillar-shaped silicon layer (pillar-shaped semiconductor layer) (205a, 205b) to be set to a desired gate length.

As shown in FIGS. 12(a) and 12(b), a nitride film or the like is formed and then etched back to form a sidewall spacer 204b.

As shown in FIGS. 13(a) and 13(b), a gate line pattern is formed using a resist 210 by lithography or the like.

As shown in FIGS. 14(a) and 14(b), the gate conductive film 208c and the gate dielectric film (first dielectric film) 207 are selectively etched by anisotropic etching or the like, using the resist 210 as a mask, to integrally form a gate electrode (208a, 208b) around the pillar-shaped silicon layer (pillar-shaped semiconductor layer) (205a, 205b) and a gate line 208 extending from the gate electrode (208a, 208b). Subsequently, the resist 210 is removed.

As shown in FIGS. 15(a) and 15(b), the hard mask layer 204a and the sidewall spacer 204b are removed by wet etching or the like.

As shown in FIGS. 16(a) and 16(b), a dielectric film, such as a nitride film or a laminated film comprised of a nitride film and an oxide film, is formed, and then etched back to form a second dielectric film 212.

As shown in FIGS. 17(a) and 17(b), silicon or the like is selectively epitaxially grown on top of an upper surface of each of the pillar-shaped silicon layer (pillar-shaped semiconductor layer) and on the lower $N^+$ diffusion layer 203 to form an upper epitaxial silicon layer (semiconductor epitaxial layer) 210b and a lower epitaxial silicon layer, in such a manner that epitaxial layers formed on tops of respective upper surfaces of the pillar-shaped silicon layers (pillar-shaped semiconductor layers) arranged adjacent to each other with a given distance or less therebetween are self-alignedly connected together. The upper epitaxial silicon layer (semiconductor epitaxial layer) may be formed to have a diameter greater than that of a contact to be formed on an upper side of the pillar-shaped silicon layer (pillar-shaped semiconductor layer) in a subsequent step. This makes it possible to provide a structure free of a short-circuiting between the contact and the gate electrode.

As shown in FIGS. 18(a) and 18(b), an upper $N^+$ diffusion layer (second drain/source diffusion region) (209a, 209b) is formed in the upper epitaxial silicon layer (semiconductor epitaxial layer) 210b and an upper portion of the pillar-shaped silicon layer (pillar-shaped semiconductor layer) (205a, 205b) by ion implantation or the like. Alternatively, a region to be formed as the upper N+ diffusion layer (second drain/source diffusion region) may be a part or an entirety of the upper epitaxial silicon layer (semiconductor epitaxial layer) 210b.

As shown in FIGS. 19(a) and 19(b), a metal, such as Co or Ni, is sputtered, and then a heat treatment is performed to selectively silicide respective upper surfaces of the lower epitaxial silicon layer on the lower N+ diffusion layer (first drain/source diffusion region) 203 and the integral set of upper N+ diffusion layers (second drain/source diffusion regions) to form a lower silicide layer 211a and an upper silicide layer 211b. The upper silicide layer 211b is formed to have a size greater than that of the pillar-shaped silicon layer (pillar-shaped semiconductor layer), so that the narrow width effect on the upper silicide layer can be suppressed. Further, the entire surface of the epitaxial silicon layer (semiconductor epitaxial layer) may be silicided. In this case, an interface area between the upper silicide layer 211b and the integral set of upper N+ diffusion layers (second drain/source diffusion regions) 209a, 209b is increased, so that an interface resistance therebetween can be reduced to reduce a source/drain parasitic resistance.

As shown in FIGS. 20(a) and 20(b), a silicon oxide film is formed to serve as an interlayer film, and then a contact (215 to 218) is formed. The epitaxial silicon layer (semiconductor epitaxial layer) is formed to allow the contact (215, 216) on an upper side of the pillar-shaped silicon layer (pillar-shaped semiconductor layer) to be entirely formed on the upper silicide layer 211b, as shown in FIGS. 20(a) and 20(b). This makes it possible to provide a structure free of a short-circuiting between the contact and the gate electrode.

The first embodiment shows one example where an epitaxial silicon layer (semiconductor epitaxial layer) is formed. Specifically, an epitaxial silicon carbide (SiC) layer may be formed for an NMOS transistor, and an epitaxial silicon germanium (SiGe) layer may be formed for a PMOS transistor. In this case, a stress can be applied to a channel region to enhance carrier mobility.

Second Embodiment

A second embodiment shows one example where the present invention is applied to a transistor formed by connecting in series two transistors. FIG. 21(a) is a top plan view showing a transistor according to the second embodiment, and FIG. 21(b) is a sectional view taken along the line A-A' in FIG. 21(a). With reference to FIGS. 21(a) and 21(b), a structure of the transistor according to the second embodiment will be described below. A silicon substrate 601 is isolated on an element-by-element basis by an element isolation 602. Two pillar-shaped silicon layers (pillar-shaped semiconductor layers) 605a, 605b constituting a first transistor, and two pillar-shaped silicon layers (pillar-shaped semiconductor layers) 605c, 605d constituting a second transistor, are formed on the silicon substrate. A gate dielectric film (first dielectric film) 607 and a gate electrode (609a to 609d) are formed around each of the pillar-shaped silicon layers (pillar-shaped semiconductor layers). In the second embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower N+ diffusion layer (first drain/source diffusion region, i.e., one of drain and source diffusion regions) 603 is formed underneath the pillar-shaped silicon layers (pillar-shaped semiconductor layers), and a lower silicide layer 611a is formed on a surface of the lower N+ diffusion layer (first drain/source diffusion region) 603, to reduce a parasitic resistance. An upper N+ diffusion layer (second drain/source diffusion region, i.e., a remaining one of the drain and source diffusion regions) (609a to 609d) is formed on top of each of the pillar-shaped silicon layers (pillar-shaped semiconductor layers), in such a manner that an area of an upper surface thereof becomes greater than that of an upper surface of the pillar-shaped silicon layer. In the second embodiment, the upper N+ diffusion layer (second drain/source diffusion region) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper N+ diffusion layer (second drain/source diffusion region) may be formed only in a part or an entirety of the semiconductor epitaxial layer. The semiconductor epitaxial layer is electrically isolated from the gate electrode (608a to 608d) by a second dielectric film 612, such as a silicon nitride film or a laminated film comprised of a silicon nitride film and a silicon oxide film, interposed therebetween. The two pillar-shaped silicon layers (pillar-shaped semiconductor layers) 605a, 605b constituting the first transistor are arranged adjacent to each other, so that epitaxial silicon layers (semiconductor epitaxial layers) to be formed on tops of respective upper surfaces of the adjacent pillar-shaped silicon layers (pillar-shaped semiconductor layers) are self-alignedly connected together. The two pillar-shaped silicon layers (pillar-shaped semiconductor layers) 605c, 605d constituting the second transistor are also arranged adjacent to each other, so that epitaxial silicon layers (semiconductor epitaxial layers) to be formed on tops of respective upper surfaces of the adjacent pillar-shaped silicon layers (pillar-shaped semiconductor layers) are self-alignedly connected together in the same manner. In contrast, the two pillar-shaped silicon layers (pillar-shaped semiconductor layers) 605b, 605c each constituting a different transistor are arranged with a distance greater than a given value therebetween, so that epitaxial silicon layers (semiconductor epitaxial layers) to be formed thereon are separated from each other.

Two upper silicide layers 611b, 611c are formed, respectively, on the integral set of upper N+ diffusion layers (second drain/source diffusion regions) 609a, 609b and the integral set of upper N+ diffusion layers (second drain/source diffusion regions) 609c, 609d. Each of the upper silicide layers is formed on the connected epitaxial silicon layers (semiconductor epitaxial layers) each having a diameter greater than that of the pillar-shaped silicon layer (pillar-shaped semiconductor layer). Thus, the narrow width effect on the upper silicide layer can be reduced. In addition, an interface area between the upper silicide layer and the integral set of upper N+ diffusion layers (609a, 609b; 609c, 609d) can be set largely, so that an interface resistance between the upper silicide layer and the integral set of upper N+ diffusion layers can be reduced. Further, the upper silicide layer (611b, 611c) may be formed in an upper surface of the integral set of the upper N+ diffusion layers (second drain/source diffusion regions) to have a diameter greater than a total diameter of two contacts (615a, 615b; 616a, 616b) to be formed on an upper side of the adjacent pillar-shaped silicon layers (pillar-shaped semiconductor layers). This makes it possible to prevent a short-circuiting between the contact and the gate electrode even if the contact undergoes overetching during etching for contacts. The two contacts 615a, 615b formed on the upper side of the pillar-shaped silicon layers (pillar-shaped semiconductor layers) constituting the first transistor are connected to one of drain and source terminals through an interconnection layer 620a, and the two contacts 616a, 616b formed on the upper side of the pillar-shaped silicon layers (pillar-shaped semiconductor layers) constituting the second transistor are connected to a remaining one of the drain and source terminals through an interconnection layer 620b. Further, the first transistor and the second transistor are connected in series through the lower N$^+$ diffusion layer (first drain/source diffusion region) 603. A contact 617 formed on a gate line 608 extending from the gate electrode is connected to a gate terminal through an interconnection layer 621.

As shown in FIGS. 22(a) and 22(b), as to a contact for a plurality of pillar-shaped semiconductor layers, an upper side of the pillar-shaped semiconductor layers may be connected to an interconnection layer via a less number of contacts than the number of the pillar-shaped semiconductor layers.

For example, as shown in FIGS. 22(a) and 22(b), a contact (715, 716) may be formed on an integral set of upper N$^+$ diffusion layers (second drain/source diffusion regions) 409a, 409b at a position corresponding to a position between adjacent pillar-shaped silicon layers (pillar-shaped semiconductor layers). In this case, an axis of the contact (715, 716) may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between adjacent ones of a plurality of interconnection lines 720a, 720b, 721 so as to facilitate interconnection layout.

Further, in the same manner as that in FIGS. 5(a) and 5(b), a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers. This makes it possible to reduce a resistance of a contact, and stably form a contact.

Third Embodiment

A third embodiment shows one example where the present invention is applied to a CMOS inverter. FIG. 23(a) is a top plan view showing a CMOS inverter according to the third embodiment, and FIG. 23(b) is a sectional view taken along the line A-A' in FIG. 23(a). In FIGS. 23(a) and 23(b), an interconnection layer 820a connected to an NMOS transistor is connected to GND, and an interconnection layer 820b connected to a PMOS transistor is connected to Vcc. An input signal Vin is input into a gate interconnection layer 808 from an interconnection layer 822, and two interconnection lines 821a, 821b connected from respective upper sides of the NMOS and PMOS transistors are connected to each other through an interconnection layer to output an output signal Vout therefrom. In this manner, a CMOS inverter is formed.

With reference to FIGS. 23(a) and 23(b), a structure of the CMOS inverter according to the third embodiment will be described below. A silicon substrate 801 is isolated on an element-by-element basis by an element isolation 802. Two pillar-shaped silicon layers (pillar-shaped semiconductor layers) 805a constituting an NMOS transistor (NMOS pillar-shaped silicon layers (NMOS pillar-shaped semiconductor layers) 805a), and four pillar-shaped silicon layers (pillar-shaped semiconductor layers) 805b constituting a PMOS transistor (PMOS pillar-shaped silicon layers (PMOS pillar-shaped semiconductor layers) 805b), are formed on the silicon substrate. A gate dielectric film (first dielectric film) 807 and a gate electrode (808a, 808b) are formed around each of the pillar-shaped silicon layers (pillar-shaped semiconductor layers). In the third embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower N$^+$ diffusion layer (first drain/source diffusion region, i.e., one of drain and source diffusion regions) 803a surrounded by a P-well 801a is formed underneath the NMOS pillar-shaped silicon layers (NMOS pillar-shaped semiconductor layers) 805a, and a lower P$^+$ diffusion layer (first drain/source diffusion region) 803b surrounded by an N-well 801b is formed underneath the PMOS pillar-shaped silicon layers (PMOS pillar-shaped semiconductor layers) 805b. A lower silicide layer (811a, 811b) is formed on a surface of each of the lower N$^+$ and P$^+$ diffusion layers (first drain/source diffusion regions) to reduce a parasitic resistance. An upper N$^+$ diffusion layer (second drain/source diffusion region, i.e., a remaining one of the drain and source diffusion regions) 809a is formed on top of each of the NMOS pillar-shaped silicon layers (NMOS pillar-shaped semiconductor layers) 805a in such a manner that an area of an upper surface thereof becomes greater than that of an upper surface of the NMOS pillar-shaped silicon layer. An upper P$^+$ diffusion layer (second drain/source diffusion region) 809b is formed on top of each the PMOS pillar-shaped silicon layers (PMOS pillar-shaped semiconductor layers) 805b in such a manner that an area of an upper surface thereof becomes greater than that of an upper surface of the PMOS pillar-shaped silicon layer. In the third embodiment, the upper diffusion layer having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper diffusion layer may be formed only in a part or an entirety of the semiconductor epitaxial layer. The semiconductor epitaxial layer is electrically isolated from the gate electrode (808a, 808b) by a second dielectric film 812, such as a silicon nitride film or a laminated film comprised of a silicon nitride film and a silicon oxide film, interposed therebetween. The two NMOS pillar-shaped silicon layers (NMOS pillar-shaped semiconductor layers) 805a are arranged adjacent to each other, so that epitaxial silicon layers (semiconductor epitaxial layers) to be formed on tops of respective upper surfaces of the NMOS pillar-shaped silicon layers (NMOS pillar-shaped semiconductor layers) are self-alignedly connected together. The four PMOS pillar-shaped silicon layers (PMOS pillar-shaped semiconductor layers) 805b are also arranged adjacent to each other, so that epitaxial silicon layers (semiconductor epitaxial layers) to be formed on tops of respective upper surfaces of the PMOS pillar-shaped silicon layers (PMOS pillar-shaped semiconductor layers) are self-alignedly connected together in the same manner.

Two upper silicide layers 811c, 811d are formed, respectively, on the integral set of upper N$^+$ diffusion layers 809a and the integral set of upper P$^+$ diffusion layers (second drain/source diffusion regions) 809b. Each of the upper silicide layers is formed on the connected epitaxial silicon layers (semiconductor epitaxial layers) each having a diameter greater than that of the pillar-shaped silicon layer (pillar-shaped semiconductor layer). Thus, the narrow width effect on the upper silicide layer can be reduced. In addition, an interface area between the upper silicide layer and the integral set of upper diffusion layers (809a, 809b) can be set largely, so that an interface resistance between the upper silicide layer and the integral set of upper diffusion layers can be reduced. Further, the upper silicide layer (811c, 811d) may be formed in an upper surface of the integral set of the upper diffusion layers (second drain/source diffusion regions) to have a diameter greater than a total diameter of a plurality of contacts (815, 816) to be formed on an upper side of the adjacent pillar-shaped silicon layers (pillar-shaped semiconductor layers). This makes it possible to prevent a short-circuiting between the contact and the gate electrode even if the contact undergoes overetching during etching for contacts. As shown in FIGS. 24(a) and 24(b), as to a contact for a plurality of pillar-shaped semiconductor layers, an upper side of the pillar-shaped semiconductor layers may be connected to an interconnection layer via a less number of contacts than the number of the pillar-shaped semiconductor layers.

Further, for example, in an NMOS transistor illustrated in FIGS. 24(a) and 24(b), a contact 915 may be formed on an integral set of upper N$^+$ diffusion layers (second drain/source diffusion regions) 909a at a position corresponding to a position between adjacent pillar-shaped silicon layers (pillar-shaped semiconductor layers). In this case, an axis of the contact 915 may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). The number of contacts can be reduced by this arrangement or an arrangement in a PMOS transistor illustrated in FIGS. 24(a) and 24(b). This makes it possible to largely set a space between adjacent ones of a plurality of interconnection lines 920a, 920b, 921a, 921b, 922 so as to facilitate interconnection layout.

Further, in the same manner as that in FIGS. 5(a) and 5(b), a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers. This makes it possible to reduce a resistance of a contact, and stably form a contact.

Fourth Embodiment

FIG. 25(a) is a top plan view showing a transistor using an SOI substrate according to a fourth embodiment of the present invention, and FIG. 25(b) is a sectional view taken along the line A-A' in FIG. 25(a). With reference to FIGS. 25(a) and 25(b), an SOI transistor according to the fourth embodiment will be described below. A silicon layer 1002 on an SOI (silicon on insulator) substrate is isolated on an element-by-element basis, and two pillar-shaped silicon layers (pillar-shaped semiconductor layers) 1005a, 1005b are formed on the silicon layer 1002. A gate dielectric film (first dielectric film) 1007 and a gate electrode (1008a, 1008b) are formed around each of the pillar-shaped silicon layers (pillar-shaped semiconductor layers). In the fourth embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower N$^+$ diffusion layer (first drain/source diffusion region, i.e., one of drain and source diffusion regions) 1003 is formed underneath the pillar-shaped silicon layers (pillar-shaped semiconductor layers), and a lower silicide layer 1011a is formed on a surface of the lower N$^+$ diffusion layer (first drain/source diffusion region) 1003, to reduce a parasitic resistance. An upper N$^+$ diffusion layer (second drain/source diffusion region, i.e., a remaining one of the drain and source diffusion regions) (1009a, 1009b) is formed on top of each of the pillar-shaped silicon layers (pillar-shaped semiconductor layers), in such a manner that an area of an upper surface thereof becomes greater than that of an upper surface of the pillar-shaped silicon layer. In the fourth embodiment, the upper N$^+$ diffusion layer (second drain/source diffusion region) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper N$^+$ diffusion layer (second drain/source diffusion region) may be formed only in a part or an entirety of the semiconductor epitaxial layer. The semiconductor epitaxial layer is electrically isolated from the gate electrode (1008a, 1008b) by a second dielectric film 1012, such as a silicon nitride film or a laminated film comprised of a silicon nitride film and a silicon oxide film, interposed therebetween. An upper silicide layer (1011b, 1011c) is formed on the upper N$^+$ diffusion layer (second drain/source diffusion region) (1009a, 1009b). The upper silicide layer is formed on the epitaxial silicon layer (semiconductor epitaxial layer) having a diameter greater than that of the pillar-shaped silicon layer (pillar-shaped semiconductor layer). Thus, the narrow width effect on the upper silicide layer can be reduced. In addition, an interface area between the upper silicide layer and the upper N$^+$ diffusion layer can be set largely, so that an interface resistance between the upper silicide layer and the upper N$^+$ diffusion layer can be reduced. Further, the upper silicide layer (1011b, 1011c) may be formed in an upper surface of the upper N$^+$ diffusion layer (second drain/source diffusion region) to have a diameter greater than that of a contact (1015, 1016) to be formed on an upper side of the pillar-shaped silicon layer (pillar-shaped semiconductor layer). This makes it possible to prevent a short-circuiting between the contact and the gate electrode even if the contact undergoes overetching during etching for contacts. The contact (1015, 1016) formed on the upper side of the pillar-shaped silicon layer (pillar-shaped semiconductor layer) is connected to one of drain and source terminals through an interconnection layer 1020. A contact 1018 formed on a lower side of the pillar-shaped silicon layer (pillar-shaped semiconductor layer) is connected to a remaining one of the drain and source terminals through an interconnection layer 1022, and a contact 1017 formed on a gate line 1008 extending from the gate electrode is connected to a gate terminal through an interconnection layer 1021.

As shown in FIGS. 26(a) and 26(b), in cases where a distance between two adjacent pillar-shaped silicon layers (pillar-shaped semiconductor layers) 1105a, 1105b is less than a given value, a thickness of a film to be epitaxially grown can be adjusted in such a manner that the epitaxial silicon layers (semiconductor epitaxial layers) on respective ones of the adjacent pillar-shaped semiconductor layers are self-alignedly connected together. In this case, an interface area between an upper silicide layer 1111b on an upper side of the pillar-shaped silicon layers (pillar-shaped semiconductor layers) and an integral set of upper N$^+$ diffusion layers (second drain/source diffusion regions) 1109a, 1109b formed in the connected semiconductor epitaxial layers becomes larger, so that an interface resistance between the an upper silicide layer and the integral set of upper N$^+$ diffusion layers (second drain/source diffusion regions) can be further reduced. In addition, an area of the upper silicide layer 1111a on the upper side of the pillar-shaped silicon layers (pillar-shaped semiconductor layers) becomes larger, so that the narrow width effect on the upper silicide layer can be significantly reduced to facilitate adequate formation of the upper silicide layer.

Further, in the fourth embodiment using an SOI substrate, as to a contact for a plurality of pillar-shaped semiconductor layers, an upper side of the pillar-shaped semiconductor layers may be connected to an interconnection layer via a less number of contacts than the number of the pillar-shaped semiconductor layers, as described in connection with FIGS. 3(a) and 3(b).

Further, a contact may be formed on an integral set of upper $N^+$ diffusion layers (second drain/source diffusion regions) at a position corresponding to a position between adjacent pillar-shaped silicon layers (pillar-shaped semiconductor layers), as described in connection with FIGS. 4(a) and 4(b). In this case, an axis of the contact may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between adjacent ones of a plurality of interconnection lines so as to facilitate interconnection layout.

Further, a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers, as described in connection with FIGS. 5(a) and 5(b). This makes it possible to reduce a resistance of a contact, and stably form a contact.

With reference to FIGS. 27(a) to 41(b), one example of a production method for the transistor illustrated in FIGS. 26(a) and 26(b) will be described below. In FIGS. 27(a) and 27(b) to FIGS. 41(a) and 41(b), the figure suffixed with (a) is a top plan view, and the figure suffixed with (b) is a sectional view taken along the line A-A' in the figure suffixed with (a).

As shown in FIGS. 27(a) and 27(b), two pillar-shaped silicon layers (pillar-shaped semiconductor layers) 1105a, 1105b having a hard mask layer 1104a, such as a silicon nitride film, on top thereof, are formed on a silicon layer 1102 on an SOI substrate by lithography and etching.

As shown in FIGS. 28(a) and 28(b), the silicon layer 1102 on the SOI substrate is isolated on an element-by-element basis.

As shown in FIGS. 29(a) and 29(b), after the element isolation, a lower $N^+$ diffusion layer 1103 is formed underneath the pillar-shaped silicon layers (pillar-shaped semiconductor layers) by ion implantation or the like. In this step, the pillar-shaped silicon layer (pillar-shaped semiconductor layer) (1105a, 1105b) is kept from impurity implantation by the hard mask layer 1104a on top of the pillar-shaped silicon layer (pillar-shaped semiconductor layer).

As shown in FIGS. 30(a) and 30(b), a gate dielectric film (first dielectric film) 1107 and a gate conductive film 1108c are formed. The gate dielectric film (first dielectric film) 1107 is formed of an oxide film, a High-k film or the like. The gate conductive film 1108c is formed of a polysilicon film, a metal film or the like.

As shown in FIGS. 31(a) and 31(b), the gate conductive film 1108c is flattened by chemical mechanical polishing (CMP) or the like.

As shown in FIGS. 32(a) and 32(b), the gate dielectric film (first dielectric film) 1107 and the gate conductive film 1108c are etched back to allow a height dimension of each of the gate dielectric film (first dielectric film) 1107 and the gate conductive film 1108c along a sidewall of the pillar-shaped silicon layer (pillar-shaped semiconductor layer) (1105a, 1105b) to be set to a desired gate length.

As shown in FIGS. 33(a) and 33(b), a nitride film or the like is formed and then etched back to form a sidewall spacer 1104b.

As shown in FIGS. 34(a) and 34(b), a gate line pattern is formed using a resist 1110 by lithography or the like.

As shown in FIGS. 35(a) and 35(b), the gate conductive film 1108c and the gate dielectric film (first dielectric film) 1107 are selectively etched by anisotropic etching or the like, using the resist 1110 as a mask, to integrally form a gate electrode (1108a, 1108b) around the pillar-shaped silicon layer (pillar-shaped semiconductor layer) (1105a, 1105b) and a gate line 1108 extending from the gate electrode (1108a, 1108b). Subsequently, the resist 1110 is removed.

As shown in FIGS. 36(a) and 36(b), the hard mask layer 1104a and the sidewall spacer 1104b are removed by wet etching or the like.

As shown in FIGS. 37(a) and 37(b), a dielectric film, such as a nitride film or a laminated film comprised of a nitride film and an oxide film, is formed, and then etched back to form a second dielectric film 1112.

As shown in FIGS. 38(a) and 38(b), silicon or the like is selectively epitaxially grown on top of an upper surface of each of the pillar-shaped silicon layer (pillar-shaped semiconductor layer) and on the lower $N^+$ diffusion layer 1103 to form an upper epitaxial silicon layer (semiconductor epitaxial layer) 1110b and a lower epitaxial silicon layer, in such a manner that epitaxial layers formed on tops of respective upper surfaces of the pillar-shaped silicon layers (pillar-shaped semiconductor layers) arranged adjacent to each other with a given distance or less therebetween are self-alignedly connected together. The upper epitaxial silicon layer (semiconductor epitaxial layer) may be formed to have a diameter greater than that of a contact to be formed on an upper side of the pillar-shaped silicon layer (pillar-shaped semiconductor layer) in a subsequent step. This makes it possible to provide a structure free of a short-circuiting between the contact and the gate electrode.

As shown in FIGS. 39(a) and 39(b), an upper $N^+$ diffusion layer (second drain/source diffusion region) (1109a, 1109b) is formed in the upper epitaxial silicon layer (semiconductor epitaxial layer) 1110b and an upper portion of the pillar-shaped silicon layer (pillar-shaped semiconductor layer) (1105a, 1105b) by ion implantation or the like.

As shown in FIGS. 40(a) and 40(b), a metal, such as Co or Ni, is sputtered, and then a heat treatment is performed to selectively silicide respective upper surfaces of the lower epitaxial silicon layer on the lower $N^+$ diffusion layer (first drain/source diffusion region) 1103 and the integral set of upper $N^+$ diffusion layers (second drain/source diffusion regions) 1109a, 1109b to form a lower silicide layer 1111a and an upper silicide layer 1111b. The upper silicide layer 1111b is formed to have a size greater than that of the pillar-shaped silicon layer (pillar-shaped semiconductor layer), so that the narrow width effect on the upper silicide layer can be suppressed. Further, the entire surface of the epitaxial silicon layer (semiconductor epitaxial layer) may be silicided. In this case, an interface area between the upper silicide layer 1111b and the integral set of upper $N^+$ diffusion layers (second drain/source diffusion regions) 1109a, 1109b is increased, so that an interface resistance therebetween can be reduced to reduce a source/drain parasitic resistance.

As shown in FIGS. 41(a) and 41(b), a silicon oxide film is formed to serve as an interlayer film, and then a contact (1115 to 1118) is formed. The epitaxial silicon layer (semiconductor epitaxial layer) is formed to allow the contact (1115, 1116) on an upper side of the pillar-shaped silicon layer (pillar-shaped semiconductor layer) to be entirely formed on the upper silicide layer 1111b, as shown in FIGS. 41(a) and 41(b). This makes it possible to provide a structure free of a short-circuiting between the contact and the gate electrode.

The fourth embodiment shows one example where an epitaxial silicon layer (semiconductor epitaxial layer) is formed. Specifically, an epitaxial silicon carbide (SiC) layer may be formed for an NMOS transistor, and an epitaxial silicon germanium (SiGe) layer may be formed for a PMOS transistor. In this case, a stress can be applied to a channel region to enhance carrier mobility.

Fifth Embodiment

A fifth embodiment shows one example where the present invention is applied to a set of transistors formed by connecting in series two transistors. FIG. 42(a) is a top plan view showing a transistor according to the fifth embodiment, and FIG. 42(b) is a sectional view taken along the line A-A' in FIG. 42(a). With reference to FIGS. 42(a) and 42(b), a structure of the transistor according to the fifth embodiment will be described below. A silicon layer 1202 on an SOI substrate is isolated on an element-by-element basis. Two pillar-shaped silicon layers (pillar-shaped semiconductor layers) 1205a, 1205b constituting a first transistor, and two pillar-shaped silicon layers (pillar-shaped semiconductor layers) 1205c, 1205d constituting a second transistor, are formed on the silicon layer 1202. A gate dielectric film (first dielectric film) 1207 and a gate electrode 1208a to 1208d are formed around each of the pillar-shaped silicon layers (pillar-shaped semiconductor layers). In the fifth embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower N$^+$ diffusion layer (first drain/source diffusion region, i.e., one of drain and source diffusion regions) 1203 is formed underneath the pillar-shaped silicon layers (pillar-shaped semiconductor layers), and a lower silicide layer 1211a is formed on a surface of the lower N$^+$ diffusion layer (first drain/source diffusion region) 1203, to reduce a parasitic resistance. An upper N$^+$ diffusion layer (second drain/source diffusion region, i.e., a remaining one of the drain and source diffusion regions) (1209a to 1209d) is formed on top of each of the pillar-shaped silicon layers (pillar-shaped semiconductor layers), in such a manner that an area of an upper surface thereof becomes greater than that of an upper surface of the pillar-shaped silicon layer. In the fifth embodiment, the upper N$^+$ diffusion layer (second drain/source diffusion region) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper N$^+$ diffusion layer (second drain/source diffusion region) may be formed only in a part or an entirety of the semiconductor epitaxial layer. The semiconductor epitaxial layer is electrically isolated from the gate electrode 1208a to 1208d by a second dielectric film 1212, such as a silicon nitride film or a laminated film comprised of a silicon nitride film and a silicon oxide film, interposed therebetween. The two pillar-shaped silicon layers (pillar-shaped semiconductor layers) 1205a, 1205b constituting the first transistor are arranged adjacent to each other, so that epitaxial silicon layers (semiconductor epitaxial layers) to be formed on tops of respective upper surfaces of the adjacent pillar-shaped silicon layers (pillar-shaped semiconductor layers) are self-alignedly connected together. The two pillar-shaped silicon layers (pillar-shaped semiconductor layers) 1205c, 1205d constituting the second transistor are also arranged adjacent to each other, so that epitaxial silicon layers (semiconductor epitaxial layers) to be formed on tops of respective upper surfaces of the adjacent pillar-shaped silicon layers (pillar-shaped semiconductor layers) are self-alignedly connected together in the same manner. In contrast, the two pillar-shaped silicon layers (pillar-shaped semiconductor layers) 1205b, 1205c each constituting a different transistor are arranged with a distance greater than a given value therebetween, so that epitaxial silicon layers (semiconductor epitaxial layers) to be formed thereon are separated from each other.

Two upper silicide layers 1211b, 1211c are formed, respectively, on the integral set of upper N$^+$ diffusion layers (second drain/source diffusion regions) 1209a, 1209b and the integral set of upper N$^+$ diffusion layers (second drain/source diffusion regions) 1209c, 1209d. Each of the upper silicide layers is formed on the connected epitaxial silicon layers (semiconductor epitaxial layers) each having a diameter greater than that of the pillar-shaped silicon layer (pillar-shaped semiconductor layer). Thus, the narrow width effect on the upper silicide layer can be reduced. In addition, an interface area between the upper silicide layer and the integral set of upper N$^+$ diffusion layers (1209a to 1209d) can be set largely, so that an interface resistance between the upper silicide layer and the integral set of upper N$^+$ diffusion layers can be reduced. Further, the upper silicide layer (1211b, 1211c) may be formed in an upper surface of the integral set of the upper N$^+$ diffusion layers (second drain/source diffusion regions) to have a diameter greater than a total diameter of two contacts (1215a, 1215b; 1216a, 1216b) to be formed on an upper side of the adjacent pillar-shaped silicon layers (pillar-shaped semiconductor layers). This makes it possible to prevent a short-circuiting between the contact and the gate electrode even if the contact undergoes overetching during etching for contacts. The two contacts 1215a, 1215b formed on the upper side of the pillar-shaped silicon layers (pillar-shaped semiconductor layers) constituting the first transistor are connected to one of drain and source terminals through an interconnection layer 1220a, and the two contacts 1216a, 1216b formed on the upper side of the pillar-shaped silicon layers (pillar-shaped semiconductor layers) constituting the second transistor are connected to a remaining one of the drain and source terminals through an interconnection layer 1220b. Further, the first transistor and the second transistor are connected in series through the lower N$^+$ diffusion layer (first drain/source diffusion region) 1203. A contact 1217 formed on a gate line 1208 extending from the gate electrode is connected to a gate terminal through an interconnection layer 1221.

In the fifth embodiment using an SOI substrate, as to a contact for a plurality of pillar-shaped semiconductor layers, an upper side of the pillar-shaped semiconductor layers may be connected to an interconnection layer via a less number of contacts than the number of the pillar-shaped semiconductor layers, as described in connection with FIGS. 22(a) and 22(b).

Further, in the same manner as that in FIGS. 22(a) and 22(b), a contact may be formed on an integral set of upper N$^+$ diffusion layers (second drain/source diffusion regions) at a position corresponding to a position between adjacent pillar-shaped silicon layers (pillar-shaped semiconductor layers). In this case, an axis of the contact may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between adjacent ones of a plurality of interconnection lines so as to facilitate interconnection layout.

Further, in the same manner as that in FIGS. 5(a) and 5(b), a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers. This makes it possible to reduce a resistance of a contact, and stably form a contact.

Sixth Embodiment

A sixth embodiment shows one example where the present invention is applied to a CMOS inverter using an SOI substrate. FIG. 43(a) is a top plan view showing a CMOS inverter according to the sixth embodiment, and FIG. 43(b) is a sectional view taken along the line A-A' in FIG. 43(a). In FIGS. 43(a) and 43(b), an interconnection layer 1320a connected to an NMOS transistor is connected to GND, and an interconnection layer 1320b connected to a PMOS transistor is connected to Vcc. An input signal Vin is input into a gate interconnection layer 1308 from an interconnection layer 1322, and two interconnection lines 1321a, 1321 b connected from respective upper sides of the NMOS and PMOS transistors are connected to each other through an interconnection layer to output an output signal Vout therefrom. In this manner, a CMOS inverter is formed.

With reference to FIGS. 43(a) and 43(b), a structure of the CMOS inverter according to the sixth embodiment will be described below. Each of two silicon layers 1302a, 1302b on an SOI substrate is electrically isolated on an element-by-element basis. Two pillar-shaped silicon layers (pillar-shaped semiconductor layers) 1305a constituting an NMOS transistor (NMOS pillar-shaped silicon layers (NMOS pillar-shaped semiconductor layers) 1305a), and four pillar-shaped silicon layers (pillar-shaped semiconductor layers) 1305b constituting a PMOS transistor (PMOS pillar-shaped silicon layers (PMOS pillar-shaped semiconductor layers) 1305b), are formed on the silicon layer 1302a and silicon layer 1302b, respectively. A gate dielectric film (first dielectric film) 1307 and a gate electrode (1308a, 1308b) are formed around each of the pillar-shaped silicon layers (pillar-shaped semiconductor layers). In the sixth embodiment, a High-k film is used as the gate dielectric film (first dielectric film), and a metal film is used as the gate electrode. Alternatively, a silicon oxynitride film formed by oxidation may be used as the gate dielectric film (first dielectric film), and a polysilicon film may be used as the gate electrode. A lower $N^+$ diffusion layer (first drain/source diffusion region, i.e., one of drain and source diffusion regions) 1303a is formed underneath the NMOS pillar-shaped silicon layers (NMOS pillar-shaped semiconductor layers) 1305a, and a lower $P^+$ diffusion layer (first drain/source diffusion region) 1303b is formed underneath the PMOS pillar-shaped silicon layers (PMOS pillar-shaped semiconductor layers) 1305b. A lower silicide layer (1311a, 1311b) is formed on a surface of each of the lower $N^+$ and $P^+$ diffusion layers (first drain/source diffusion regions) to reduce a parasitic resistance. An upper $N^+$ diffusion layer (second drain/source diffusion region, i.e., a remaining one of the drain and source diffusion regions) 1309a is formed on top of each of the NMOS pillar-shaped silicon layers (NMOS pillar-shaped semiconductor layers) 1305a in such a manner that an area of an upper surface thereof becomes greater than that of an upper surface of the NMOS pillar-shaped silicon layer. An upper $P^+$ diffusion layer (second drain/source diffusion region) 1309b is formed on top of each the PMOS pillar-shaped silicon layers (PMOS pillar-shaped semiconductor layers) 1305b in such a manner that an area of an upper surface thereof becomes greater than that of an upper surface of the PMOS pillar-shaped silicon layer. In the sixth embodiment, the upper diffusion layer having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper diffusion layer may be formed only in a part or an entirety of the semiconductor epitaxial layer. The semiconductor epitaxial layer is electrically isolated from the gate electrode (1308a, 1308b) by a second dielectric film 1312, such as a silicon nitride film or a laminated film comprised of a silicon nitride film and a silicon oxide film, interposed therebetween. The two NMOS pillar-shaped silicon layers (NMOS pillar-shaped semiconductor layers) 1305a are arranged adjacent to each other, so that epitaxial silicon layers (semiconductor epitaxial layers) to be formed on tops of respective upper surfaces of the NMOS pillar-shaped silicon layers (NMOS pillar-shaped semiconductor layers) are self-alignedly connected together. The four PMOS pillar-shaped silicon layers (PMOS pillar-shaped semiconductor layers) 1305b are also arranged adjacent to each other, so that epitaxial silicon layers (semiconductor epitaxial layers) to be formed on tops of respective upper surfaces of the PMOS pillar-shaped silicon layers (PMOS pillar-shaped semiconductor layers) are self-alignedly connected together in the same manner.

Two upper silicide layers 1311c, 1311d are formed, respectively, on the integral set of upper $N^+$ diffusion layers 1309a and the integral set of upper $P^+$ diffusion layers (second drain/source diffusion regions) 1309b. Each of the upper silicide layers is formed on the connected epitaxial silicon layers (semiconductor epitaxial layers) each having a diameter greater than that of the pillar-shaped silicon layer (pillar-shaped semiconductor layer). Thus, the narrow width effect on the upper silicide layer can be reduced. In addition, an interface area between the upper silicide layer and the integral set of upper diffusion layers (1309a, 1309b) can be set largely, so that an interface resistance between the upper silicide layer and the integral set of upper diffusion layers can be reduced. Further, the upper silicide layer (1311c, 1311d) may be formed in an upper surface of the integral set of the upper diffusion layers (second drain/source diffusion regions) to have a diameter greater than a total diameter of a plurality of contacts (1315, 1316) to be formed on an upper side of the adjacent pillar-shaped silicon layers (pillar-shaped semiconductor layers). This makes it possible to prevent a short-circuiting between the contact and the gate electrode even if the contact undergoes overetching during etching for contacts.

In the sixth embodiment using an SOI substrate, as to a contact for a plurality of pillar-shaped semiconductor layers, an upper side of the pillar-shaped semiconductor layers may be connected to an interconnection layer via a less number of contacts than the number of the pillar-shaped semiconductor layers, as described in connection with FIGS. 24(a) and 24(b).

Further, a contact may be formed on an integral set of upper $N^+$ diffusion layers (second drain/source diffusion regions) at a position corresponding to a position between adjacent pillar-shaped silicon layers (pillar-shaped semiconductor layers), as described in connection with FIGS. 24(a) and 24(b). In this case, an axis of the contact may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). The number of contacts can be reduced by this arrangement or an arrangement in a PMOS transistor illustrated in FIGS. 24(a) and 24(b). This makes it possible to largely set a space between adjacent ones of a plurality of interconnection lines 1320a, 1320b, 1321a, 1321b, 1322so as to facilitate interconnection layout.

Further, in the same manner as that in FIGS. 5(a) and 5(b), a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers. This makes it possible to reduce a resistance of a contact, and stably form a contact.

Seventh Embodiment

FIG. 44(a) is a top plan view showing a transistor using a polysilicon layer as a gate electrode, according to a seventh embodiment of the present invention, and FIG. 44(b) is a sectional view taken along the line A-A' in FIG. 44(a). With reference to FIGS. 44(a) and 44(b), a structure of the transistor according to the seventh embodiment will be described below. A silicon substrate 1401 is isolated on an element-by-element basis by an element isolation 1402, and two pillar-shaped silicon layers (pillar-shaped semiconductor layers) 1405a, 1405b are formed on the silicon substrate. A gate dielectric film (first dielectric film) 1407 and a gate electrode (1408a, 1408b) are formed around each of the pillar-shaped silicon layers (pillar-shaped semiconductor layers). In the seventh embodiment, a High-k film is used as the gate dielectric film (first dielectric film), and a polysilicon film is used as the gate electrode. Alternatively, a silicon oxynitride film formed by oxidation may be used as the gate dielectric film (first dielectric film). In view of the gate electrode formed of a polysilicon film, a silicide layer 1411c is formed on a surface of the gate electrode, in addition to silicide layers on respective surfaces of after-mentioned diffusion layers. A lower N+ diffusion layer (first drain/source diffusion region, i.e., one of drain and source diffusion regions) 1403 is formed underneath the pillar-shaped silicon layers (pillar-shaped semiconductor layers), and a lower silicide layer 1411a is formed on a surface of the lower N$^+$ diffusion layer (first drain/source diffusion region) 1403, to reduce a parasitic resistance. An upper N$^+$ diffusion layer (second drain/source diffusion region, i.e., a remaining one of the drain and source diffusion regions) (1409a, 1409b) is formed on top of each of the pillar-shaped silicon layers (pillar-shaped semiconductor layers), in such a manner that an area of an upper surface thereof becomes greater than that of an upper surface of the pillar-shaped silicon layer. In the seventh embodiment, the upper N$^+$ diffusion layer (second drain/source diffusion region) (1409a, 1409b) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper N$^+$ diffusion layer (second drain/source diffusion region) may be formed only in a part or an entirety of the semiconductor epitaxial layer. The semiconductor epitaxial layer is electrically isolated from the gate electrode (1408a, 1408b) by a second dielectric film 1412, such as a silicon nitride film or a laminated film comprised of a silicon nitride film and a silicon oxide film, interposed therebetween. A distance between the adjacent pillar-shaped silicon layers (pillar-shaped semiconductor layers) 1405a, 1405b is less than a given value. Thus, a thickness of a film to be epitaxially grown is adjusted in such a manner that the upper N$^+$ diffusion layers (second drain/source diffusion regions) on respective ones of the adjacent pillar-shaped semiconductor layers are self-alignedly connected together. An upper silicide layer 1411b is formed on the upper N$^+$ diffusion layer (second drain/source diffusion region) (1409a, 1409b). The upper silicide layer is formed on the epitaxial silicon layer (semiconductor epitaxial layer) having a diameter greater than that of the pillar-shaped silicon layer (pillar-shaped semiconductor layer). Thus, the narrow width effect on the upper silicide layer can be reduced. In addition, an interface area between the upper silicide layer and the upper N+ diffusion layer can be set largely, so that an interface resistance between the upper silicide layer and the upper N$^+$ diffusion layer can be reduced. Further, the upper silicide layer (1411b) may be formed in an upper surface of the upper N+ diffusion layer (second drain/source diffusion region) to have a diameter greater than that of a contact (1415, 1416) to be formed on an upper side of the pillar-shaped silicon layer (pillar-shaped semiconductor layer). This makes it possible to prevent a short-circuiting between the contact and the gate electrode even if the contact undergoes overetching during etching for contacts. The contact (1415, 1416) formed on the upper side of the pillar-shaped silicon layer (pillar-shaped semiconductor layer) is connected to one of drain and source terminals through an interconnection layer 1420. A contact 1418 formed on a lower side of the pillar-shaped silicon layer (pillar-shaped semiconductor layer) is connected to a remaining one of the drain and source terminals through an interconnection layer 1422, and a contact 1417 formed on a gate line 1408 extending from the gate electrode is connected to a gate terminal through an interconnection layer 1421. A production method for the transistor according to the seventh embodiment is the same as that for the transistor according to the first embodiment. Further, in cases where the transistor according to the seventh embodiment uses an SOI substrate, the same production method as that for the transistor according to the fourth embodiment may be used.

In the seventh embodiment using a polysilicon film as a gate electrode, as to a contact for a plurality of pillar-shaped semiconductor layers, an upper side of the pillar-shaped semiconductor layers may be connected to an interconnection layer via a less number of contacts than the number of the pillar-shaped semiconductor layers, as described in connection with FIGS. 3(a) and 3(b).

Further, a contact may be formed on an integral set of upper N$^+$ diffusion layers (second drain/source diffusion regions) at a position corresponding to a position between adjacent pillar-shaped silicon layers (pillar-shaped semiconductor layers), as described in connection with FIGS. 4(a) and 4(b). In this case, an axis of the contact may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between adjacent ones of a plurality of interconnection lines so as to facilitate interconnection layout.

Further, a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers, as described in connection with FIGS. 5(a) and 5(b). This makes it possible to reduce a resistance of a contact, and stably form a contact.

Eighth Embodiment

FIG. 45(a) is a top plan view showing a transistor having a gate electrode formed of a fully-silicided polysilicon layer, according to an eighth embodiment of the present invention, and FIG. 45(b) is a sectional view taken along the line A-A' in FIG. 45(a). With reference to FIGS. 45(a) and 45(b), a structure of the transistor according to the eighth embodiment will be described below. A silicon substrate 1501 is isolated on an element-by-element basis by an element isolation 1502, and two pillar-shaped silicon layers (pillar-shaped semiconductor layers) 1505a, 1505b are formed on the silicon substrate. A gate dielectric film (first dielectric film) 1507 and a gate electrode (1508a, 1508b) are formed around each of the pillar-shaped silicon layers (pillar-shaped semiconductor layers). In the eighth embodiment, a High-k film is used as the gate dielectric film (first dielectric film), and a fully-silicided polysilicon film is used as the gate electrode. Alternatively, a silicon oxynitride film formed by oxidation may be used as the gate dielectric film (first dielectric film). The polysilicon gate electrode is fully silicided by optimizing a thickness of a sputtered film made of a silicide material or by adjusting siliciding conditions. A lower N+ diffusion layer (first drain/source diffusion region, i.e., one of drain and source diffusion regions) 1503 is formed underneath the pillar-shaped silicon layers (pillar-shaped semiconductor layers), and a lower silicide layer 1511a is formed on a surface of the lower N+ diffusion layer (first drain/source diffusion region) 1503, to reduce a parasitic resistance. An upper N+ diffusion layer (second drain/source diffusion region, i.e., a remaining one of the drain and source diffusion regions) (1509a, 1509b) is formed on top of each of the pillar-shaped silicon layers (pillar-shaped semiconductor layers), in such a manner that an area of an upper surface thereof becomes greater than that of an upper surface of the pillar-shaped silicon layer. In the eighth embodiment, the upper N+ diffusion layer (second drain/source diffusion region) (1509a, 1509b) having an upper surface with an area greater than that of the upper surface of the pillar-shaped silicon layer is comprised of an upper portion formed in an epitaxially-grown semiconductor epitaxial layer, and a lower portion formed in an upper portion of the pillar-shaped silicon layer. Alternatively, the upper N+ diffusion layer (second drain/source diffusion region) may be formed only in a part or an entirety of the semiconductor epitaxial layer. The semiconductor epitaxial layer is electrically isolated from the gate electrode (1508a, 1508b) by a second dielectric film 1512, such as a silicon nitride film or a laminated film comprised of a silicon nitride film and a silicon oxide film, interposed therebetween. A distance between the adjacent pillar-shaped silicon layers (pillar-shaped semiconductor layers) 1505a, 1505b is less than a given value. Thus, a thickness of a film to be epitaxially grown is adjusted in such a manner that the upper N+ diffusion layers (second drain/source diffusion regions) on respective ones of the adjacent pillar-shaped semiconductor layers are self-alignedly connected together. An upper silicide layer 1511b is formed on the upper N+ diffusion layer (second drain/source diffusion region) (1509a, 1509b). The upper silicide layer is formed on the epitaxial silicon layer (semiconductor epitaxial layer) having a diameter greater than that of the pillar-shaped silicon layer (pillar-shaped semiconductor layer). Thus, the narrow width effect on the upper silicide layer can be reduced. In addition, an interface area between the upper silicide layer and the upper N+ diffusion layer can be set largely, so that an interface resistance between the upper silicide layer and the upper N+ diffusion layer can be reduced. Further, the upper silicide layer (1511b) may be formed in an upper surface of the upper N+ diffusion layer (second drain/source diffusion region) to have a diameter greater than that of a contact (1515, 1516) to be formed on an upper side of the pillar-shaped silicon layer (pillar-shaped semiconductor layer). This makes it possible to prevent a short-circuiting between the contact and the gate electrode even if the contact undergoes overetching during etching for contacts. The contact (1515, 1516) formed on the upper side of the pillar-shaped silicon layer (pillar-shaped semiconductor layer) is connected to one of drain and source terminals through an interconnection layer 1520. A contact 1518 formed on a lower side of the pillar-shaped silicon layer (pillar-shaped semiconductor layer) is connected to a remaining one of the drain and source terminals through an interconnection layer 1522, and a contact 1517 formed on a gate line 1508 extending from the gate electrode is connected to a gate terminal through an interconnection layer 1521. A production method for the transistor according to the eighth embodiment is the same as that for the transistor according to the first embodiment. Further, in cases where the transistor according to the seventh embodiment uses an SOI substrate, the same production method as that for the transistor according to the fourth embodiment may be used.

In the eighth embodiment using a fully-silicided polysilicon film as a gate electrode, as to a contact for a plurality of pillar-shaped semiconductor layers, an upper side of the pillar-shaped semiconductor layers may be connected to an interconnection layer via a less number of contacts than the number of the pillar-shaped semiconductor layers, as described in connection with FIGS. 3(a) and 3(b).

Further, a contact may be formed on an integral set of upper N+ diffusion layers (second drain/source diffusion regions) at a position corresponding to a position between adjacent pillar-shaped silicon layers (pillar-shaped semiconductor layers), as described in connection with FIGS. 4(a) and 4(b). In this case, an axis of the contact may be located to intersect with a line segment connecting respective axes of the adjacent pillar-shaped silicon layers (pillar-shaped semiconductor layers) or may be located in a region between the axes of the adjacent pillar-shaped silicon layers (pillar-shaped semiconductor layers). This arrangement makes it possible to largely set a space between adjacent ones of a plurality of interconnection lines so as to facilitate interconnection layout.

Further, a contact having an area greater than that of other contact in cross-section parallel to a principal surface of a substrate may be formed on an upper side of a plurality of pillar-shaped silicon layers (pillar-shaped semiconductor layers), in a number less than the number of the pillar-shaped semiconductor layers, as described in connection with FIGS. 5(a) and 5(b). This makes it possible to reduce a resistance of a contact, and stably form a contact.

What is claimed is:

1. A method of producing a semiconductor device including a MOS transistor, comprising the steps of:
   providing a substrate on which a plurality of semiconductor pillars are erected;
   forming a bottom doped region in contact with a lower part of the respective semiconductor pillar;
   forming a first dielectric film to at least partially cover a sidewall of the respective semiconductor pillars;
   forming a conductive film on the first dielectric film;

etching at least the conductive films down to a height substantially equal to a gate length;

partially removing by etching the first dielectric films and the conductive films to form a gate electrode formed around the respective semiconductor pillars and form a gate line extending from a respective gate electrode;

forming, on a top surface of at least one of the semiconductor pillars, a semiconductor layer having a top surface larger in area than the top surface of the at least one of the semiconductor pillars; and forming a top doped region at least part of which is formed in the semiconductor layer of the at least one of the semiconductor pillars, wherein the top doped region is of the same conductivity type as that of the bottom doped region.

2. The method as defined in claim 1, wherein the semiconductor layer is an epitaxial layer.

3. The method as defined in claim 2, wherein forming a semiconductor layer comprises forming a common top doped region epitaxially grown in a self-alignment manner over top surfaces of two or more semiconductor pillars each constituting a MOS transistor, the two or more semiconductor pillars being located at intervals each equal to a given distance or less.

* * * * *